(12) United States Patent
Park et al.

(10) Patent No.: US 9,349,583 B2
(45) Date of Patent: May 24, 2016

(54) METHOD OF FABRICATING SEMICONDUCTOR DEVICE

(71) Applicants: Min-Young Park, Seoul (KR); Youn-Soo Kim, Yongin-si (KN); Sang-Yeol Kang, Suwon-si (KR); Cha-Young Yoo, Suwon-si (KR); Jae-Soon Lim, Seoul (KR); Jae-Hyoung Choi, Hwaseong-si (KR)

(72) Inventors: Min-Young Park, Seoul (KR); Youn-Soo Kim, Yongin-si (KN); Sang-Yeol Kang, Suwon-si (KR); Cha-Young Yoo, Suwon-si (KR); Jae-Soon Lim, Seoul (KR); Jae-Hyoung Choi, Hwaseong-si (KR)

(73) Assignee: Samsung Electronis Co., Ltd. (KR)

( * ) Notice: Subject to any disclaimer, the term of this patent is extended or adjusted under 35 U.S.C. 154(b) by 374 days.

(21) Appl. No.: 13/775,595

(22) Filed: Feb. 25, 2013

(65) Prior Publication Data
US 2013/0244445 A1 Sep. 19, 2013

Related U.S. Application Data

(60) Provisional application No. 61/610,577, filed on Mar. 14, 2012.

(30) Foreign Application Priority Data

Jul. 23, 2012 (KR) .......................... 10-2012-0080195

(51) Int. Cl.
| | |
|---|---|
| *H01L 21/02* | (2006.01) |
| *C23C 16/04* | (2006.01) |
| *C23C 16/40* | (2006.01) |
| *C23C 16/455* | (2006.01) |

(Continued)

(52) U.S. Cl.
CPC ........ *H01L 21/02104* (2013.01); *C23C 16/045* (2013.01); *C23C 16/405* (2013.01); *C23C 16/45527* (2013.01); *H01L 21/28282* (2013.01); *H01L 28/40* (2013.01)

(58) Field of Classification Search
CPC ................................................ H01L 21/02104
USPC .......................................................... 438/761
See application file for complete search history.

(56) References Cited

U.S. PATENT DOCUMENTS

| | | |
|---|---|---|
| 7,250,379 B2 | 7/2007 | Lee et al. |
| 7,605,094 B2 | 10/2009 | Lee et al. |
| 2001/0046558 A1 | 11/2001 | Kim et al. |

(Continued)

FOREIGN PATENT DOCUMENTS

KR  1020100111375  10/2010

OTHER PUBLICATIONS

Yanguas-Gil et al., "ALD Growth per Cycle Modulation Using Surface Functionalization: A Strategy for Improved Stoichiometry Control and Higher Doping Efficiencies", AVS, 2011, Cambridge.

*Primary Examiner* — Stanetta Isaac
(74) *Attorney, Agent, or Firm* — Myers Bigel Sibley & Sajovec, P.A.

(57) ABSTRACT

Methods of fabricating a semiconductor device include forming a deposited film on a semiconductor substrate in a process chamber by repeatedly forming unit layers on the semiconductor substrate. The unit layer is formed by forming a preliminary unit layer on the semiconductor substrate by supplying a process material including a precursor material and film-control material into the process chamber, purging the process chamber, forming a unit layer from the preliminary unit layer, and again purging the process chamber. The precursor material includes a central atom and a ligand bonded to the central atom, and the film-control material includes a hydride of the ligand.

28 Claims, 42 Drawing Sheets

(51) Int. Cl.
*H01L 21/28* (2006.01)
*H01L 49/02* (2006.01)

(56) References Cited

U.S. PATENT DOCUMENTS

2007/0123060 A1     5/2007  Rahtu
2008/0102205 A1*    5/2008  Barry et al. .................... 427/250
2008/0254218 A1    10/2008  Lei et al.
2009/0130414 A1     5/2009  Kim et al.
2009/0214767 A1     8/2009  Wang et al.
2009/0275198 A1*   11/2009  Kamepalli et al. ............ 438/659
2010/0018439 A1     1/2010  Cameron et al.

* cited by examiner

METHOD OF FABRICATING SEMICONDUCTOR DEVICE

CROSS-REFERENCE TO RELATED APPLICATION

This application claims the benefit of provisional U.S. application No. 61/610,577, filed on Mar. 14, 2012, and also claims priority under 35 U.S.C. §119 to Korean Patent Application No. 10-2012-0080195 filed on Jul. 23, 2012, the entire contents of each of which are incorporated herein by reference in their entirety.

BACKGROUND

1. Field

Embodiments of the inventive concept relate to a method of forming a deposited film, a method of fabricating a semiconductor device using thereof, and a semiconductor device fabricated using thereof, more particularly to an electronic apparatus and system using thereof.

2. Description of Related Art

As semiconductor devices become highly integrated, and sizes of elements that configure a semiconductor device become reduced, it is difficult to form a thin film with a uniform thickness on a semiconductor substrate having high aspect ratio holes.

SUMMARY

Embodiments of the inventive concept provide methods of forming a deposited film having an improved step coverage characteristics and methods of fabricating a semiconductor device using thereof.

Other embodiments of the inventive concept provide a method of forming a deposited film having an improved uniformity characteristics and methods of fabricating a semiconductor device using thereof.

Still other embodiments of the inventive concept provide an electronic apparatus and system including a semiconductor device fabricated in accordance with the methods of fabricating the semiconductor devices.

The technical objectives of the inventive concept are not limited to the above disclosure; other objectives may become apparent to those of ordinary skill in the art based on the following descriptions.

In accordance with an aspect of the inventive concept, a method of fabricating a semiconductor device includes loading a semiconductor substrate in a process chamber, forming a deposited film on the semiconductor substrate in the process chamber, and unloading the semiconductor substrate in which the deposited film is formed from the process chamber. The formation of the deposited film includes repeatedly forming a unit layer on the semiconductor substrate. The formation of the unit layer includes forming a preliminary unit layer on the semiconductor substrate by supplying a process material including a precursor material and film-control material into the process chamber, firstly purging the process chamber in which the semiconductor substrate having the preliminary unit layer is located, forming the unit layer from the preliminary unit layer in the firstly purged process chamber, and secondly purging the process chamber in which the semiconductor substrate having the unit layer is located. The precursor material includes a central atom and a ligand bonded to the central atom, and the film-control material is a hydride of the ligand of the precursor material.

In some embodiments, the precursor material may be adsorbed onto the semiconductor substrate to form a precursor-adsorbed layer.

In other embodiments, the film-control material may be coordinated to a central atom of the precursor-adsorbed layer to form a more chemically stable material from the precursor-adsorbed layer than the precursor-adsorbed layer.

In still other embodiments, the formation of the preliminary unit layer may include forming a precursor-adsorbed layer in the semiconductor substrate by supplying the precursor material into the process chamber, wherein the precursor-adsorbed layer includes a base part and an over-adsorbed part bonded to the base part, and separating the over-adsorbed part from the base part by supplying the film-control material into the process chamber.

In still other embodiments, the film-control material may break a bond between the over-adsorbed part and the base part while being bonded to a central atom of the over-adsorbed part.

In still other embodiments, the preliminary unit layer may include both of the precursor material and the film-control material.

In still other embodiments, the ligand of the precursor material and the film-control material that configure the preliminary unit layer may be separated from the preliminary unit layer to form a residual product while forming the unit layer from the preliminary unit layer, and the residual product may be removed while secondly purging the process chamber.

In still other embodiments, the ligand may include a first ligand and a second ligand that are bonded to the central atom and have a different chemical formula from each other, and the film-control material may be a hydride of the first ligand.

In accordance with another aspect of the inventive concept, a method of fabricating a semiconductor device includes loading a semiconductor substrate in a process chamber, forming a deposited film on the semiconductor substrate in the process chamber, and unloading the semiconductor substrate having the deposited film from the process chamber. The formation of the deposited film includes repeatedly forming unit layers on the semiconductor substrate. The formation of the unit layer includes forming a surface-control layer on the semiconductor substrate by supplying a first film-control material into the process chamber, forming a precursor-adsorbing layer adsorbed onto the surface-control layer by supplying the precursor material into the process chamber to form a preliminary unit layer including the surface-control layer and precursor-adsorbing layer, firstly purging the process chamber in which the semiconductor substrate having the preliminary unit layer is located, forming a residual product by separating the surface-control layer and the ligand of the precursor-adsorbing layer while forming a unit layer from the preliminary unit layer, and secondly purging the process chamber in which the semiconductor substrate having the unit layer is located and removing the residual product at the same time. The precursor material is a compound that includes a central atom and a ligand bonded to the central atom.

In some embodiments, the coordination number of a central atom of the preliminary unit layer may be greater than that of the central atom of the precursor material.

In other embodiments, the supply of the precursor material may start while the first film-control material is in the process chamber.

In still other embodiments, the precursor material may be supplied into the process chamber after the supply of the first film-control material into the process chamber stops.

In still other embodiments, the supply of the precursor material may start while the first film-control material is supplied into the process chamber.

In still other embodiments, the supply of the precursor material may start while the first film-control material is supplied into the process chamber, and may stop before the supply of the first film-control material stops.

In still other embodiments, the method may further include supplying a second film-control material into the process chamber before firstly purging the process chamber after the supply of the first precursor material into the process chamber stops.

In still other embodiments, the second film-control material may be a material coordinated to the central atom of the precursor material.

In accordance with still another embodiment of the inventive concept, a method of fabricating a semiconductor device includes forming a semiconductor substrate having a structure, loading the semiconductor substrate having the structure in the process chamber, forming a deposited film on the semiconductor substrate having the structure in the process chamber, and unloading the semiconductor substrate having the deposited film from the process chamber. The structure has vertical side parts. The formation of the deposited film includes repeatedly forming unit layers on the semiconductor substrate having the structure. The formation of the unit layer includes forming a first preliminary unit layer to which a first precursor material is adsorbed on the semiconductor substrate having the structure by supplying the first precursor material into the process chamber, forming a second preliminary unit layer from the first preliminary unit layer by supplying a film-control material into the process chamber, purging the process chamber in which the semiconductor substrate having the second preliminary unit layer is located, forming a unit layer from the second preliminary unit layer, and purging the process chamber in which the semiconductor substrate having the unit layer is located. The first preliminary unit layer includes a base part and an over-adsorbed part physically bonded to the base part. A portion of the film-control material forms a second precursor material while reacting with the first preliminary unit layer to separate the over-adsorbed part from the base part.

In some embodiments, the first precursor material may be a first compound including a central atom and a ligand bonded to the central atom, and a portion of the film-control material may form a second precursor material while being bonded to a central atom of the over-adsorbed part to separate the over-adsorbed part from the base part.

In other embodiments, a portion of the film-control material may be bonded to a central atom of the base part to increase the coordination number of the central atom of the base part.

In still other embodiments, the semiconductor substrate having the first preliminary unit layer may include an empty region to which the precursor material is not adsorbed.

In still other embodiments, the formation of the second preliminary unit layer may include the second precursor material being adsorbed onto the empty region of the semiconductor substrate.

In still other embodiments, the over-adsorbed part may be formed in an upper part of the structure, and the empty region may be formed in a lower part of the structure located at a lower level than the over-adsorbed region.

In accordance with still another embodiment of the inventive concept, a method of fabricating a semiconductor device includes loading a semiconductor substrate into a process chamber, forming a deposited film on the semiconductor substrate in the process chamber, and unloading the semiconductor substrate in which the deposited layer is formed from the process chamber. The formation of the deposited film includes repeatedly forming unit layers on the semiconductor substrate. The formation of the unit layer includes forming a preliminary unit layer by supplying a first process material including a film-control material and precursor material into the process chamber, firstly purging the process chamber in which the semiconductor substrate having the preliminary unit layer is located, forming a unit layer from the preliminary unit layer in the firstly purged process chamber, and secondly purging the process chamber in which the semiconductor substrate having the unit layer is located, and removing a residual product during secondly purging the process chamber. The precursor material is a first compound including a central atom and a ligand bonded to the central atom, and the preliminary unit layer includes a second compound formed by the precursor material being bonded to the film-control material. The residual product is formed by the ligand and film-control material of the second compound being separated from the preliminary unit layer while forming the unit layer from the preliminary unit layer.

In some embodiments, while the preliminary unit layer is formed, precursor molecules of the precursor material may bond together in the process chamber to form a precursor cluster, and the film-control material may form the second compound by breaking bonds between molecules of the precursor cluster to be bonded to the molecules of the precursor cluster.

In other embodiments, the formation of the preliminary unit layer may be performed in a process atmosphere in which the first compound, the film-control material, and the second compound co-exist.

Details of other embodiments are included in the detailed description and drawings.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF EMBODIMENTS

Figure 1:
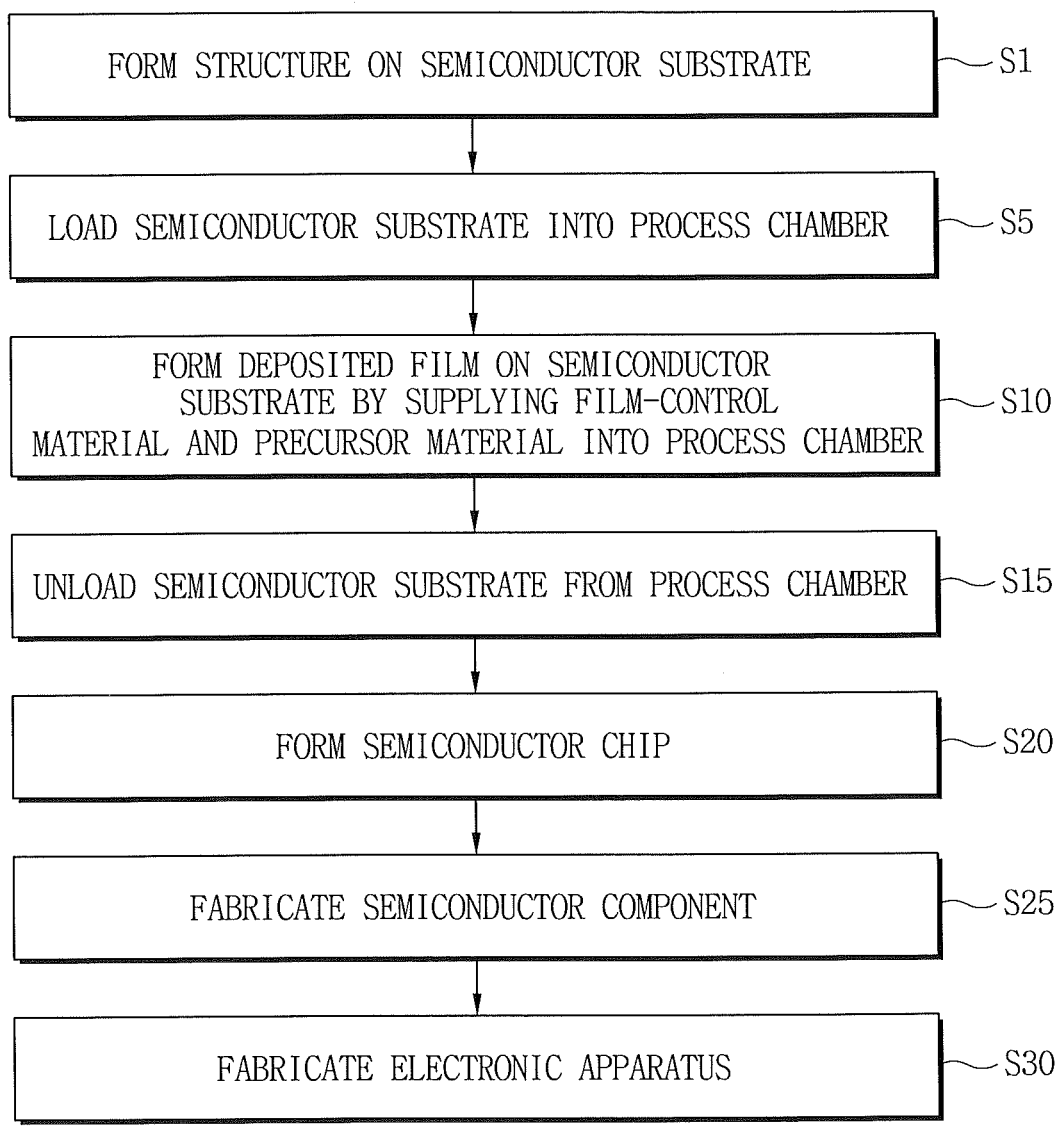
FIG. 1 is a process flowchart showing a method of fabricating a semiconductor device in accordance with some embodiments of the inventive concept.

Various embodiments will now be described more fully with reference to the accompanying drawings in which some embodiments are shown. These inventive concepts may, however, be embodied in different forms and should not be construed as limited to the embodiments set forth herein. Rather, these embodiments are provided so that this disclosure is thorough and complete and fully conveys the inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a process flowchart showing methods of fabricating a semiconductor device in accordance with embodiments of the inventive concept.

Referring to FIG. 1, a structure may be formed on a semiconductor substrate (block S1). The semiconductor substrate may be a silicon substrate. The structure may have a vertical side. The semiconductor substrate may be loaded into a process chamber (block S5). A deposited film may be formed on the semiconductor substrate by supplying a process material including a film-control material and precursor material into the process chamber in which the semiconductor substrate is located (block S10). The deposited film may include an insulating material film, a semiconductor material film, or a conductive material film. The formation of the deposited film may include repeatedly forming a unit layer until a desired thickness of the deposited film is achieved.

The semiconductor substrate in which the deposited film is formed may be unloaded from the process chamber (block S15). A semiconductor chip may be formed using the unloaded semiconductor substrate including the deposited film (block S20). The semiconductor chip may be a non-memory semiconductor chip or a memory semiconductor chip. A semiconductor component may be fabricated using the semiconductor chip (block S25). An electronic apparatus may be fabricated using the semiconductor component (block S30).

A semiconductor apparatus for performing the process (block S10) of forming the deposited film on the semiconductor substrate by supplying the process material including the film-control material and precursor material into the process chamber may be an apparatus in which an atomic layer deposition (ALD) or chemical vapor deposition (CVD) process is performed. The semiconductor apparatus may include the process chamber. The process chamber may be a chamber in which the semiconductor substrate having the structure is loaded and the ALD or CVD process is performed. A process material supply system for supplying the film-control material and precursor material into the process chamber may be provided.

Figure 2:
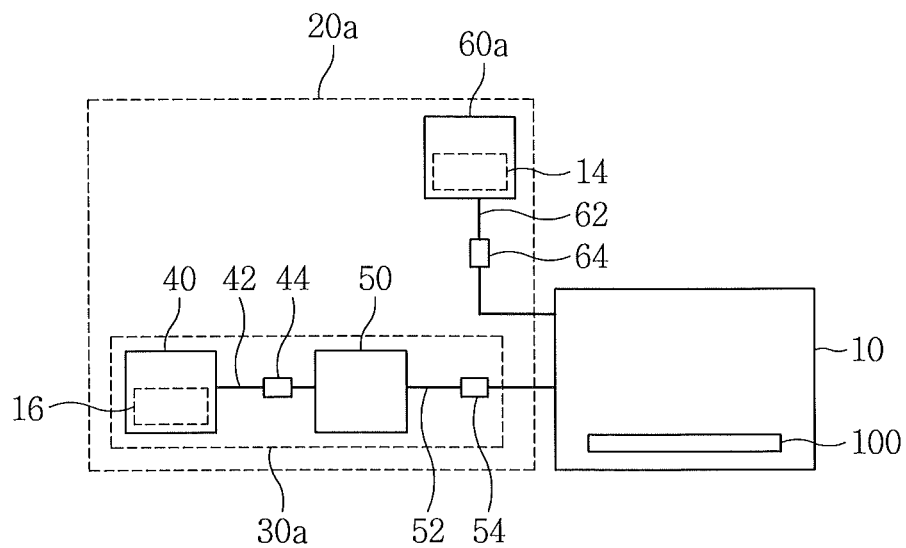
FIG. 2 is a diagram schematically illustrating an apparatus for fabricating a semiconductor device in accordance with some embodiments of the inventive concept.

A semiconductor apparatus including the process chamber and process material supply system will be described with reference to FIG. 2. FIG. 2 is a diagram schematically illustrating an apparatus for fabricating a semiconductor device in accordance with some embodiments of the inventive concept.

Referring to FIG. 2, a semiconductor apparatus 1a may include a process material supply system 20a which independently supplies a film-control material 14 and a precursor material 16 into a process chamber 10. The process material supply system 20a may supply the precursor material 16 and the film-control material 14 into the process chamber 10 independently and at different times, or supply the precursor material 16 and the film-control material 14 into the process chamber 10 at the same time. The process chamber 10 may be a chamber in which a semiconductor substrate 100 having a structure is loaded/unloaded.

In an embodiment, the film-control material 14 may be a ligand-hydrogen compound denoted as LH, and the precursor material 16 may be denoted as $ML_n$. In the $ML_n$, "M" may be a central atom of the precursor material 16, "L" may be a ligand bonded to the central atom M of the precursor material 16, and "n" may be a number determined depending on the central atom M and the ligand L, for example, any one of 2 to 6. The film-control material 14 may be a hydride of the ligand L of the precursor material 16. For example, when the precursor material 16 is a zirconium precursor represented by the chemical formula $Zr[N(CH_3)(CH_2CH_3)]_4$, the film-control material 14 may be the hydride $HN(CH_3)(CH_2CH_3)$ of the ligand $N(CH_3)(CH_2CH_3)$ of the zirconium precursor. When the precursor material 16 is a ruthenium precursor represented by the chemical formula $Ru(EtCp)_2$, the film-control material 14 may be the hydride HEtCp of the ligand EtCp of the ruthenium precursor. When the precursor material 16 is a titanium precursor represented by the chemical formula $Ti(NMe_2)_4$, the film-control material 14 may be the hydride $HNMe_2$ of the ligand $NMe_2$ of the titanium precursor. Here, "Me" may be a methyl group ($-CH_3$).

In another embodiment, the precursor material 16 may be denoted as $M(L^a)_n(L^b)_m$, and the film-control material 14 may be denoted as $L^aH$ or $L^bH$. In the $M(L^a)_n(L^b)_m$, "M" may be a central atom of the precursor material 16, "$L^a$" may be a first ligand bonded to the central atom M, and "$L^b$" may be a second ligand bonded to the central atom M and different from the first ligand. In addition, "n" may be a number determined depending on the central atom M and the first ligand $L^a$, and "m" may be a number determined depending on the central atom M and the second ligand $L^b$.

The film-control material 14 may be the hydride $L^aH$ of the first ligand $L^a$ of the precursor material 16, or the hydride $L^bH$ of the second ligand $L^b$ of the precursor material 16. For example, the precursor material 16 may be $CpZr(N(CH_3)_2)_3$, and the film-control material 14 may be a hydride of the ligand of $CpZr(N(CH_3)_2)_3$. Here, Cp may be a cyclopentadienyl group. The film-control material 14 may be dimethylamine, the hydride of the ligand $N(CH_3)_2$ bonded to the central atom Zr of the precursor $CpZr(N(CH_3)_2)_3$. Here, the dimethylamine may be $HN(CH_3)_2$.

In still another embodiment, the precursor material 16 may be $M(L^a)_n(L^b)_m$, and the film-control material 14 may be $L^cH$. In this case, the $L^cH$ of the film-control material 14 may be a material which is bonded to the central atom M of the precursor material 16 to form $M(L^c)_x(L^d)_y$. Here, in the $M(L^c)_x(L^d)_y$, the ligand $L^d$ may be one of the first ligand $L^a$ and second ligand $L^b$ of the precursor material 16. In addition, the $M(L^c)_x(L^d)_y$ may be a material available in the process of forming the deposited film in place of the precursor material 16. Here, "n" may be a number determined depending on a bonding state between the central atom M and the ligand $L^a$, "m" may be a number determined depending on a bonding state between the central atom M and the ligand $L^b$, "x" may be a number determined depending on a bonding state between the central atom M and the ligand $L^c$, and "y" may be a number determined depending on a bonding state between the central atom M and the ligand $L^d$. For example, when the precursor material 16 is Tetrakis Ethyl-Methyl-Amino Zirconium (TEMAZ) precursor, the film-control material 14 may be dimethylamine. The TEMAZ may be represented by the chemical formula $Zr[N(CH_3)(CH_2CH_3)]_4$, and the dimethylamine may be represented by the chemical formula $HN(CH_3)_2$. When the precursor material 16 is $CpZr(N(CH_3)_2)_3$ precursor, the film-control material 14 may be ethylmethylamine. Here, the ethylmethylamine may be represented by the chemical formula $HN(CH_3)(CH_2CH_3)$.

In still another embodiment, the precursor material 16 may be $M(L^a)_n(L^b)_m$, and the film-control material 14 may be an alkyl compound of a ligand of the precursor material 16. For example, the film-control material 14 may be $L^aR$ or $L^bR$. Here, the "$L^a$" and $L^b$ may be ligands bonded to the central atom M of the precursor material 16, "R" may be an alkyl compound or alkyl-based compound such as $CH_3$ or $CH_2CH_3$. For example, the precursor material 16 may be TEMAZ or $CpZr(N(CH_3)_2)_3$, and the film-control material 14 may be $NMe_3$ or $NEt_3$. Me may refer to a methyl group, Et may refer to an ethyl group, and N may be nitrogen.

In still another embodiment, the precursor material 16 may be $M(L^a)_n(L^b)_m$, and the film-control material 14 may be $L^cR$. The $L^cR$ may be a material bonded to the central atom M of the precursor material 16 to form a precursor (e.g., $M(L^c)_x(L^d)_y$) different from the precursor material 16. In the $L^cR$, "$L^c$" may be a compound that forms a precursor, such as $M(L^c)_x(L^d)_y$, different from the precursor material 16, and "R" may be an alkyl compound or alkyl-based compound, such as $CH_3$ or $CH_2CH_3$. Here, the precursor $M(L^c)_x(L^d)_y$ different from the precursor material 16 may be available to form the deposited film, in place of the precursor material 16.

The inventive concept may not be limited to the examples such as a zirconium precursor, a titanium precursor, or ruthenium precursor. For example, a material such as tetrakis dimethylamido titanium (TDMAT) as well as the above example, that is, the precursor represented by the chemical formula $Ti(NMe_2)_4$, may be used as the titanium precursor. For another example, when the film-control material 14 is a material represented by the chemical formula $L^aH$ and the precursor material 16 is a precursor represented by the chemical formula $ML^b_n$, in the chemical formula $ML^b_n$ of the precursor material 16, the central atom M may include one or more of Be, B, Mg, Al, Ca, Sc, Ti, V, Cr, Mn, Fe, Co, Ni, Cu, Zn, Ga, Sr, Y, Zr, Nb, Mo, Tc, Ru, Rh, Pd, Ag, Cd, In, Sn, Ba, La, Hf, Ta, W, Re, Os, Ir, Pt, Au, Hg, Tl, Pb, or Bi. Further, the ligand $L^b$ of the precursor material 16 or the ligand $L^a$ of the film-control material 14 may independently one of H, F, Cl, Br, I, C1-10 alkyl, C1-C9 alkoxy, C5-C12 aryl, b-diketonate, cyclopentadienyl, C1-C8 alkylcyclopentadienyl, C1-C9 amino, C1-C9 thio, and amidinate, or derivatives in which a halogen is added to one of H, F, Cl, Br, I, C1-10 alkyl, C1-C9 alkoxy, C5-C12 aryl, b-diketonate, cyclopentadienyl, C1-C8 alkylcyclopentadienyl, C1-C9 amino, C1-C9 thio, and amidinate. Otherwise, the ligand $L^b$ of the precursor material 16 or the ligand $L^a$ of the film-control material 14 may be independently one of C1-C10 ether, C1-C12 amine, C1-C10 sulfide, C1-C9 nitrile, pyridine, pyrrole, and furan, or derivative in which a halogen is added to one of C1-C10 ether, C1-C12 amine, C1-C10 sulfide, C1-C9 nitrile, pyridine, pyrrole, and furan.

The process material supply system 20*a* may include a precursor supply apparatus 30*a* and a film-control material supply apparatus 60*a*. The precursor supply apparatus 30*a* may be an apparatus that supplies the precursor material 16 into the process chamber 10.

The precursor supply apparatus 30*a* may include a precursor storage container 40 and a vaporizer 50. The precursor storage container 40 and the vaporizer 50 may be connected by a pipe 42, and a flow rate control device 44 may be arranged in the pipe 42. The vaporizer 50 and the process chamber 10 may be connected by a pipe 52, and a flow rate control device 54 may be arranged in the pipe 52.

The precursor material 16 in the precursor storage container 40 may be moved to the vaporizer 50 and vaporized in the vaporizer 50. In addition, the precursor material 16 vaporized in the vaporizer 50 may be supplied into the process chamber 10.

The film-control material supply apparatus 60*a* may be an apparatus for supplying the film-control material 14 into the process chamber 10. The film-control material 14 may be stored in the film-control material supply apparatus 60*a*, and supplied from the film-control material supply apparatus 60*a* to the process chamber 10 via a pipe 62.

The film-control material supply apparatus 60*a* and the process chamber 10 may be connected by the pipe 62, and a flow rate control device 64 that controls flow rate of the film-control material 14 may be arranged in the pipe 62. The pipes 42, 52, and 62 may be pipes in which a fluid flows, and the flow rate control devices 44, 54, and 64 may include valve systems that control flow rate of the fluid.

The process material supply system 20*a* may be a system that separately supplies the precursor material 16 and the film-control material 14 into the process chamber 10. The process material supply system 20*a* may supply the precursor material 16 and the film-control material 14 into the process chamber 10 at difference times.

The semiconductor fabrication apparatus for fabricating a semiconductor device in accordance with some embodiments of the inventive concept may not be limited to the apparatus described in FIG. 2. Other examples of semiconductor fabrication apparatus for fabricating a semiconductor device in accordance with some embodiments of the inventive concept will be described with reference to FIGS. 3 to 6, respectively. Each of FIGS. 3 to 6 is a diagram schematically illustrating an example of the apparatus for fabricating a semiconductor device in accordance with some embodiments of the inventive concept.

Figure 3:
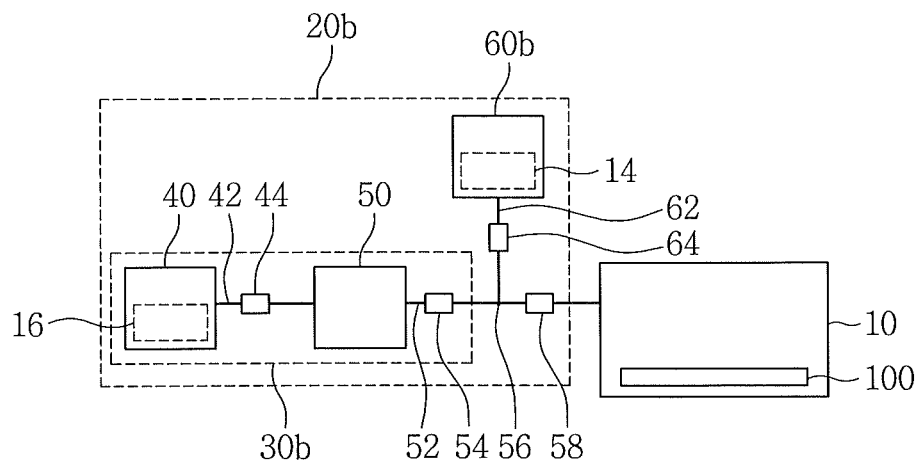
FIG. 3 is a diagram schematically illustrating a modified example of the apparatus for fabricating a semiconductor device in accordance with some embodiments of the inventive concept.

FIG. 3 is a diagram schematically illustrating another example of the apparatus for fabricating a semiconductor device in accordance with some embodiments of the inventive concept.

Referring to FIG. 3, a semiconductor apparatus 1*b* including a process material supply system 20*b* that supplies a precursor material 16 and a film-control material 14 into a process chamber 10, may be provided. The process material supply system 20*b* may include a precursor supply apparatus 30*b* that supplies the precursor material 16 into the process chamber 10, and a film-control material supply apparatus 60*b* that supplies the film-control material 14 into the process chamber 10.

The precursor supply apparatus 30*b* may include a precursor storage container 40 that stores the precursor material 16 in a liquid state, and a vaporizer 50 that vaporizes the precursor material 16. The precursor storage container 40 and the vaporizer 50 may be connected by a pipe 42, and a flow rate control device 44 may be arranged in the pipe 42. The vaporizer 50 and the process chamber 10 may be connected by a pipe 52.

The pipe 52 that connects the vaporizer 50 and the process chamber 10 may be defined as a first pipe 52. The film-control material supply apparatus 60*b* may be connected to the first pipe 52. A second pipe 62 may be arranged to connect the first pipe 52 and the film-control material supply apparatus 60*b*.

A flow rate control device 54 may be disposed in the first pipe 52 located between a connection part 56 at which the first pipe 52 and the second pipe 62 are connected and the vaporizer 50. A flow rate control device 58 may be disposed in the first pipe 52 between the connection part 56 at which the first pipe 52 and the second pipe 62 are connected and the process chamber 10.

The film-control material 14 may be stored in the film-control material supply apparatus 60*b*, and supplied to the process chamber 10 via the second pipe 62 and the first pipe 52 from the film-control material supply apparatus 60*b*.

The process material supply system 20*b* may supply the precursor material 16 and the film-control material 14 into the process chamber 10 at different times. In addition, the process material supply system 20*b* may supply the precursor material 16 and the film-control material 14 at the same time. When the precursor material 16 and the film-control material 14 are supplied into the process chamber 10 at the same time, the process material supply system 20*b* may mix the film-control material 14 and the precursor material 16 which is vaporized by the vaporizer 50, and supply them into the process chamber 10.

Figure 4:
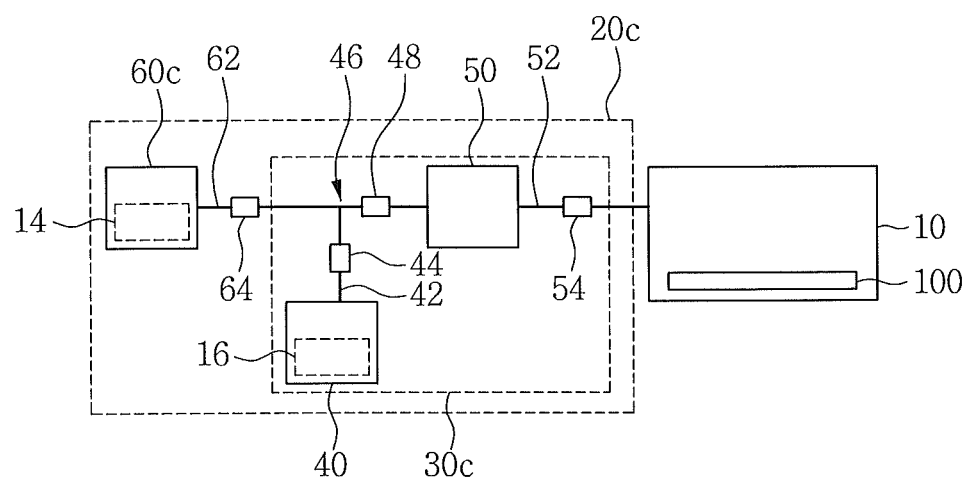
FIG. 4 is a diagram schematically illustrating another modified example of the apparatus for fabricating a semiconductor device in accordance with some embodiments of the inventive concept.

FIG. 4 is a diagram schematically illustrating still another example of the apparatus for fabricating a semiconductor device in accordance with some embodiments of the inventive concept.

Referring to FIG. 4, a semiconductor apparatus 1*c* including a process material supply system 20*c* that supplies a precursor material 16 and a film-control material 14 into a process chamber 10, may be provided.

The process material supply system 20*c* may include a precursor supply apparatus 30*c* and a film-control material supply apparatus 60*c*.

The precursor supply apparatus 30*c* may include a precursor storage container 40 that stores the precursor material 16 in a liquid state, and a vaporizer 50 that vaporizes the precursor material 16. The precursor storage container 40 and the vaporizer 50 may be connected by a pipe 42. The vaporizer 50 and the process chamber 10 may be connected by a pipe 52, and a flow rate control device 54 may be arranged in the pipe 52.

The pipe 42 that connects the precursor storage container 40 and the vaporizer 50 may be defined as a first pipe 42. The film-control material supply apparatus 60*c* that stores the film-control material 14 may be connected to the first pipe 42 through a second pipe 62. Accordingly, the second pipe 62 may connect the first pipe 42 and the film-control material supply apparatus 60*c*. A flow rate control device 64 that controls flow rate of the film-control material 14 may be arranged in the second pipe 62.

A flow rate control device 44 may be arranged between a connection part 46 at which the first pipe 42 and the second pipe 62 are connected and the precursor storage container 40. A flow rate control device 48 may be arranged between the connection part 46 at which the first pipe 42 and the second pipe 62 are connected and the vaporizer 50. The film-control material 14 in the film-control material supply apparatus 60c may be supplied into the process chamber 10 through the vaporizer 50

The process material supply system 20c may separately supply the precursor material 16 and the film-control material 14 into the process chamber 10. In addition, the process material supply system 20c may supply the precursor material 16 and the film-control material 14 at the same time.

When the precursor material 16 and the film-control material 14 are supplied into the process chamber 10 at the same time, the precursor material 16 and the film-control material 14 are simultaneously moved to the vaporizer 50, simultaneously vaporized in the vaporizer 50, and supplied into the process chamber 10.

Figure 5:
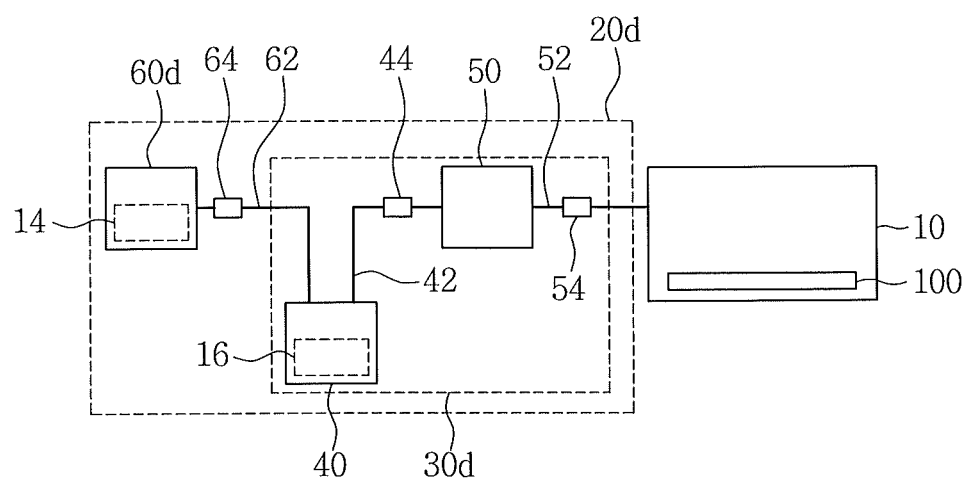
FIG. 5 a diagram schematically illustrating still another modified example of the apparatus for fabricating a semiconductor device in accordance with some embodiments of the inventive concept.

FIG. 5 is a diagram schematically illustrating still another example of the apparatus for fabricating a semiconductor device in accordance with some embodiments of the inventive concept.

Referring to FIG. 5, a semiconductor apparatus 1d including a process material supply system 20d that supplies a precursor material 16 and a film-control material 14 into a process chamber 10, may be provided. The process material supply system 20d may include a precursor supply apparatus 30d and a film-control material supply apparatus 60d.

The precursor supply apparatus 30d may include a precursor storage container 40 that stores the precursor material 16 in a liquid state, and a vaporizer 50 that vaporizes the precursor material 16. The precursor storage container 40 and the vaporizer 50 may be connected by a pipe 42. The vaporizer 50 and the process chamber 10 may be connected by a pipe 52, and a flow rate control device 54 may be arranged in the pipe 52.

The film-control material supply apparatus 60d may store the film-control material 14. The film-control material supply apparatus 60d may be connected to the precursor supply apparatus 30d through a pipe 62. A flow rate control device 64 may be arranged in the pipe 62.

The film-control material supply apparatus 60d may be connected to the precursor storage container 40 of the precursor supply apparatus 30d through the pipe 62.

The film-control material 14 in the film-control material supply apparatus 60d may be moved to the precursor storage container 40, admixed with the precursor material 16, and supplied with the precursor material 16 from precursor storage container 40 into the process chamber 10 through the vaporizer 50.

Figure 6:
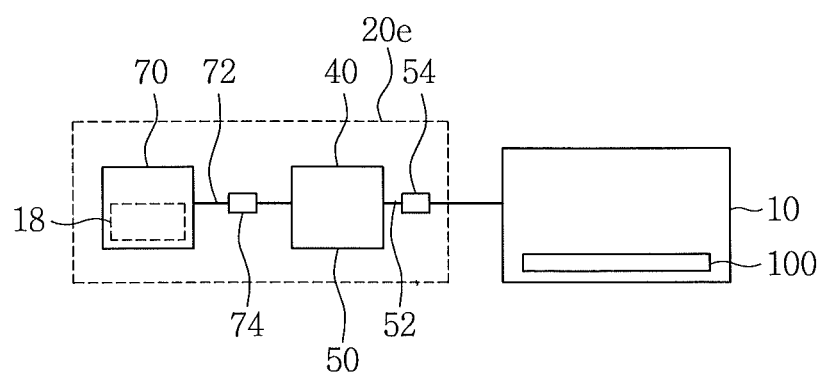
FIG. 6 a diagram schematically illustrating still another modified example of the apparatus for fabricating a semiconductor device in accordance with some embodiments of the inventive concept.

FIG. 6 is a diagram schematically illustrating still another example of the apparatus for fabricating a semiconductor device in accordance with some embodiments of the inventive concept.

Referring to FIG. 6, a semiconductor apparatus 1e including a process material supply system 20e that supplies a precursor material 16 and a film-control material 14 into a process chamber 10, may be provided.

The process material supply system 20e may include process material storage container 70 and a vaporizer 50. The process material storage container 70 may store the precursor material 16 and film-control material 14 at the same time. For example, the precursor material 16 and the film-control material 14 may be stored as a mixed liquid state material 18 in the process material storage container 70.

The process material storage container 70 may be connected to the vaporizer 50 through a pipe 72. A flow rate control device 74 may be arranged in the pipe 72. The vaporizer 50 may be connected to the process chamber 10 through a pipe 52. A flow rate control device 54 may be arranged in the pipe 52.

Accordingly, a process material 18 including the precursor material 16 and film-control material 14 in the process material storage container 70 may be moved to the vaporizer 50, and vaporized in the vaporizer 50. The precursor material 16 and film-control material 14 vaporized in the vaporizer 50 may be supplied into the process chamber 10 at the same time.

As described in FIG. 1 and FIGS. 2 to 6, according to the embodiments of the inventive concept, a deposited film may be formed in a semiconductor substrate by supplying the film-control material 14 and the precursor material 16 into the process chamber 10. In this way, a method or sequence of supplying the film-control material 14 and the precursor material 16 into the process chamber 10, will be described with reference to FIGS. 7A to 7I, respectively.

Figure 7A:
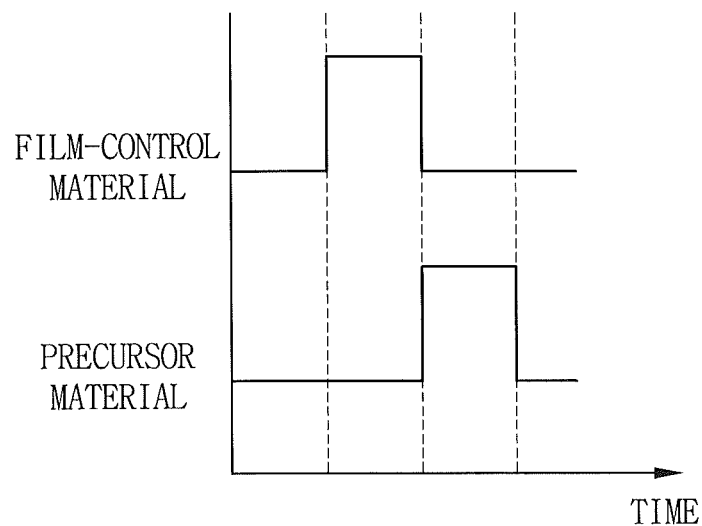
FIG. 7A is a gas-pulsing diagram describing an example of a method of supplying a process material into a process chamber in order to fabricate a semiconductor device in accordance with some embodiments of the inventive concept.

FIG. 7A is a gas-pulsing diagram describing an example method of supplying the film-control material 14 and the precursor material 16 into the process chamber 10. Referring to FIG. 7A and one of the semiconductor apparatuses in FIGS. 2 to 4, the film-control material 14 may be supplied into the process chamber 10 before the precursor material 16, and the precursor material 16 may be supplied after the supply of the film-control material 14 stops.

Figure 7B:
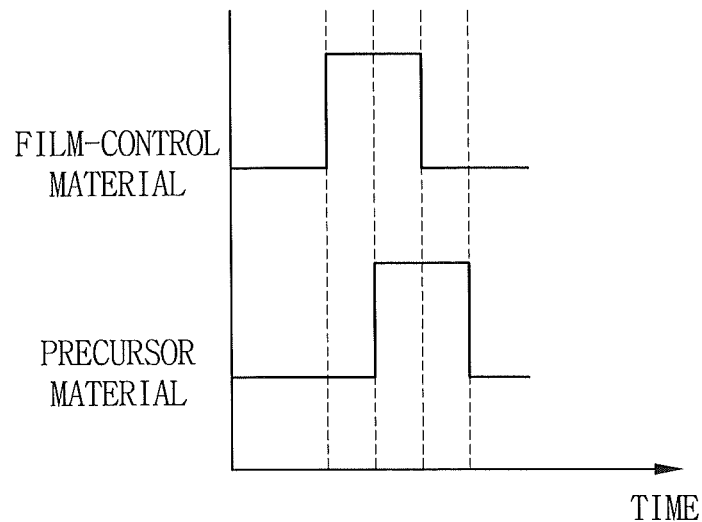
FIG. 7B is a gas-pulsing diagram describing another example of a method of supplying a process material into a process chamber in order to fabricate a semiconductor device in accordance with some embodiments of the inventive concept.

FIG. 7B is a gas-pulsing diagram describing another example method of supplying the film-control material 14 and the precursor material 16 into the process chamber 10. Referring to FIG. 7B and one of the semiconductor apparatuses in FIGS. 2 to 4, the film-control material 14 may be supplied into process chamber 10 before the precursor material 16, the supply of the precursor material 16 may start while the film-control material 14 is supplied, and then the supply of the precursor material 16 may stop after the supply of the film-control material 14 stops. Accordingly, the film-control material 14 and the precursor material 16 may be supplied together into the process chamber 10 for a certain period.

Figure 7C:
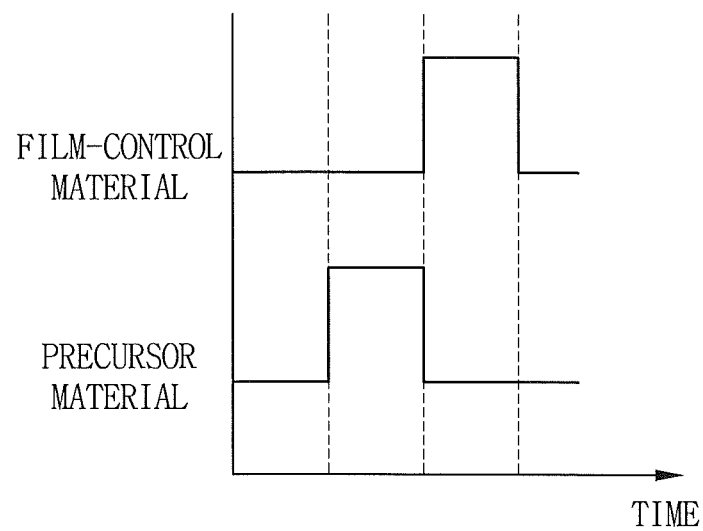
FIG. 7C is a gas-pulsing diagram describing still another example of a method of supplying a process material into a process chamber in order to fabricate a semiconductor device in accordance with some embodiments of the inventive concept.

FIG. 7C is a gas-pulsing diagram describing still another example method of supplying the film-control material 14 and the precursor material 16 into the process chamber 10. Referring to FIG. 7C and one of the semiconductor apparatuses in FIGS. 2 to 4, the precursor material 16 may be supplied into the process chamber 10 before the film-control material 14, and the film-control material 14 may be supplied after the supply of the precursor material 16 stops.

Figure 7D:
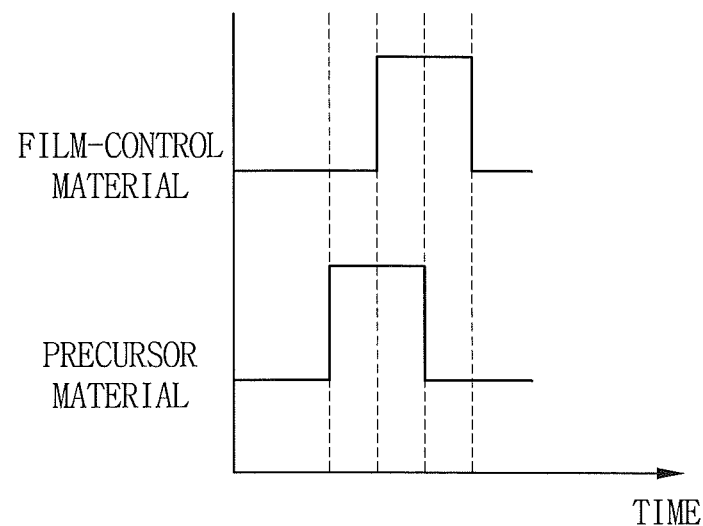
FIG. 7D is a gas-pulsing diagram describing still another example of a method of supplying a process material into a process chamber in order to fabricate a semiconductor device in accordance with some embodiments of the inventive concept.

FIG. 7D is a gas-pulsing diagram describing still another example method of supplying the film-control material 14 and the precursor material 16 into the process chamber 10. Referring to FIG. 7D and one of the semiconductor apparatuses in FIGS. 2 to 4, the supply of the precursor material 16 into process chamber 10 may start before the film-control material 14, then the supply of the film-control material 14 may start while the precursor material 16 is supplied, then the supply of the precursor material 16 may stop, and then the supply of the film-control material 14 may stop. Accordingly, the film-control material 14 and the precursor material 16 may be supplied together into the process chamber 10 for a certain period.

Figure 7E:
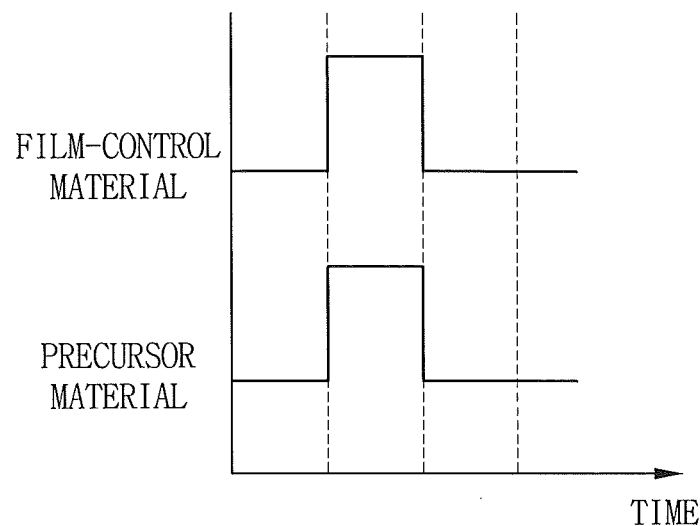
FIG. 7E is a gas-pulsing diagram describing still another example of a method of supplying a process material into a process chamber in order to fabricate a semiconductor device in accordance with some embodiments of the inventive concept.

FIG. 7E is a gas-pulsing diagram describing still another example method of supplying the film-control material 14 and the precursor material 16 into the process chamber 10. Referring to FIG. 7E and one of the semiconductor apparatuses in FIGS. 2 to 6, the supply of the precursor material 16 and film-control material 14 into the process chamber 10 may start at the same time and stop at the same time.

Figure 7F:
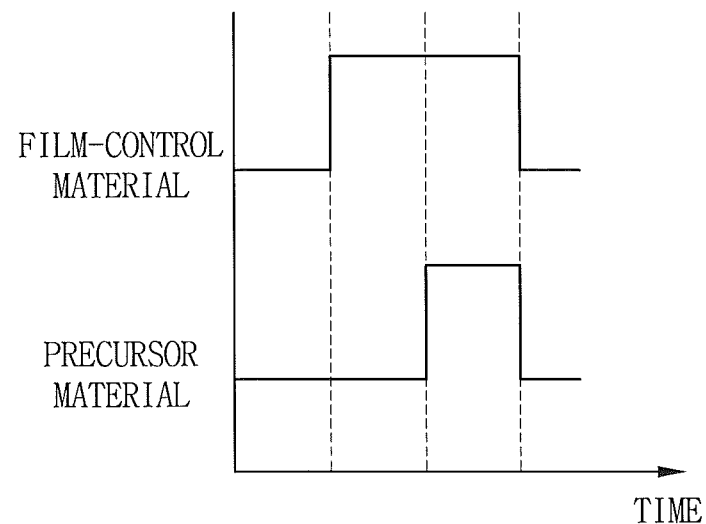
FIG. 7F is a gas-pulsing diagram describing still another example method of supplying a process material into a process chamber in order to fabricate a semiconductor device in accordance with some embodiments of the inventive concept.

FIG. 7F is a gas-pulsing diagram describing still another example method of supplying the film-control material 14 and the precursor material 16 into the process chamber 10. Referring to FIG. 7F and one of the semiconductor apparatuses in FIGS. 2 to 4, the film-control material 14 may be supplied into the process chamber 10 before the precursor material 16, and then the supply of the precursor material 16 may start while the film-control material 14 is supplied. Next, the supply of the precursor material 16 and film-control material 14 into the process chamber 10 may stop at the same time.

Figure 7G:
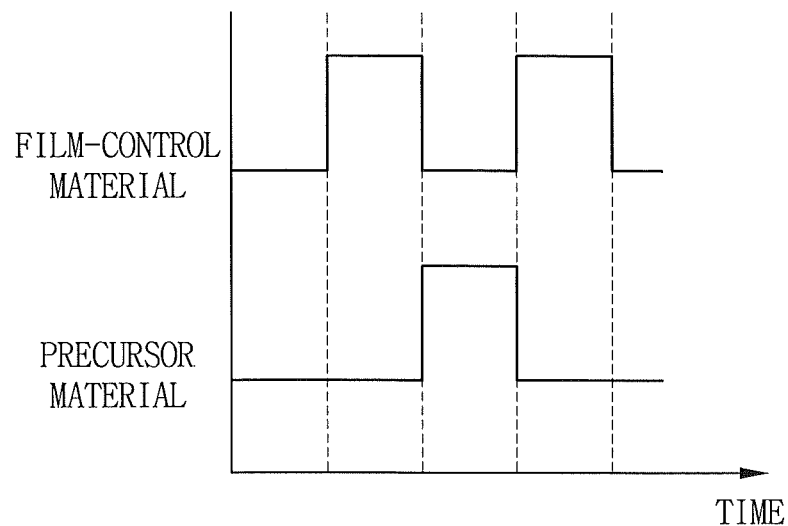
FIG. 7G is a gas-pulsing diagram describing still another example method of supplying a process material into a process chamber in order to fabricate a semiconductor device in accordance with some embodiments of the inventive concept.

FIG. 7G is a gas-pulsing diagram describing still another example method of supplying the film-control material 14 and the precursor material 16 into the process chamber 10. Referring to FIG. 7G and one of the semiconductor apparatuses in FIGS. 2 to 4, in order to supply the precursor material 16 and the film-control material 14 into the process chamber 10, the film-control material 14 may be firstly supplied, then the precursor material 16 may be supplied, and then the film-control material 14 may be secondly supplied. That is, the film-control material 14 may be supplied into the process chamber 10 before the precursor material 16, then the supply of the precursor material 16 may start while the supply of the film-control material 14 stops, and then the supply of the film-control material 14 may start while the supply of the precursor material 16 stops.

Figure 7H:
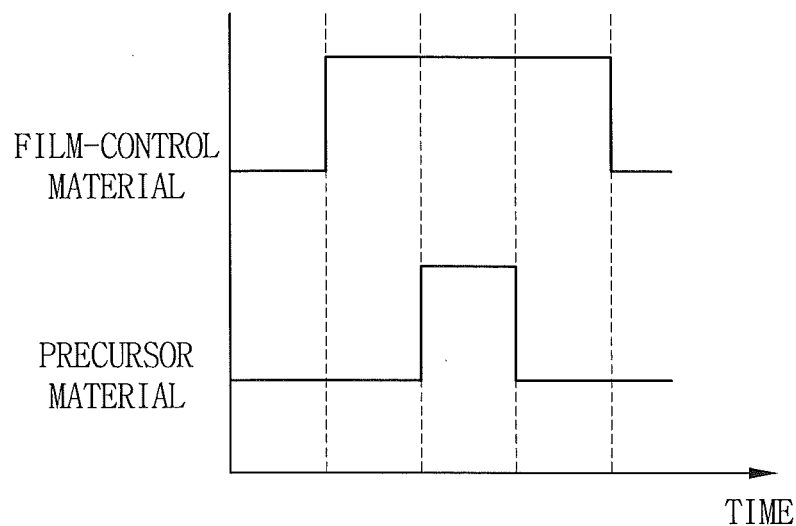
FIG. 7H is a gas-pulsing diagram describing still another example method of supplying a process material into a process chamber in order to fabricate a semiconductor device in accordance with some embodiments of the inventive concept.

FIG. 7H is a gas-pulsing diagram describing still another example method of supplying the film-control material 14 and the precursor material 16 into the process chamber 10. Referring to FIG. 7H and one of the semiconductor apparatuses in FIGS. 2 to 4, in order to supply the precursor material 16 and the film-control material 14 into the process chamber 10, the precursor material 16 may start supplying while the film-control material 14 is supplied. That is, the supply of the precursor material 16 may start while the film-control material 14 is being supplied. The film-control material 14 may be supplied into the process chamber 10 before the precursor material 16, and, after a period of time, the precursor material 16 may be supplied together with the film-control material 14, and the film-control material 14 may continue to be supplied even after the supply of the cursor material 16 stops.

Figure 7I:
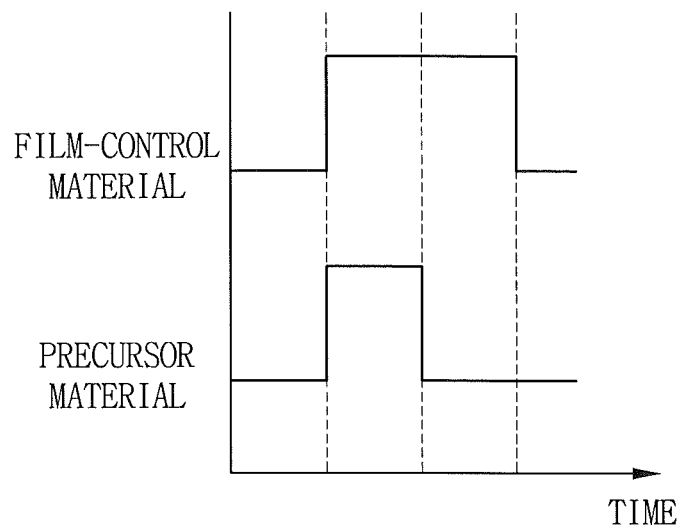
FIG. 7I is a gas-pulsing diagram describing still another example method of supplying a process material into a process chamber in order to fabricate a semiconductor device in accordance with some embodiments of the inventive concept.

FIG. 7I is a gas-pulsing diagram describing still another example method of supplying the film-control material 14 and the precursor material 16 into the process chamber 10. Referring to FIG. 7I and one of the semiconductor apparatuses in FIGS. 2 to 4, the film-control material 14 and the precursor material 16 may be simultaneously supplied into the process chamber 10, and the film-control material 14 may be supplied for a longer time than the precursor material 16.

Figure 8:
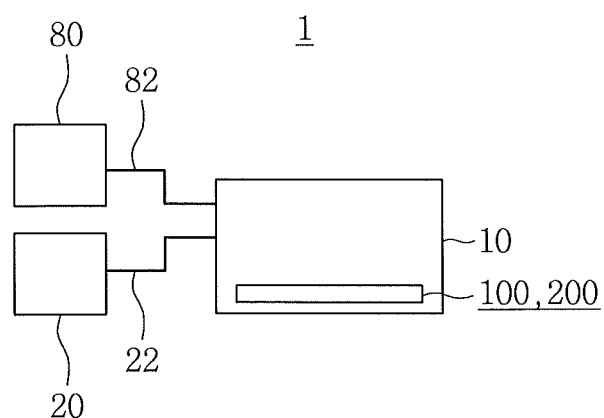
FIG. 8 is a diagram schematically illustrating still another modified example of the apparatus for fabricating a semiconductor device in accordance with some embodiments of the inventive concept.

FIG. 8 is a diagram schematically illustrating still another example of the semiconductor apparatus for fabricating a semiconductor device in accordance with some embodiments of the inventive concept.

Referring to FIG. 8, a semiconductor apparatus 1 including a process chamber 10, first process material supply apparatus 20, and second process material supply apparatus 80 may be provided. The semiconductor apparatus 1 may be a deposition apparatus such as ALD or CVD equipment. A semiconductor substrate 100 in which structures are formed may be loaded into the process chamber 10.

The first process material supply apparatus 20 may be an apparatus that supplies a first process material into the process chamber 10. For example, the first process material supply apparatus 20 may be an apparatus that supplies a first precursor material and a first film-control material into the process chamber 10. The first process material supply apparatus 20 may be one of the process material supply systems 20a, 20b, 20c, 20d, and 20e described in FIGS. 2 to 6. For example, the first process material supply apparatus 20 may be an apparatus that supplies the film-control material 14 and the precursor material 16 into the process chamber 10 as described in FIGS. 2 to 6.

The second process material supply apparatus 80 may be an apparatus that supplies the second process material into the process chamber 10.

In the embodiments, the second process material supply apparatus 80 may be an apparatus that supplies a second process material including a second precursor material that has a second central atom different from a first central atom of the first precursor material, into the process chamber 10. The second process material supply apparatus 80 may be an apparatus that supplies a second film-control material into the process chamber 10 together with the second precursor material. The second process material supply apparatus 80 may be one of the process material supply systems 20a, 20b, 20c, 20d, and 20e described in FIGS. 2 to 6.

In some embodiments, the second process material supply apparatus 80 may be an apparatus that supplies a reactant that reacts with a central atom of the first precursor material supplied from the first process material supply apparatus 20 into the process chamber 10, and the product of the reaction may be adsorbed onto the surface of the semiconductor substrate 100. Adsorption generally refers to the adhesion of atoms, ions, or molecules from a gas, liquid, or dissolved solid (the adsorbate) to a surface (the adsorbent). This process creates a film of the adsorbate on the surface of the adsorbent. For example, the central atom of the first precursor material which is supplied from the first process material supply apparatus 20 into the process chamber 10 may be a metal, and the reactant which is supplied from the second process material supply apparatus 80 into the process chamber 10 may be a material such as an oxidizer or a nitrating agent. The oxidizer may include ozone ($O_3$), oxygen ($O_2$), water vapor ($H_2O$), ozone plasma, or oxygen plasma. The nitrating agent may include ammonia ($NH_3$), nitrogen dioxide ($NO_2$), or nitrogen oxide ($N_2O$).

Accordingly, the metal atom of the first precursor material and the oxidizer may react to form a metal oxide on the semiconductor substrate 100 located in the process chamber 10, or the metal atom of the first precursor material and the nitrating agent may react to form a metal nitride on the semiconductor substrate 100 located in the process chamber 10.

Figure 9:
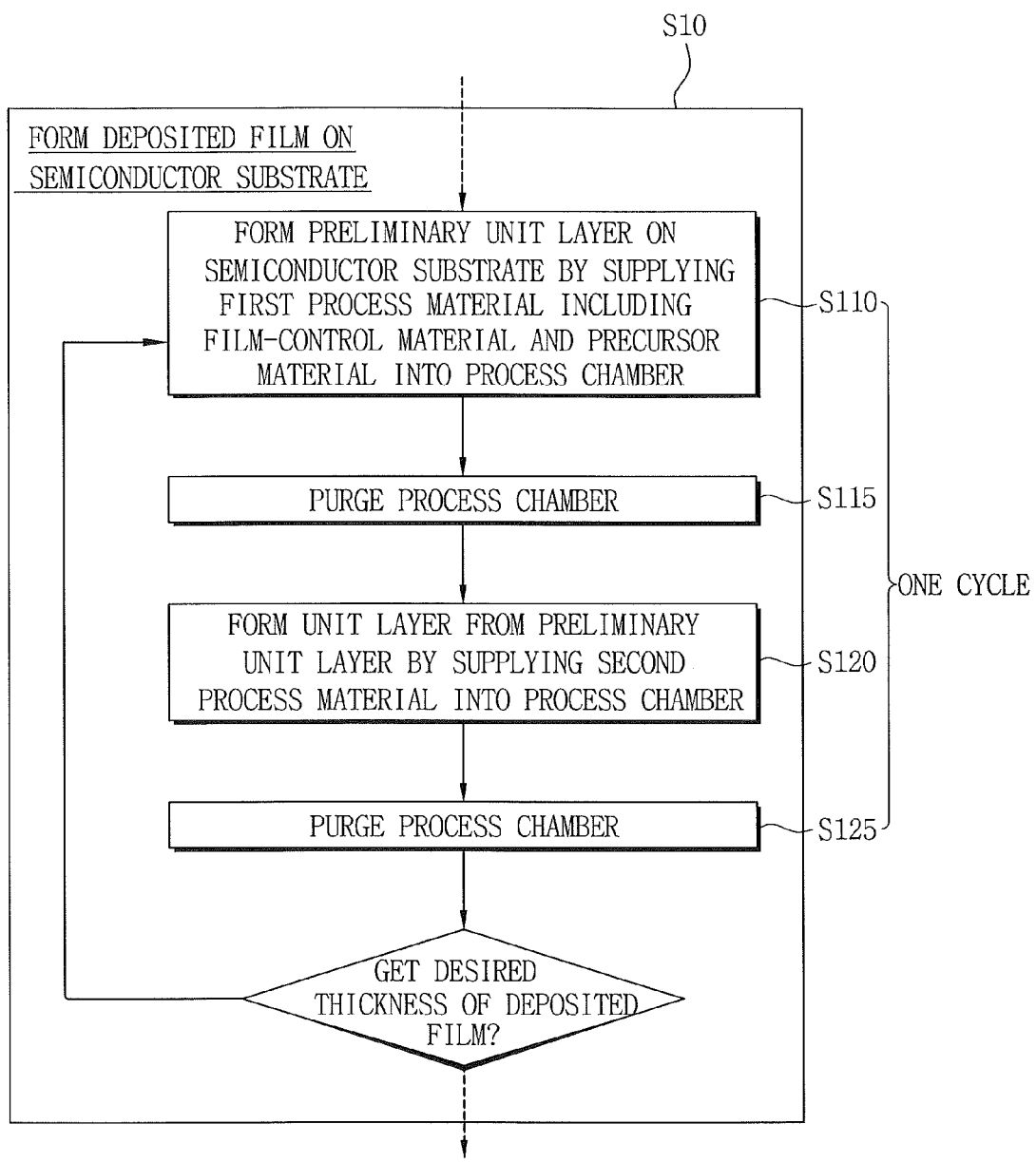
FIG. 9 is a process flowchart showing a method of fabricating a semiconductor device in accordance with some embodiments of the inventive concept.

FIG. 9 is a process flowchart describing in more detail the process step S10 in which the deposited film described in FIG. 1 is formed, in a method of fabricating a semiconductor device in accordance with some embodiments of the inventive concept. The method of fabricating a semiconductor device in accordance with some embodiments of the inventive concept will be described with reference to FIGS. 1, 8, and 9.

Referring to FIGS. 1, 8, and 9, a preliminary unit layer may be formed on the semiconductor substrate 100 by supplying a first process material including a film-control material and a precursor material into the process chamber 10 of the semiconductor apparatus 1 (S110). The first process material may be supplied from the first process material supply apparatus 20 into the process chamber 10 through a pipe 22. The first process material supply apparatus 20 may be one of the process material supply systems 20a, 20b, 20c, 20d, and 20e described in FIGS. 2 to 6.

The film-control material and the precursor material may be supplied into the process chamber 10 using one of the methods, as described in FIGS. 7A to 7I, of supplying the film-control material 14 and the precursor material 16 into the process chamber 10. The process chamber 10 in which the semiconductor substrate 100 having the preliminary unit layer is located may be purged (S115). A second process material may be supplied into the purged process chamber 10 to form a unit layer from the preliminary unit layer (S120).

The second process material may be supplied from the second process material supply apparatus 80 of the semiconductor apparatus 1 into the process chamber 10 through a pipe 82. The process chamber 10 in which the semiconductor substrate 100 having the unit layer is located may be purged. To form the deposited film to a desired thickness, a cycle of a process in which the unit layer is formed may be repeatedly performed. When a desired thickness of the deposited film is obtained, the semiconductor substrate 100 in which the deposited film is formed may be unloaded from the process chamber 10.

Examples of the method of fabricating a semiconductor device in accordance with some embodiments of the inventive concept will be described with reference to FIGS. 10 to 21, together with FIGS. 1 and 8.

Figure 10:
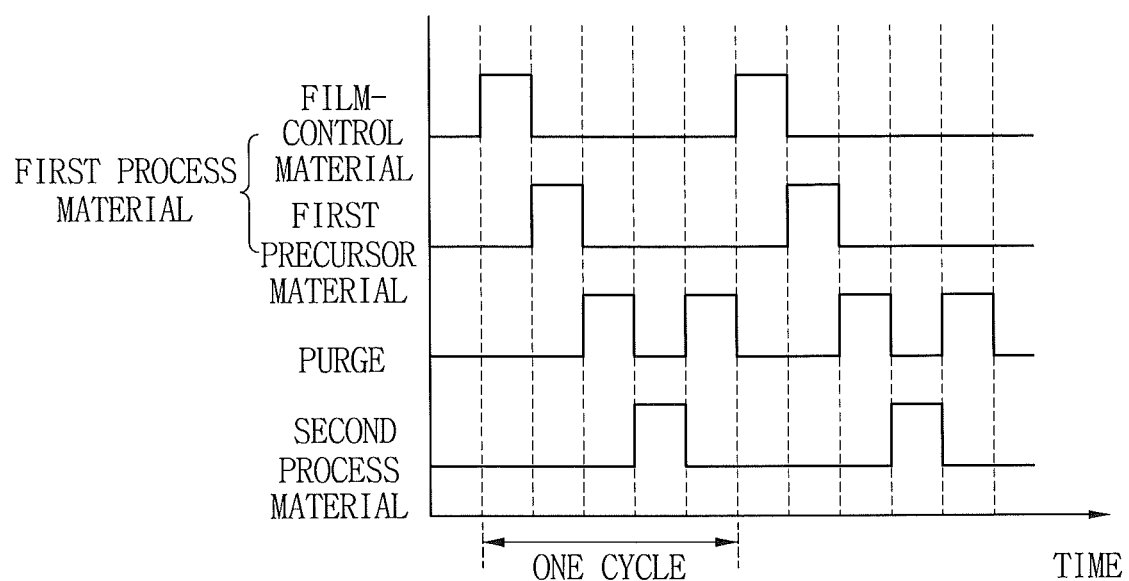
FIG. 10 is a gas-pulsing diagram describing an example of a method of fabricating a semiconductor device in accordance with some embodiments of the inventive concept.
Figure 11:
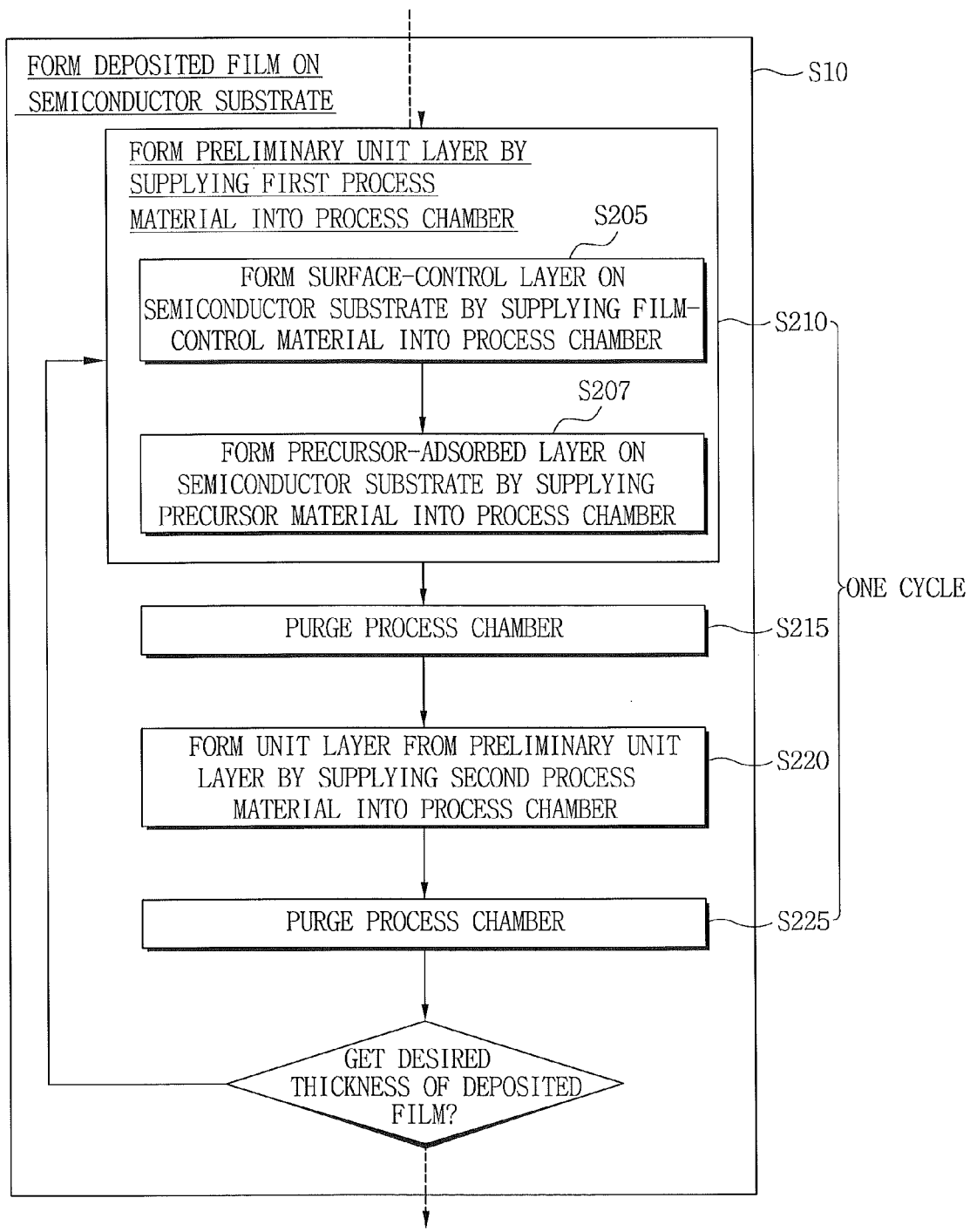
FIG. 11 is a process flowchart showing a method of fabricating a semiconductor device in accordance with some embodiments of the inventive concept.
Figure 13:
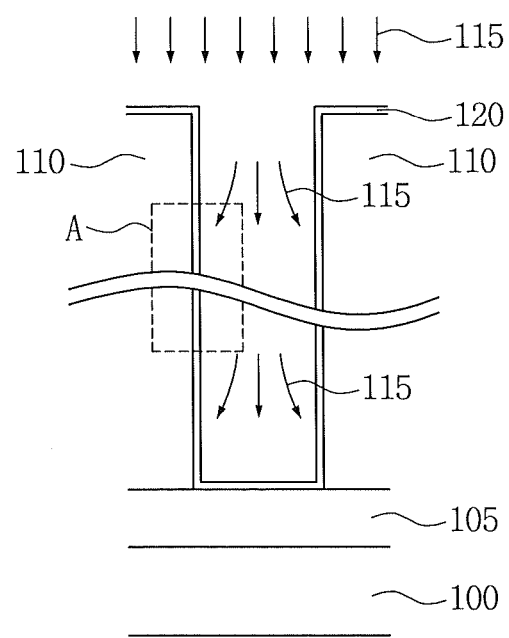
Figure 14A:
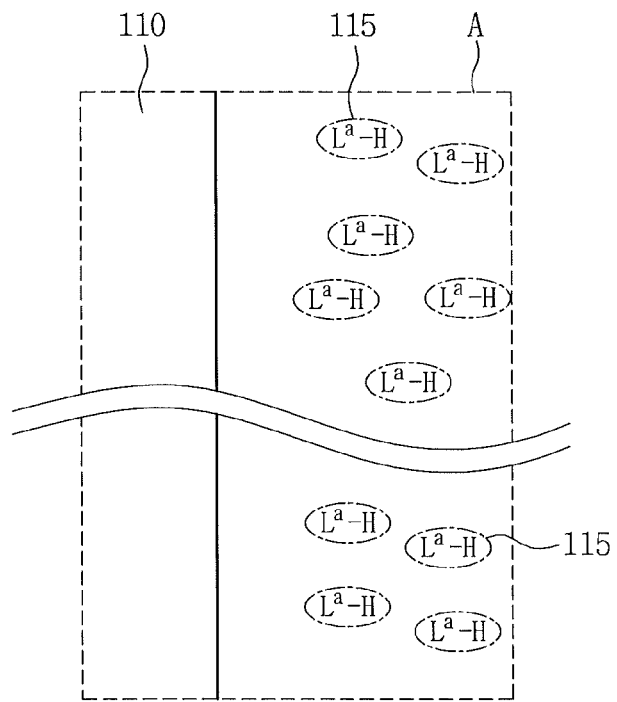
Figure 14B:
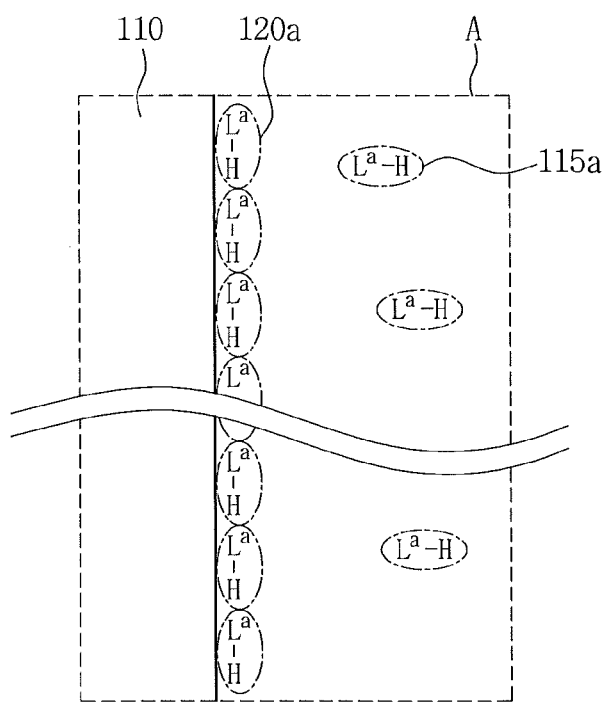
Figure 15:
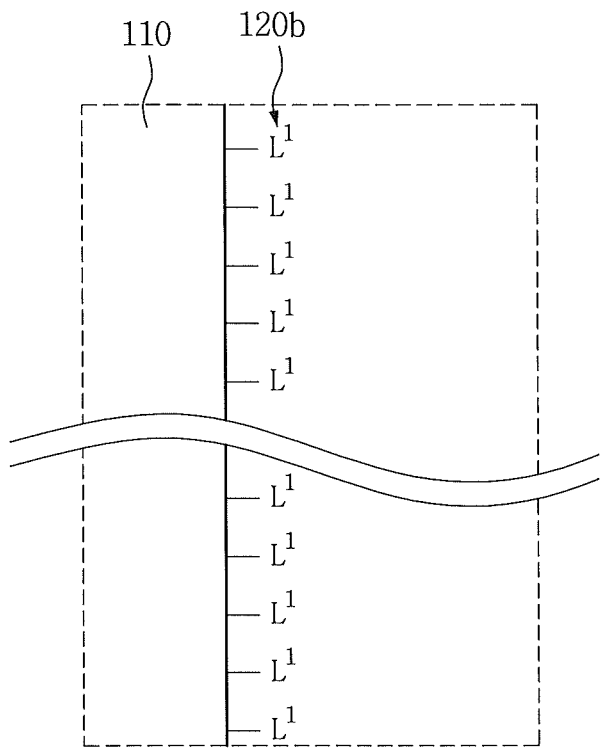
Figure 16:
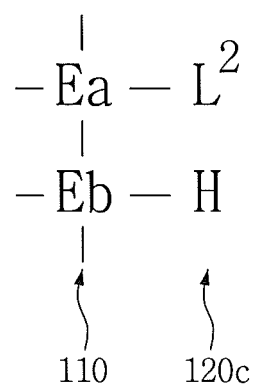
Figure 17:
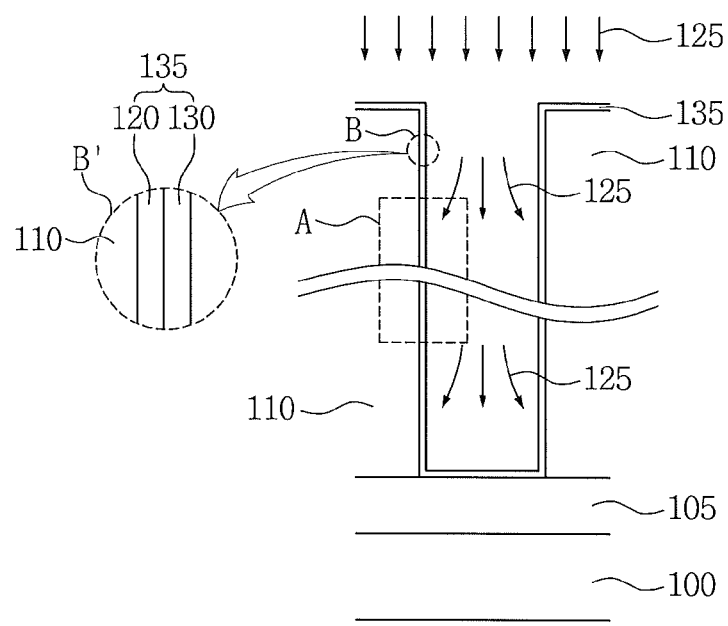
Figure 20:
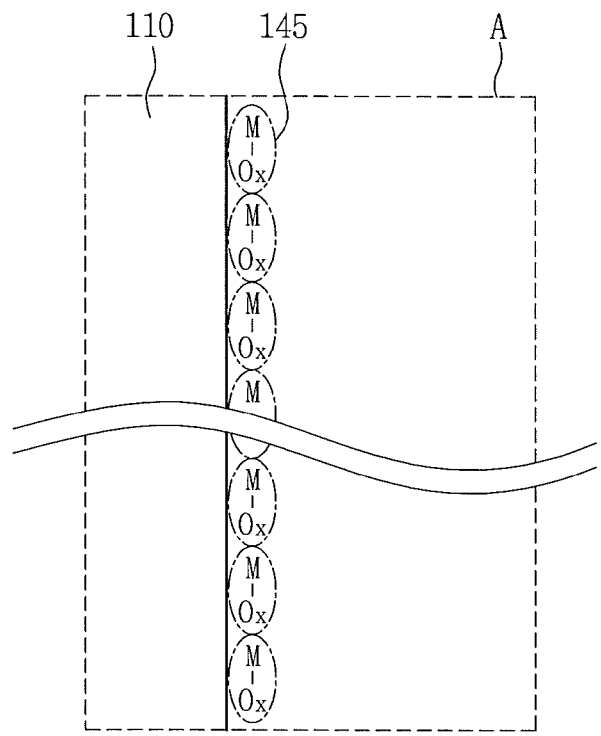

FIG. 10 is a gas-pulsing diagram showing an example method of fabricating a semiconductor device in accordance with some embodiments of the inventive concept, FIG. 11 is a process flowchart showing an example method of fabricating a semiconductor device in accordance with some embodiments of the inventive concept, and FIGS. 12 to 21 are views showing examples of the method of fabricating a semiconductor device in accordance with some embodiments of the inventive concept. In FIGS. 12 to 21, FIGS. 12, 13, 17, 19, and 21 are cross-sectional views showing examples of the method of fabricating a semiconductor device in accordance with some embodiments of the inventive concept. FIGS. 14A and 14B are enlarged views of part A in FIG. 13, for describing an example of the method of forming a surface control layer, FIG. 15 is an enlarged view of part A in FIG. 13, for describing another example of the method of forming a surface control layer, and FIG. 16 is a view describing still another example of the method of forming a surface control layer. FIGS. 18A and 18B are enlarged views of part A in FIG. 17, and FIG. 20 is an enlarged view of part A in FIG. 19.

Figure 12:
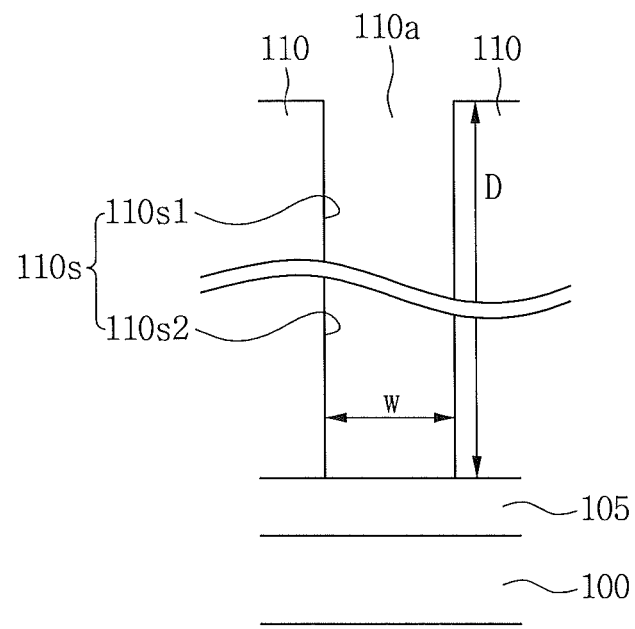
FIGS. 12 to 21 are diagrams showing examples of a method of fabricating a semiconductor device in accordance with some embodiments of the inventive concept.

First, referring to FIGS. 1 and 12, a semiconductor substrate 100 may be provided. The semiconductor substrate 100 may, for example, be a silicon substrate or a silicon wafer, although the present inventive concept is not limited thereto. An under layer 105 may be formed on the semiconductor substrate 100.

A structure 110 may be formed on the semiconductor substrate 100 having the under layer 105 (S1). The structure 110 may have a side 110s including a vertical portion. The side 110s of the structure 110 may be vertical, although in some embodiments the sides 110s of the structure 110 may be oblique. The side 110s of the structure 110 may include an upper side part 110s1 and a lower side part 110s2 located below the upper side part 110s1. An opening 110a may be formed through the structure 110. The opening 110a may be bounded by the side 110s of the structure 110. The opening 110a may have a depth D greater than a width W.

Referring to FIGS. 1, 8, and 12, the semiconductor substrate 100 having the structure 110 may be loaded in the process chamber 10 of the semiconductor apparatus 1 (S5).

Referring to FIGS. 1, 8, 10, 11, and 13, a surface control layer 120 may be formed on the semiconductor substrate 100 having the structure 110 by supplying a film-control material 115 into the process chamber 10 in which the semiconductor substrate 100 is located (S205).

The film-control material 115 may be supplied from the first process material supply apparatus 20 into the process chamber 10. The first process material supply apparatus 20 may be one of the process material supply systems 20a, 20b, and 20c described in FIGS. 2, 3, and 4. Accordingly, the film-control material 115 may be the same material as the film-control material 14 supplied from one of the process material supply systems 20a, 20b, and 20c described in FIGS. 2, 3, and 4. Since the kinds of the film-control materials 14 and 115 have been already described with reference to FIG. 2, detailed description thereof will be omitted to avoid duplicate description.

The film-control material 115 may be supplied into the process chamber 10 together with an inert gas, such as argon. The inert gas may function to move the film-control material 115 from a film-control material supply apparatus to the process chamber 10.

An example of the method of forming the surface control layer 120 will be described with reference to FIGS. 14A and 14B together with FIG. 8. FIGS. 14A and 14B are enlarged views of part A in FIG. 13

Referring to FIGS. 8, 13, and 14A, the film-control material 115 may be supplied into the process chamber 10 in which a semiconductor substrate 100 having the structure 110 is located. The film-control material 115 may be the same material as the film-control material 14 described in FIG. 2. For example, the film-control material 115 may be one of the examples of the film-control materials 14 described in FIG. 2, for example, a ligand-hydrogen compound represented by $L^{a}$-H. Here, $L^{a}$ may be a ligand capable of being bonded with a central atom of a precursor material that forms a deposited film, and H may be hydrogen.

Referring to FIGS. 8, 13, and 14B, the film-control material 115 supplied into the process chamber 10 may be adsorbed onto the semiconductor substrate having the structure 110 in a $L^{a}$-H molecular state of the ligand-hydrogen compound, to form a first surface control layer 120a. The first surface control layer 120a may be formed by the film-control material 115 being adsorbed onto a surface of the semiconductor substrate 100 having the structure 110 in a $L^{a}$-H molecular state. In an empty space of the process chamber 10 in which the semiconductor substrate 100 having the first surface control layer 120a is located, an amount of the film-control material 115a that was not adsorbed to form the first surface control layer 120a may remain.

Another example of the method of forming the surface control layer 120 will be described with reference to FIG. 15.

Referring to FIG. 15, the film-control material 115 may be supplied into the process chamber 10 in a form of ligand ($L^{1}$)-hydrogen (H) compound represented by $L^{1}$-H. A second surface control layer 120b may be formed by the ligand ($L^{1}$) of the film-control material 115 being bonded to the surface of the semiconductor substrate 100 having the structure 110. The hydrogen (H) of the film-control material 115 may become separated from the ligand ($L^{1}$) while the ligand ($L^{1}$) of the film-control material 115 is bonded to a surface of the structure 110. Accordingly, the second surface control layer 120b may be formed of the ligand ($L^{1}$) of the film-control material 115.

Still another example of the method of forming the surface control layer 120 will be described with reference to FIG. 16. FIG. 16 is a view showing a part of a surface of the structure 110 and the surface control layer 120C.

Referring to FIG. 16, the film-control material 115 may be supplied into the process chamber 10 in a form of a ligand ($L^{2}$)-hydrogen (H) compound represented by $L^{2}$-H. A third surface control layer 120 may be formed by the film-control material 115 being chemically adsorbed onto the surface of the semiconductor substrate 100 having the structure 110. For example, the surface of the structure 110 may be formed by bonding a first atom (Ea) and a second atom (Eb). In addition, the ligand ($L^{2}$) of the film-control material 115 may be chemically bonded to the first atom (Ea) of the structure 110, and the hydrogen (H) of the film-control material 115 may be bonded to the second atom (Eb) of the structure 110, therefore, to form the third surface control layer 120. For example, while the ligand ($L^2$) of the ligand ($L^2$)-hydrogen (H) compound of the film-control material 115 is physically bonded to the first atom (Ea) of the structure 110, a bond between the ligand ($L^2$) and the hydrogen (H) of the ligand ($L^2$)-hydrogen (H) compound may be broken. In the ligand ($L^2$)-hydrogen (H) compound, the hydrogen (H) of which a molecular bond to the ligand ($L^2$) is broken may be bonded to the second atom (Eb).

When the surface of the structure 110 is a metal oxide, the first atom (Ea) may be a metal atom, and the second atom (Eb) may be an oxygen atom. In the ligand ($L^2$)-hydrogen (H) compound of the film-control material 115, while the bond between the ligand ($L^2$) and the hydrogen (H) is broken, the ligand ($L^2$) of which the bond to the hydrogen (H) is broken may be chemically bonded to the first atom (Ea), a metal atom, and the hydrogen (H) of which the bond to the ligand ($L^2$) is broken may be bonded to the second atom (Eb), an oxygen atom.

When the surface of the structure 110 is a metal nitride, the first atom (Ea) may be a metal atom such as titanium, and the second atom (Eb) may be nitrogen. For example, in the ligand ($L^2$)-hydrogen (H) compound of the film-control material 115, while the bond between the ligand ($L^2$) and the hydrogen (H) is broken, the ligand ($L^2$) of which the bond to the hydrogen (H) is broken may be chemically bonded to the first atom (Ea), a metal atom, and the hydrogen (H) of which the bond to the ligand ($L^2$) is broken may be bonded to the second atom (Eb), a nitrogen atom.

In the first to third surface control layers 120a, 120b, and 120c, the terms first, second, and third may be used herein to describe the surface control layer 120 formed by various examples of the method of fabricating a semiconductor device in accordance with embodiments of the inventive concept, and the inventive concept should not be limited by these terms. For example, the surface control layer 120 may be formed of any of the first to third surface control layers 120a, 120b, and 120c shown in FIGS. 14B, 15, and 16.

Referring to FIGS. 1, 8, 10, 11, and 17, a precursor-adsorbed layer 130 may be formed on the semiconductor substrate 100 having the surface control layer 120 by supplying a first precursor material 125 into the process chamber 10 in which the semiconductor substrate 100 having the surface control layer 120 is located (S207).

The first precursor material 125 may be supplied into the process chamber 10 together with an inert gas such as argon, etc. The inert gas may function to move the first precursor material 125 from a precursor supply apparatus into the process chamber 10.

The first precursor material 125 may be supplied from the first process material supply apparatus 20 into the process chamber 10. The first process material supply apparatus 20 may be one of the process material supply systems 20a, 20b, and 20c described in FIGS. 2, 3, and 4. Accordingly, the first precursor material 125 may be the same material as the precursor material 16 supplied from one of the process material supply systems 20a, 20b, and 20c. Since the kinds of these precursor materials 16 and 125 have been already described with reference to FIG. 2, detailed description will be omitted to avoid duplicate description.

The precursor-adsorbed layer 130 may be formed by the first precursor material 125 being physically adsorbed onto the surface control layer 120. The precursor-adsorbed layer 130 may be physically adsorbed (or bonded) to the surface control layer 120.

The surface control layer 120 and the precursor-adsorbed layer 130 may together provide a preliminary unit layer 135. Accordingly, the preliminary unit layer 135 may be formed by supplying a first process material including the film-control material 115 and the first precursor material 125 into the process chamber 10 (S210). In FIG. 17, as shown in an enlarged view B' of part B at which the preliminary unit layer 135 is disposed, the preliminary unit layer 135 may include the surface control layer 120 and the precursor-adsorbed layer 130 physically bonded to the surface control layer 120.

Figure 18A:
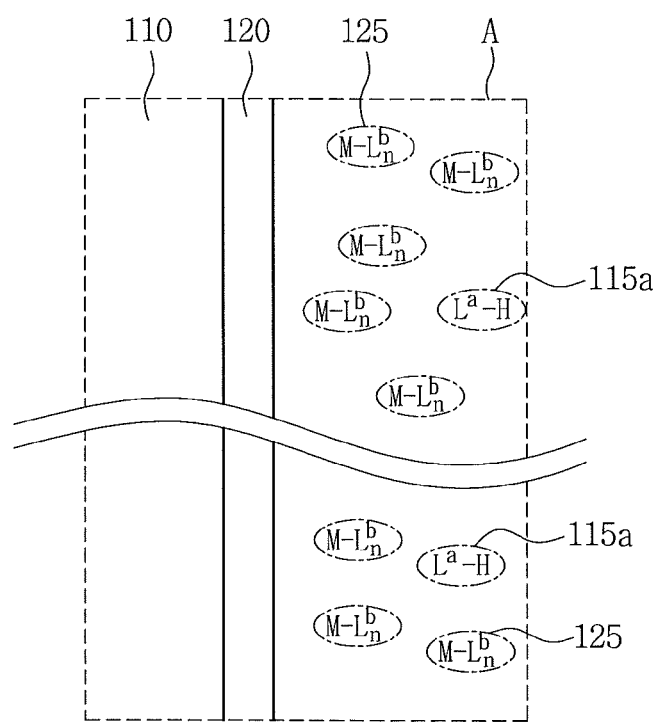
Figure 18B:
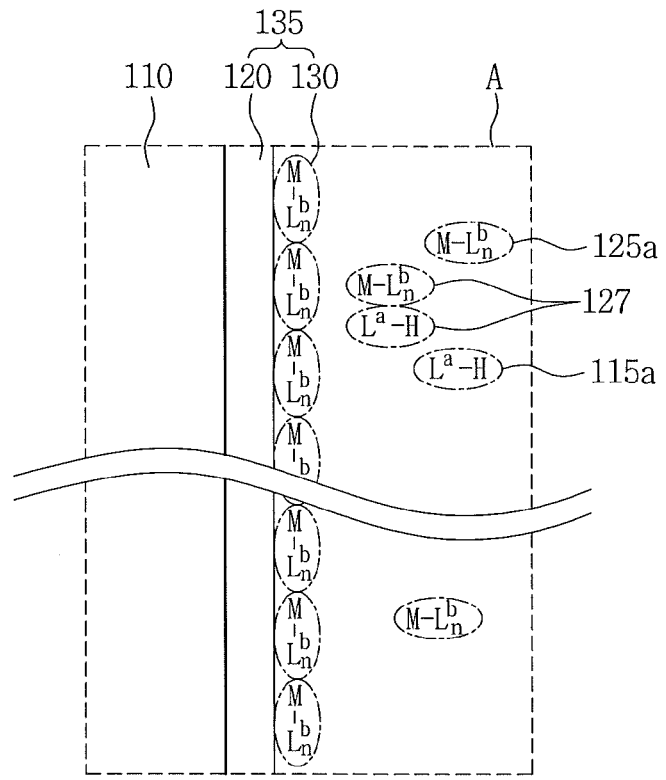
Figure 19:
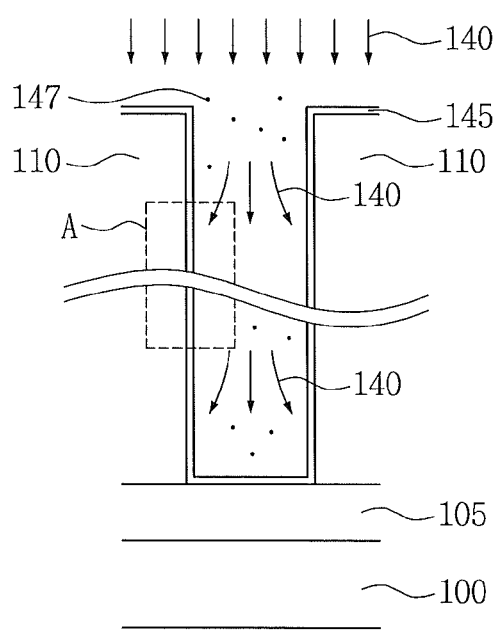

An example of the method of forming the precursor-adsorbed layer 130 will be described with reference to FIGS. 18A and 18B together with FIG. 8. FIGS. 18A and 18B are enlarged views of part A in FIG. 17.

Referring to FIGS. 8, 17, and 18A, the first precursor material 125 may be supplied into the process chamber 10 in which the semiconductor substrate 100 having the surface control layer 120 is located. The first precursor material 125 may be supplied into the process chamber 10 after the supply of the film-control material 115 stops.

The first precursor material 125 may be the same material as the precursor material 16 described in connection with FIG. 2. For example, the first precursor material 125 may be one of examples of the precursor material 16 described in connection with FIG. 2, for example, a material represented by $ML^b_n$. Here, M may be a central atom of the first precursor material 125, and $L^b$ may be a ligand bonded to the central atom M.

Since the film-control material 115 and the first precursor material 125 may be formed of the same materials as the film-control material 14 and the precursor material 16 described in FIG. 2, detailed description thereof will be omitted.

Referring to FIGS. 8, 17, and 18B, the first precursor material 125 supplied into the process chamber 10 may form a precursor-adsorbed layer 130 by being adsorbed onto a surface of the surface control layer 120. The surface control layer 120 may be formed on a surface of the structure 110 to prevent the first precursor material 125 from being chemically adsorbed onto the surface of the structure. The first precursor material 125 may be physically adsorbed onto the surface control layer 120.

In some embodiments, the surface control layer 120 may be one of the first to third surface control layers 120a, 120b, and 120c described in FIGS. 14B, 15, and 16.

Meanwhile, some amounts 125a of the first precursor material 125 supplied into the process chamber 10 may remain in the process chamber 10 without being adsorbed onto the surface control layer 120. In addition, some amounts 115a of the film-control material 115 may remain in the process chamber 10 together with the remaining first precursor material 125a. Accordingly, a preliminary unit layer 135 including the surface control layer 120 and the precursor-adsorbed layer 130 may be formed by supplying the first process material including the film-control material 115 and the first precursor material 125 into the process chamber 10 (S210).

During the supply of the first precursor material 125 into the process chamber 10, the remaining film-control material 115a in the process chamber 10 may be bonded to an over-adsorbed first precursor material and/or an intermolecularly bonded first precursor material to form a compound 127. For example, when molecules of the first precursor material 125 supplied into the process chamber 10 form a cluster by forming weak coordinate bonds, the remaining film-control material 115a in the process chamber 10 may break the weak coordinate bonds between the molecules of the first precursor material 125 to form strong coordinate bonds with the molecules of the first precursor material 125. Here, the terms "weak" and "strong" in the expressions "weak coordinate bonds" and "strong coordinate bond" may be terms to describe a relative relationship between the coordinate bonds. For example, it may be understood that the coordinate bonds between the first precursor material 125 and the film-control material 115a is stronger than the coordinate bonds between the molecules of the first precursor material 125.

The compound 127 may be defined as a second precursor material that forms a deposited film. The compound, that is, the second precursor material 127, may be moved to a lower region of the opening 110a to be adsorbed onto a surface of the substrate located in the lower region of the opening 110a. Accordingly, in the lower region of the opening 110a, the preliminary unit layer 135 may be formed in a process atmosphere in which the first precursor material 125, the second precursor material 127, and some remaining film-control material 115a co-exist.

Referring to FIGS. 1, 8, 10, 11, and 19, the process chamber 10 in which the semiconductor substrate 100 having the preliminary unit layer 135 is located may be purged (S215). Next, a second process material 140 may be supplied into the process chamber 10 to form a unit layer 145 on the semiconductor substrate 100 having the preliminary unit layer 135 (S220).

When the unit layer 145 is formed from the preliminary unit layer 135, the ligand of the precursor-adsorbed layer 130 and the film-control material of the surface control layer 120 which provide the preliminary unit layer 135 may be separated from the preliminary unit layer 135 to form a residual product 147.

The second process material 140 may include an oxidizer, a nitrating agent, or a reductant. The oxidizer may be an oxygen precursor, and the nitrating agent may be a nitrogen precursor. The second process material 140 may be an oxidizer including ozone ($O_3$), oxygen ($O_2$), water vapor ($H_2O$), ozone plasma, or oxygen plasma. Otherwise, the second process material 140 may be a nitrating agent including ammonia ($NH_3$), nitrogen dioxide ($NO_2$), or dinitrogen monoxide ($N_2O$). In contrast, the process material 140 may be a reductant which functions to remove a ligand bonded to a metal atom in a metal precursor such as a tungsten precursor or a ruthenium precursor, adsorbed onto a surface of the semiconductor substrate, so that only the metal atom, such as the tungsten atom or the ruthenium atom, remains on the surface of the semiconductor substrate to form a tungsten layer or a ruthenium layer.

When the second process material 140 is an oxidizer such as ozone, the unit layer 145 may be an oxide in which a central atom of the first precursor material 125 is bonded to oxygen. For example, when the central atom of the first precursor material 125 is a metal such as zirconium, titanium, or ruthenium, the unit layer 145 may be a metal oxide such as zirconium oxide, titanium oxide, or ruthenium oxide.

When the second process material 140 is a nitrating agent, the unit layer 145 may be a nitride in which a central atom of the first precursor material 125 is bonded to nitrogen. For example, when the central atom of the first precursor material 125 is a metal such as tungsten or titanium, the unit layer 145 may be a metal nitride such as tungsten nitride or titanium nitride.

When the second process material 140 is a reductant, the unit layer 145 may be a metal layer formed of the central atom of the first precursor material 125. For example, when the central atom of the first precursor material 125 is a metal such as tungsten, ruthenium, or titanium, the unit layer 145 may be formed of a metal layer such as a tungsten layer, a ruthenium layer, or a titanium layer.

The preliminary unit layer 135 may react with the second process material 140 to form the unit layer 145. The unit layer 145 may be formed of one of an oxide, a nitride, or a metal. In addition, the unit layer 145 may be a single metal layer, a binary metal oxide, or a binary metal nitride. Further, the unit layer 145 may be a multi-component material layer including at least three elements. For example, when the second process material 140 is an oxidizer such as ozone, as shown in FIG. 20, the unit layer 145 may be an oxide represented by $MO_x$. Here, M may be a central atom of the first precursor material 125, O may be an oxygen atom, and x may be a positive number determined depending on the kind of the central atom. For example, when the central atom is a metal oxide such as $TiO_2$, x may be two.

Figure 21:
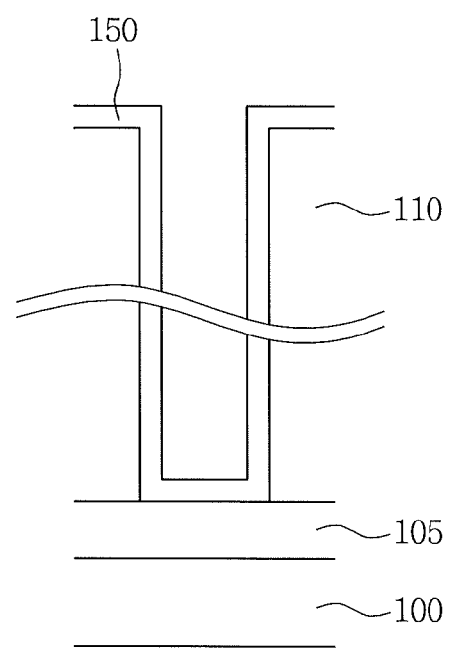

Referring to FIG. 21, in order to remove the residual products 147 generated while forming the unit layer 145, the process chamber 10 may be purged (S225). The residual products 147 may be removed while the process chamber 10 is purged. A desired thickness of a deposited film 150 may be obtained by repeatedly forming the unit layers 145.

The first precursor material 125 and the film-control material 115 may be the same material as the precursor material 16 and the film-control material 14 described in FIG. 2. The kinds of the first precursor material 125, the film-control material 115, and the second process material 140 will be described with examples.

EXAMPLE 1

The first precursor material 125 may be a material represented by $ML_n$, and the film-control material 115 may be a material represented by LH. Here, in the $ML_n$, M may be a central atom, L may be a ligand bonded to the central atom M, and n may be a number determined depending on the central atom M and the ligand L, for example, one of 2 to 6. In the LH of the film-control material 115, L may be the same material as the ligand L of the first precursor material 125. Accordingly, the film-control material 115 may be a hydride of the ligand of the first precursor material 125.

As an example, the first precursor material 125 may be TEMAZ precursor, and the film-control material 115 may be a hydride of a ligand configuring TEMAZ. Here, the chemical formula of TEMAZ may be $Zr[N(CH_3)(CH_2CH_3)]_4$. In the precursor material $Zr[N(CH_3)(CH_2CH_3)]_4$, the central atom may be Zr, and the ligand may be $N(CH_3)(CH_2CH_3)$. The film-control material 115 may be a hydride of the ligand $N(CH_3)(CH_2CH_3)$, ethylmethylamine The chemical formula of ethylmethylamine may be $HN(CH_3)(CH_2CH_3)$.

As another example, the first precursor material 125 may be $Ru(EtCp)_2$, and the film-control material 115 may be a hydride, HEtCp, of a ligand EtCp bonded to a central atom Ru of $Ru(EtCp)_2$.

As still another embodiment, the first precursor material 125 may be $Ti(NMe_2)_4$, and the film-control material 115 may be a hydride, $HNMe_2$, of a ligand $NMe_2$ bonded to a central atom Ti of $Ti(NMe_2)_4$.

EXAMPLE 2

The first precursor material 125 may be a material represented by a chemical formula $M(L^a)_n(L^b)_m$, and the film-control material 115 may be a material represented by a chemical formula $L^aH$ or $L^bH$. In the $M(L^a)_n(L^b)_m$ of the first precursor material 125, M may be a central atom of the precursor material, $L^a$ may be a first ligand bonded to the central atom M, and $L^b$ may be a second ligand bonded to the central atom M and different from the first ligand. The number n may be a positive number determined depending by the central atom M and the first ligand $L^a$, and m may be a positive number determined depending on the central atom M and the second ligand $L^b$.

The film-control material 115 may be a hydride $L^aH$ of the first ligand $L^a$ of the first precursor material 125, or a hydride $L^bH$ of the second ligand $L^b$ of the first precursor material 125. For example, the first precursor material 125 may be $CpZr(N(CH_3)_2)_3$, and the film-control material 115 may be a hydride of a ligand of $CpZr(N(CH_3)_2)_3$. Here, Cp may refer to cyclopentadienyl group. The film-control material 115 may be dimethylamine which is a hydride of the ligand $N(CH_3)_2$ bonded to the central atom Zr of the precursor material $CpZr(N(CH_3)_2)_3$. Here, dimethylamine may be $HN(CH_3)_2$.

EXAMPLE 3

The first precursor material 125 may be $M(L^a)_n(L^b)_m$, and the film-control material 115 may be $L^cH$. Here, the chemical formula $L^cH$ of the film-control material 115 may be a material capable of forming $M(L^c)_x(L^d)_y$. Here, in the chemical formula $M(L^c)_x(L^d)_y$, $L^d$ may be $L^a$ or $L^b$. In addition, $M(L^c)_x(L^d)_y$ may be a material available for the process of forming the deposited film, substituting for the first precursor material 125. Here, n may be a positive number determined depending on a bonding state between the central atom M and the ligand $L^a$, m may be a positive number determined depending on the bonding state between the central atom M and the ligand $L^b$, x may be a positive number determined depending on the bonding state between the central atom M and the ligand $L^c$, and y may be a positive number determined depending on the bonding state between the central atom M and the ligand $L^d$.

As a first example of which the first precursor material 125 is $M(L^a)_n(L^b)_m$ and the film-control material 115 is $L^cH$, the first precursor material 125 may be TEMAZ, and the film-control material 115 may be dimethylamine. The TEMAZ may be $Zr[N(CH_3)(CH_2CH_3)]_4$, and the dimethylamine may be $HN(CH_3)_2$.

As a second example of which the first precursor material 125 is $M(L^a)_n(L^b)_m$ and the film-control material 115 is $L^cH$, the first precursor material 125 may be $CpZr(N(CH_3)_2)_3$, and the film-control material 115 may be ethylmethylamine. The ethylmethylamine may be $HN(CH_3)(CH_2CH_3)$.

EXAMPLE 4

The first precursor material 125 may be $M(L^a)_n(L^b)_m$, and the film-control material 115 may be an alkyl compound of a ligand of the first precursor material 125. For example, the film-control material 115 may be $L^a$-R or $L^b$-R. Here, $L^a$ and $L^b$ may be ligands bonded to the central atom M of the precursor material, and R may be an alkyl compound or an alkyl-based compound such as $CH_3$ or $CH_2CH_3$.

For example, the first precursor material 125 may be TEMAZ or $CpZr(N(CH_3)_2)_3$, and the film-control material 115 may be $NMe_3$ or $NEt_3$, etc. Me may refer to a methyl group, and Et may refer to an ethyl group.

EXAMPLE 5

The first precursor material 125 may be $M(L^a)_n(L^b)_m$, and the film-control material 115 may be $L^cR$. The $L^cR$ may be a material that is bonded to the central atom M of the first precursor material 125 to form another precursor material (for example, $M(L^c)_x(L^d)_y$) different from the first precursor material 125. In the $L^cR$, $L^c$ may be a compound such as $M(L^c)_x(L^d)_y$ which is bonded to the central atom M of the first precursor material 125 to form another precursor $M(L^c)_x(L^d)_y$, and R may be an alkyl compound or an alkyl-based compound such as $CH_3$ or $CH_2CH_3$. Here, the precursor $M(L^c)_x(L^d)_y$ different from the first precursor material 125 may be a material available to substitute for the first precursor material 125.

Another example of the method of fabricating a semiconductor device in accordance with some embodiments of the inventive concept will be described with reference to FIGS. 22 to 29 together with FIGS. 1 and 8.

Figure 22:
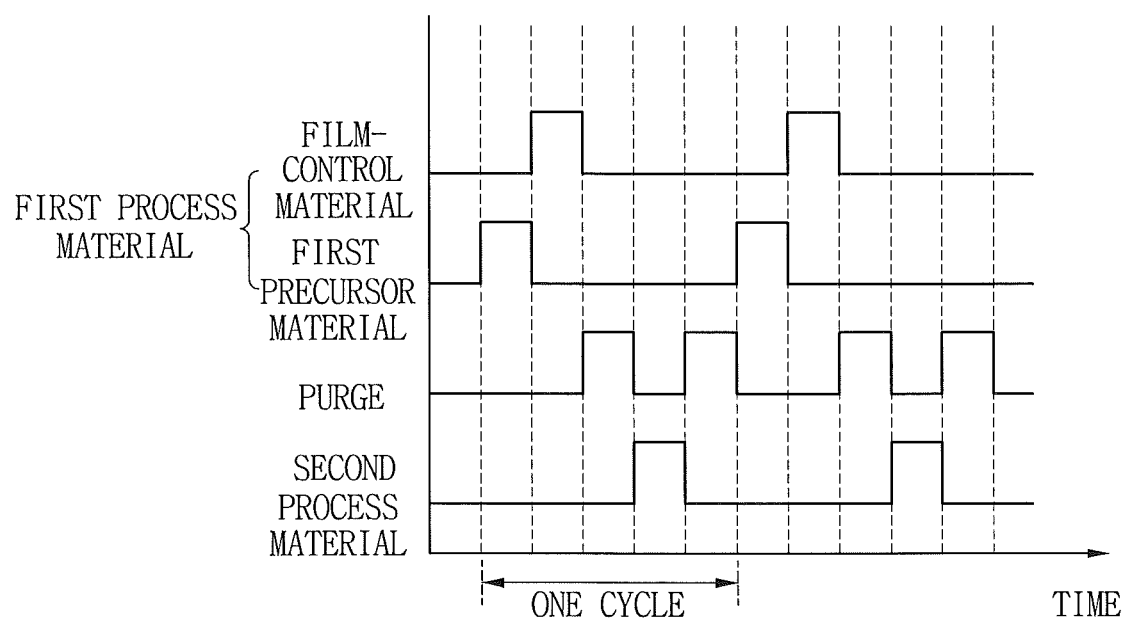
FIG. 22 is a gas-pulsing diagram describing another example of a method of fabricating a semiconductor device in accordance with some embodiments of the inventive concept.
Figure 23:
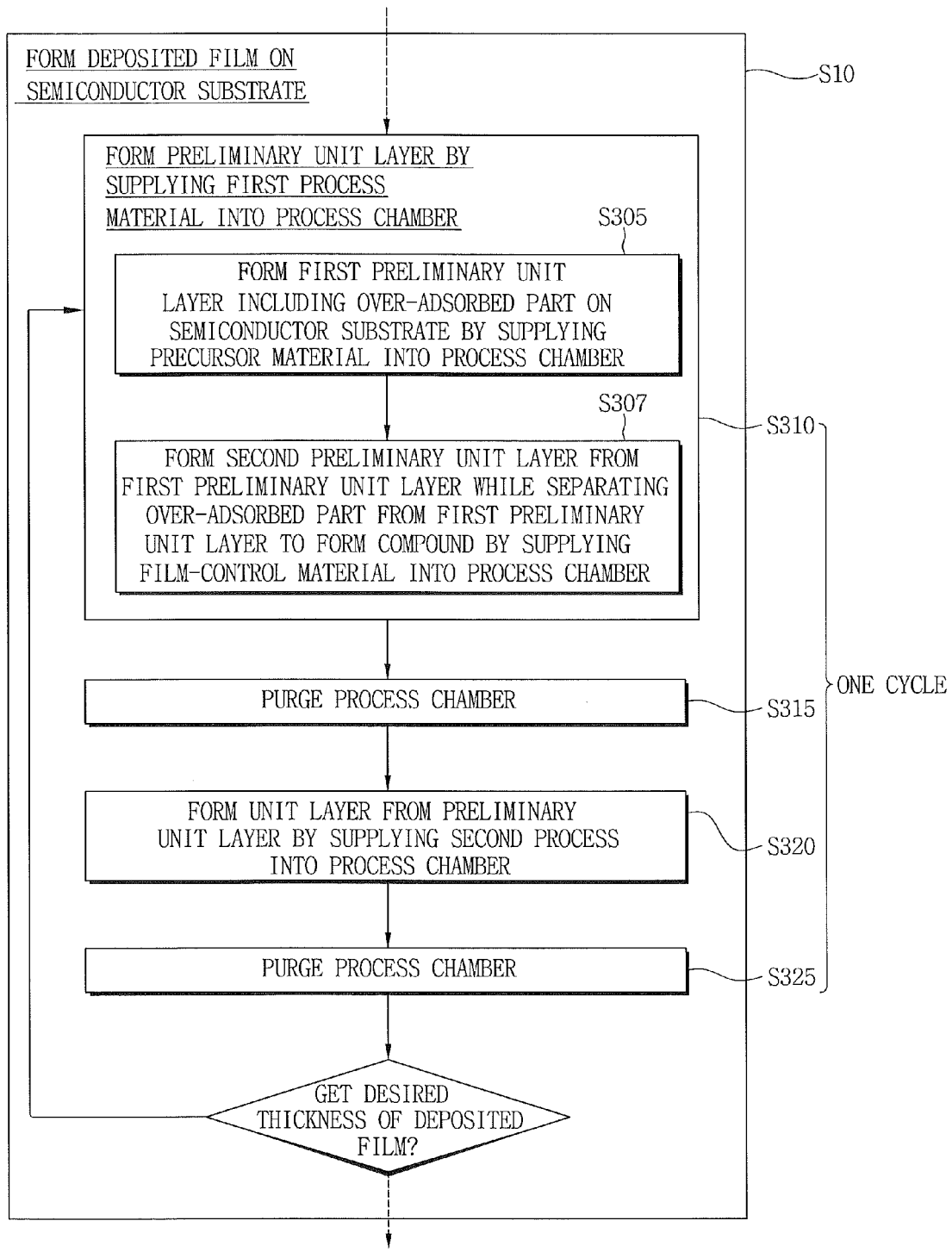
FIG. 23 is a process flowchart showing another example of a method of fabricating a semiconductor device in accordance with some embodiments of the inventive concept.

FIG. 22 is a gas-pulsing diagram showing the other example of the method of fabricating a semiconductor device in accordance with some embodiments of the inventive concept, FIG. 23 is a process flowchart showing the other example of the method of fabricating a semiconductor device in accordance with some embodiments of the inventive concept, and FIGS. 24 to 29 are views showing the other example of the method of fabricating a semiconductor device in accordance with some embodiments of the inventive concept.

Figure 24:
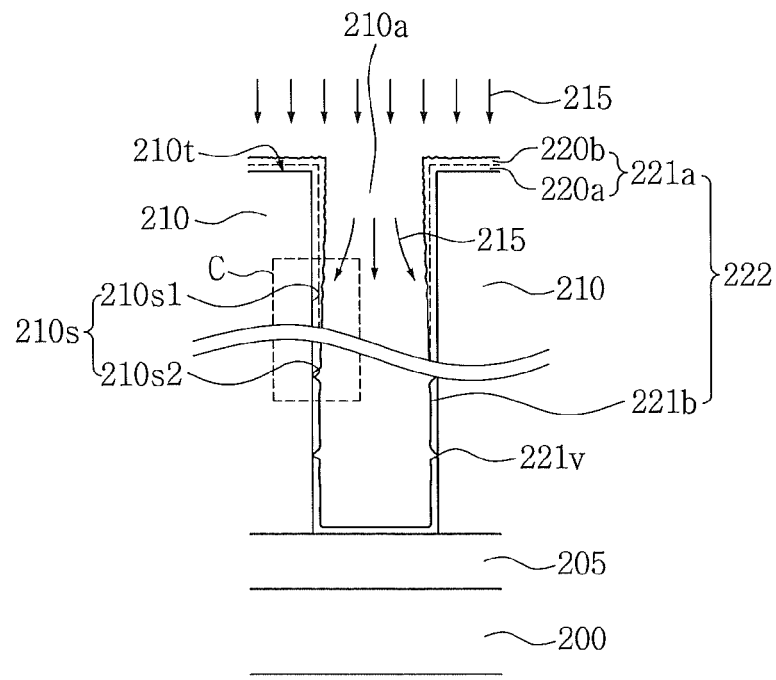
FIGS. 24 to 29 are diagrams showing another example of a method of fabricating a semiconductor device in accordance with some embodiments of the inventive concept.
Figure 25A:
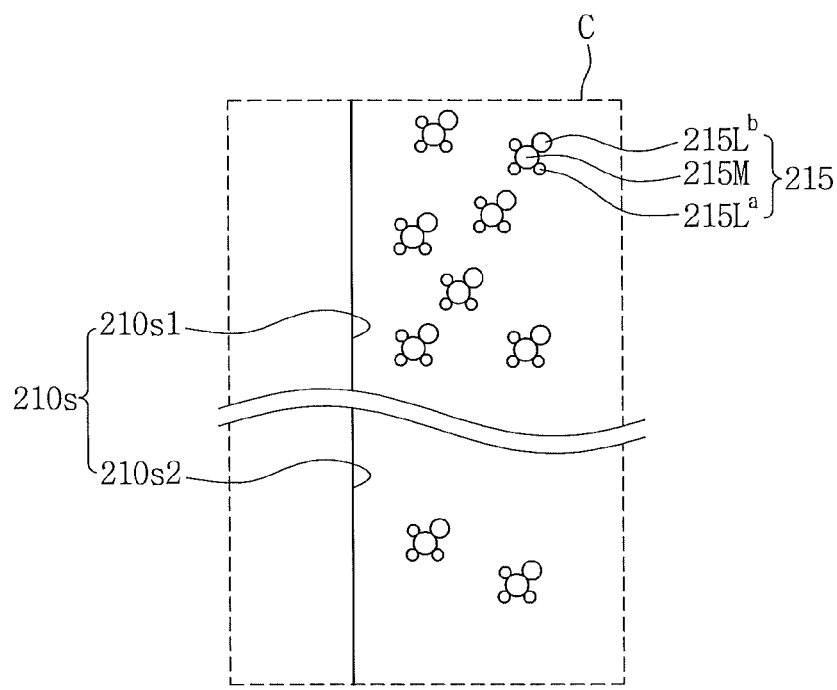
Figure 25B:
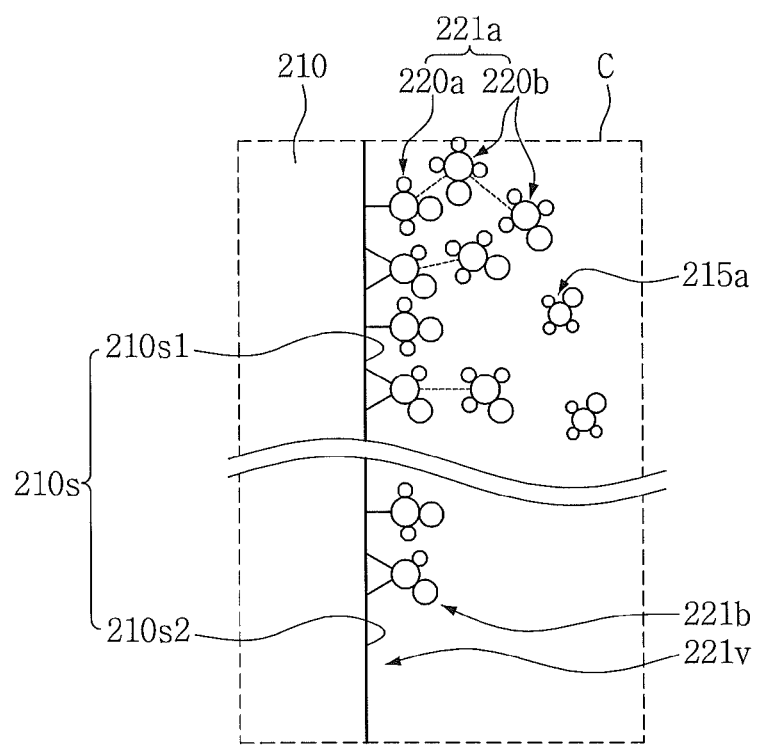
Figure 26:
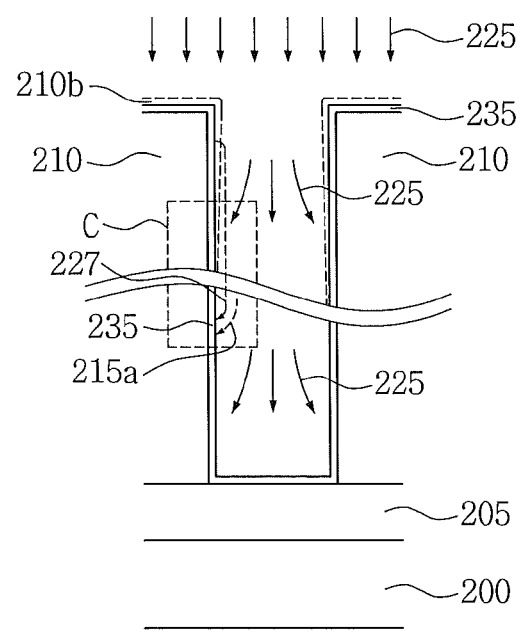
Figure 27A:
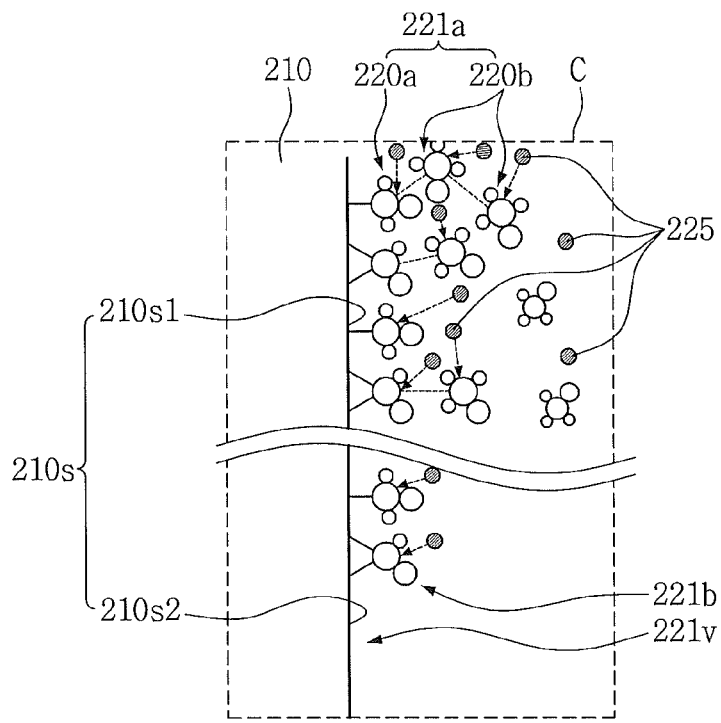
Figure 27B:
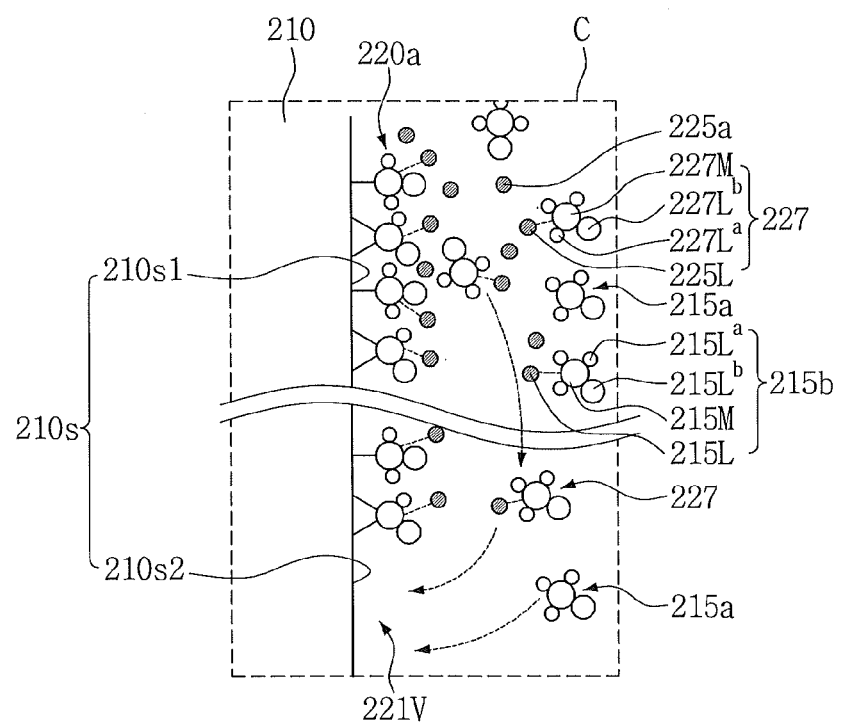
Figure 27C:
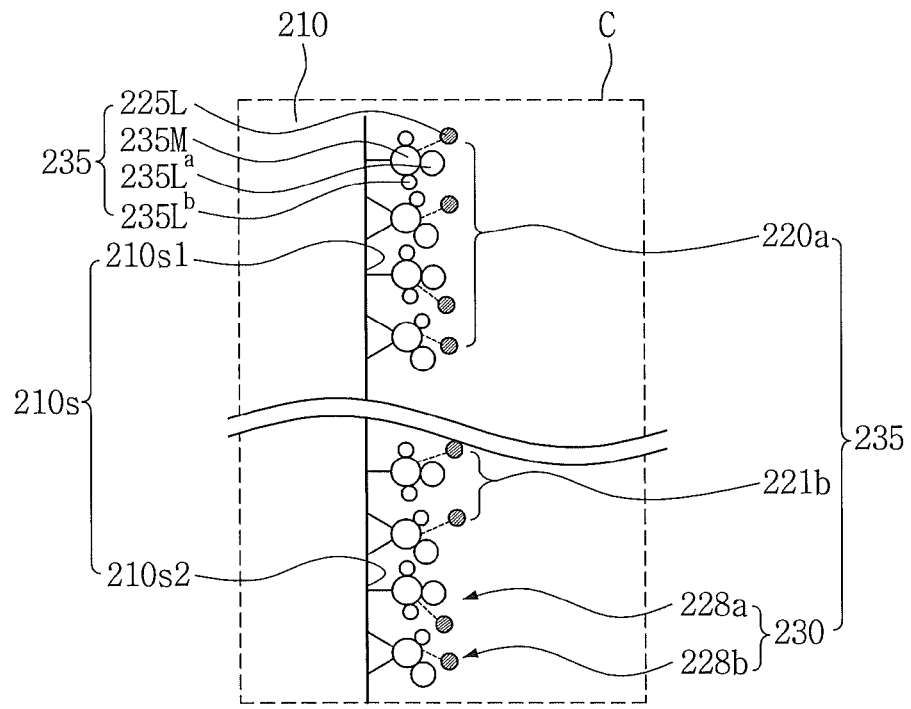
Figure 28:
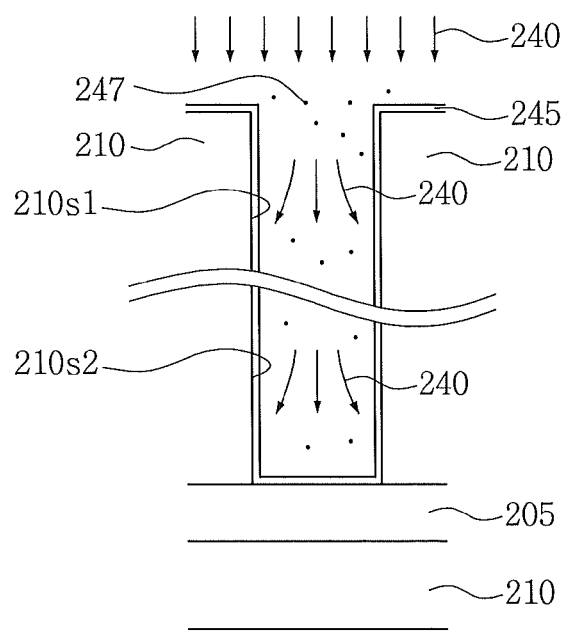
Figure 29:
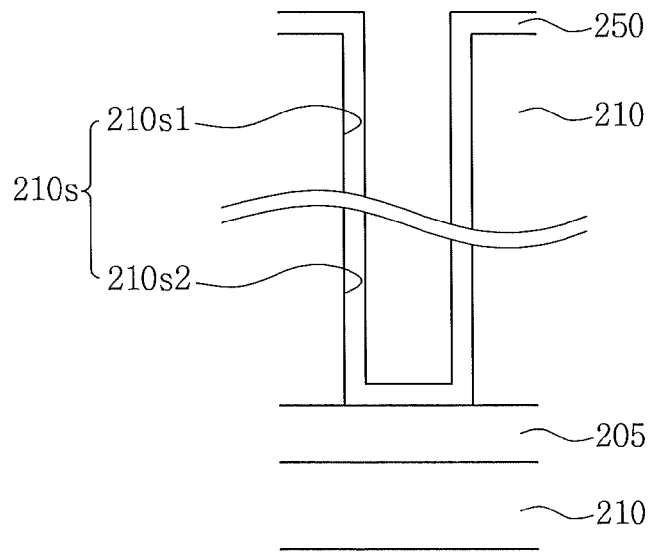

In FIGS. 24 to 29, FIGS. 24, 26, 28, and 29 are cross-sectional views showing the other example of the method of fabricating a semiconductor device in accordance with some embodiments of the inventive concept, FIGS. 25A and 25B are enlarged views of part C in FIG. 24 for describing the other example of the method of fabricating a semiconductor device in accordance with some embodiments of the inventive concept, and FIGS. 27A to 27C are enlarged views of part C in FIG. 26 for describing the other example of the method of fabricating a semiconductor device in accordance with some embodiments of the inventive concept.

First, referring to FIGS. 1, 8, 22, 23, and 24, as described in FIG. 12, an under layer 205 may be formed on a semiconductor substrate 200, and a structure 210 may be sequentially formed on the under layer 205 (S1).

The structure 210 may include a side 210s having an upper side part 210s1 and a lower side part 210s2 located under the upper side part 210s1. The upper side part 210s1 and lower side part 210s2 of the structure 210 may be vertical. An opening 210a may be formed through the structure 110. The opening 210a may be bounded by the side 210s of the structure 210. The opening 210a may have a depth D greater than a width W.

The semiconductor substrate 200 having the structure 210 may be loaded in the process chamber 10 (S5).

A first precursor material 215 may be supplied into the process chamber 10 in which the semiconductor substrate 200 having the structure 210 is located, to form a first preliminary unit layer 222 having an over-adsorbed part 220b on the semiconductor substrate 200 having the structure 210 (S305). The first preliminary unit layer 222 may be formed by the first precursor material 215 being adsorbed on a surface of the semiconductor substrate 200 having the structure 210.

The first preliminary unit layer 222 may be understood as a non-uniform preliminary unit layer. For example, the first preliminary unit layer 222 may include a first part 221a which includes the over-adsorbed part 220b, and a second part 221b which does not include the over-adsorbed part 220b. In the first preliminary unit layer 222, the first part 221a may be thicker than the second part 221b. Accordingly, the first preliminary unit layer 222 may be formed in a layer having a non-uniform thickness.

The first part 221a of the first preliminary unit layer 222 may include a base part 220a and the over-adsorbed part 220b. The base part 220a may be closer to the surface of the semiconductor substrate 200 having the structure 210 than the over-adsorbed part 220b. The over-adsorbed part 220b may be a material bonded to the base part 220a.

The first part 221a of the first preliminary unit layer 222 may be formed in an upper portion of the structure 210, and the second part 221b of the first preliminary unit layer 222 may be formed in a lower portion of the structure 210. The first part 221a of the first preliminary unit layer 222 may be formed in the upper side part 210s1 of the structure 210, and the second part 221b of the first preliminary unit layer 222 may be formed in the lower side part 210s2 of the structure 210.

The first precursor material 215 may be a material stabilized by making an additional bond. For example, the first precursor material 215 may be a material that makes a weak coordinate bond to form a cluster. The first precursor material 215 may be supplied into the process chamber 10 together with a carrier gas which carries the first precursor material 215. The carrier gas may be an inert gas such as argon.

The first precursor material 215 may be supplied from the first process material supply apparatus 20 into the process chamber 10. The first process material supply apparatus 20 may be one of the process material supply systems 20a, 20b, and 20c described in FIGS. 2, 3, and 4. Accordingly, the precursor material 215 may be the same as the precursor material 16 supplied from one of the process material supply systems 20a, 20b, and 20c described in FIGS. 2, 3, and 4.

The first precursor material 215 supplied into the process chamber 10 and the first preliminary unit layer 222 formed from the first precursor material 215 will be described with reference to FIGS. 25A and 25B together with FIGS. 8 and 24. The molecular structure illustrated in FIGS. 25A and 25B is an example so that the inventive concept can be easily understood, and is not intended to limit the inventive concept.

Referring to FIGS. 8, 24, and 25a, the first precursor material 215 supplied into the process chamber 10 may include a central atom 215M and a first ligand 215L$^a$ and second ligand 215L$^b$ which are bonded to the central atom 215M. The first precursor material 215 may be a material represented by M(L$^a$)$_x$(L$^b$)$_y$. The central atom 215M may be M in M(L$^a$)$_x$(L$^b$)$_y$, the first ligand 215L$^a$ may be the first ligand L$^a$ in M(L$^a$)$_x$(L$^b$)$_y$, and the second ligand 215L$^b$ may be the second ligand L$^b$ in M(L$^a$)$_x$(L$^b$)$_y$. The numbers x and y may be numbers determined depending on the kinds of central atom 215M and the first and second ligands 215L$^a$ and 215L$^b$. One of the x and y may be 0 (zero) or a positive number, and the other may be a positive number.

The first precursor material 215 may be a zirconium precursor illustrated in the following <Chemical formula 1>, for example. In the zirconium precursor illustrated in the following <Chemical formula 1> available to be used as the first precursor material 215, the central atom Zr may have 4-coordinated structure.

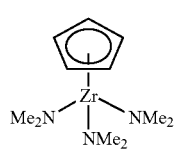

<Chemical formula 1>

Referring to FIGS. 8, 24, and 25B, the first precursor material 215 may be adsorbed onto a surface of the semiconductor substrate 200 having the structure 210 to form a first preliminary unit layer 222. The first preliminary unit layer 222 may include the first part 221a and the second part 221b. The first part 221a of the first preliminary unit layer 222 may include the base part 220a and the over-adsorbed part 220b bonded to the base part 220a.

The over-adsorbed part 220b may form a weak coordinate bond with the base part 220a. An empty region 221v in which the first preliminary unit layer 222 is not formed may exist on the lower side part 210s2 of the structure 210.

The over-adsorbed part 220b may be formed in the upper side part 210s1 of the structure 210, and the empty region 221v in which the first precursor material 215 is not adsorbed may be formed in the lower side part 210s2 of the structure 210. As described in FIG. 22, the over-adsorbed part 220b may be formed in a top surface 210t of the structure 210 as well as in the upper side part 210s1 of the structure 210. Accordingly, the first preliminary unit layer 222 may be formed in a discontinuous layer due to the empty region 221v, and formed in a layer having a non-uniform thickness depending on the location by over-adsorbed part 220b, Meanwhile, the first precursor material 215a that is not adsorbed onto the surface of the semiconductor substrate 200 having the structure 210 may remain in the process chamber 10 in which the semiconductor substrate 200 having the first preliminary unit layer 222 is located.

Referring to FIGS. 1, 8, 22, 23, and 26, a second preliminary unit layer 235 may be formed from the first preliminary unit layer 222 by supplying the film-control material 225 into the process chamber 10 in which the semiconductor substrate 200 having the first preliminary unit layer 222 is located (S307). The second preliminary unit layer 235 may be formed in a relatively uniform layer compared to the first preliminary unit layer 222. The supply of film-control material 225 into the process chamber 10 may start while stopping the supply of the first precursor material 215.

The over-adsorbed part 220b may be bonded to the film-control material 225 to form a first compound 227. The remaining first precursor material 215a in the process chamber 10 may be bonded to the film-control material 225 to form a second compound 215b.

The film-control material 225 may be supplied from the first process material supply apparatus 20 into the process chamber 10. The first process material supply apparatus 20 may be one of the process material supply systems 20a, 20b, and 20c described in FIGS. 2, 3, and 4. Accordingly, the film-control material 225 may be the same material as the film-control material 14 supplied from one of the process material supply systems 20a, 20b, and 20c described in FIGS. 2, 3, and 4. Since the kinds of the film-control materials 14 and 225 have been already described with reference to FIG. 2, the detailed description thereof will be omitted to avoid duplicate description.

A method of forming the second preliminary unit layer 235 from the first preliminary unit layer 222 will be described with reference to FIGS. 27A, 27B, and 27C. FIGS. 27A, 27B, and 27C are schematic diagrams by which the inventive concept can be easily understood, and the inventive concept should not be construed as limited by the molecular structures illustrated in FIGS. 27A, 27B, and 27C. FIGS. 27A, 27B, and 27C may be understood in association with FIGS. 25A and 25B and explanations thereof.

Referring to FIGS. 1, 8, 26, and 27A, the film-control material 225 may be supplied into the process chamber 10 in which the semiconductor substrate having the first preliminary unit layer 222 is located, after the supply of the first precursor material 215 stops. After the supply of the first precursor material 215 into the process chamber 10 stops, the film-control material 225 may be supplied into the process chamber 10 without an additional purging process to the process chamber 10. The film-control material 225 may be a compound capable of breaking the intermolecular bonds in an intermolecularly bonded compound of the first precursor material 215 (e.g., the over-adsorbed part 220b and the intermolecularly bonded first precursor material).

Meanwhile, when the first precursor material 215 supplied into the process chamber 10 is a zirconium precursor as shown in <Chemical formula 1>, molecules of the zirconium precursor may be bonded to each other in order to be in a stable state in the first precursor material 215 of <Chemical formula 1>. Likewise, the over-adsorbed part 220b may be formed in the first part 221a of the first preliminary unit layer 222 by the molecules of the zirconium precursor 215 being bonded to each other. In addition, since the molecules of the zirconium precursor 215 are bonded to each other to form a cluster, the smooth supply of the zirconium precursor 215 into a lower part of opening 210a may be hampered.

The intermolecularly bonded zirconium precursor may have a structure shown in following <Chemical formula 2>. As shown in the following <Chemical formula 2>, the zirconium precursor may form a 6-coordinated structure in order to be in a stable molecular state.

<Chemical formula 2>

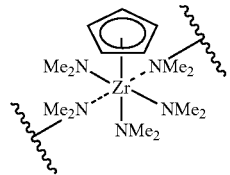

The following <Chemical formula 3> is a chemical formula showing that the film-control material 225 is supplied to the compound of <Chemical formula 2> showing the intermolecularly bonded zirconium precursor. <Chemical formula 3> is a chemical formula showing that the film-control material 225 is supplied to the over-adsorbed part 220b of the non-uniform preliminary unit layer 222. Here, the film-control material 225 may be a hydride (H.N.Me$_2$) of the ligand NMe$_2$ of the compound of <Chemical formula 1>.

<Chemical formula 3>

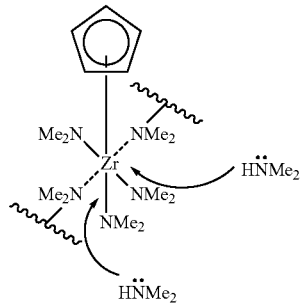

Referring to FIGS. 1, 8, 26, and 27B, the film-control material 225 and the over-adsorbed part 220b may react to form the first compound 227. In addition, the film-control material 225 may react with the remaining first precursor 215a in the process chamber 10 or the intermolecularly bonded first precursor material to form a second compound 215b.

The first compound 227 and the second compound 215b may be compounds having the same kind of central atom as the first precursor material 215, and may be used as a precursor to form a unit layer. Accordingly, the first and second compounds 227 and 215b may be defined as a second precursor material.

The over-adsorbed part 220b may be separated from the base part 220a while reacting with the film-control material 225 to form the first compound 227.

The first compound 227 may include a central atom 227M and one or more ligands 227L$^a$, 227L$^b$, and 225L bonded to the central atom 227M.

In addition, the second compound 215b may be a compound in which the remaining first precursor material 215a in the empty space of the process chamber 10 is bonded to the film-control material 225. Otherwise, the second compound 215b may be a compound in which the film-control material 225 is bonded to the first precursor material while breaking the intermolcular bonds of the intermolcularly bonded first precursor material in the empty space of the process chamber 10. For example, the second compound 215b may include a central atom 215M and ligands 215L$^a$, 215L$^b$, and 225L bonded to the central atom 215M. The film-control material 225 bonded to the first precursor material 215a may be one 225L of the ligands 215L$^a$, 215L$^b$, and 225L of the second compound 215b. Meanwhile, the first precursor material 215 may include a central atom 215M and first and second ligands 215L$^a$ and 215L$^a$ bonded to the first central atom 215M.

The central atom 227M of the first compound 227, the central atom 215M of the second compound 215b, and the atom 215M of the first precursor material 215 may be the same type of element. For example, the central atom 227M of the first compound 227, the central atom 215M of the second compound 215b, and the atom 215M of the first precursor material 215 may be one of Zr, Ti, W, Ru, and Al. However, the inventive concept may not be limited to Zr, Ti, W, Ru, or Al, the examples herein, and the central atom may be a metal atom.

One ligand 225L of the ligands 227L$^a$, 227L$^b$, and 225L of the first compound 227 may be a different ligand from the ligands 215L$^a$ and 215L$^b$ of the precursor material 215, and the other ligands 227L$^a$ and 227L$^b$ may be formed of the same compound as the ligands 215L$^a$ and 215L$^b$ of the precursor material 215.

The first compound 227 may consist of a central atom 227M, a first ligand 227L$^a$, a second ligand 227L$^b$, and a third ligand 225L. The first ligand 227L$^a$, the second ligand 227L$^b$, and the third ligand 225L may be bonded to the central atom 227M.

The central atom 227M, first ligand 227L$^a$, and second ligand 227L$^b$ of the first compound 227 may be the same as the central atom 225M, first ligand 225L$^a$, and second ligand 225L$^b$ of the first precursor material 215, respectively. Further, the third ligand 225L of the first compound 227 may be formed by the film-control material 225 being bonded to the central atom 227M.

The first compound 227 may be a material in a more stable state than the first precursor material 215 by further including the additionally coordinated third ligand 225L compared to the first precursor material 215.

Following <Chemical formula 4> is a chemical formula showing the film-control material 225 which forms a coordinate bond while breaking the bonds between molecules 220a and 220b of the first precursor material 215. <Chemical formula 4> shows an example of the first and second compounds 227 and 215b formed by separating the over-adsorbed part 220b from the base part 220a using the film-control material H.N.Me$_2$. The central atom Zr of these first and second compounds 227 and 215b may have 6-coordinate structure.

<Chemical formula 4>

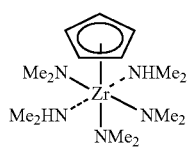

<Chemical formula 1> may represent the first precursor material 215, and <Chemical formula 4> may represent the first and second compounds 227 and 215b.

The first precursor material 215 of <Chemical formula 1> and the first and second compounds 227 and 215b of <Chemical formula 4> may include the same central atom Zr as each other. In addition, the first precursor material 215 of <Chemical formula 1> and the first and second compounds 227 and 215b of <Chemical formula 4> may include the same kind of the central atom Zr and a different ligand from each other. For example, the first and second compounds 227 and 215b of <Chemical formula 4> may include a different ligand NHMe$_2$ from the ligand NMe$_2$ first precursor material 215 of <Chemical formula 1>. The ligand NHMe$_2$ of the first and second compounds 227 and 215b of <Chemical formula 4> may be a hydride of the ligand NMe$_2$ of the first precursor material 215 of <Chemical formula 1>.

The first and second compounds 227 and 215b, that is, a second precursor material may be moved to the empty region 221v of the lower side part 210s2 of the structure 210 together with the remaining first precursor material 215a.

Referring to FIGS. 8, 26, and 27C, the first and second compounds 227 and 215b may be moved to the empty region 221v of the lower side part 210s2 of the structure 210 to be adsorbed onto the empty region 221v of the lower side part 210s2. An adsorbed region 228a in which the first compound 227 is adsorbed onto a surface of the structure 210 exposed by the empty region 221v and/or an adsorbed region 228b in which the second compound 215b is adsorbed onto a surface of the structure 210 exposed by the empty region 221v, may be formed.

The adsorbed regions 228a and 228b in which the first and second compounds 227 and 215b is adsorbed onto the surface of the structure 210 exposed by the empty region 221v, may form the continuous second preliminary unit layer 235 from the discontinuous first preliminary unit layer 222

In addition, since the over-adsorbed part 220b is separated and removed while the first compound 227 is formed, a second preliminary unit layer 235 having a uniform thickness may be formed from the first preliminary unit layer 222. Accordingly, although the first preliminary unit layer 222 is formed to have a non-uniform thickness, the second preliminary unit layer 235 may be formed to have a substantially uniform thickness compared to the first preliminary unit layer 222.

The first preliminary unit layer 222 may be formed by the first precursor material 215 being adsorbed onto a substrate having the structure 210, and the second preliminary unit layer 235 may be formed of a material formed by the additionally coordinated first precursor material 215 and film-control material 225. Accordingly, the second preliminary unit layer 235 may further include the film-control material 225, compared to the first preliminary unit layer 222. The second preliminary unit layer 235 may include the central atom 235M and two or more ligands 235L$^a$, 235L$^b$, and 225L bonded to the central atom 235M. Here, one of the two or more ligands 235L$^a$, 235L$^b$, and 225L may be formed by the film-control material 225 being bonded to the central atoms 235M.

Referring to FIGS. 1, 8, 22, 23, and 28, the process chamber 10 in which the semiconductor substrate 200 having the second preliminary unit layer 235 is located may be purged (S315).

A unit layer 245 may be formed from the second preliminary unit layer 235 by supplying a second process material 240 into the purged process chamber 10 (S320). A residual product 247 may be formed while forming the unit layer 245 from the second preliminary unit layer 235. The unit layer 245 may be formed by the second process material 240 reacting with a central atom of the second preliminary unit layer 235. Accordingly, materials other than the central atom of the second preliminary unit layer 235, for example, the ligand of the precursor material 215 and the film-control material 225 which configure the second preliminary unit layer 235, may be separated from the second preliminary unit layer 235 to form the residual product 247.

The second process material 240 may be supplied from the second process material supply apparatus 80 into the process chamber 10, as described in FIG. 8. When the unit layer 245 is a metal oxide, the second process material 240 may be an oxidizer including ozone (O$_3$), oxygen (O$_2$), water vapor (H$_2$O), ozone plasma, or oxygen plasma. For example, the unit layer 245 may be a metal oxide such as a titanium oxide, a zirconium oxide, or a ruthenium oxide. When the unit layer 245 is a metal nitride such as a titanium nitride, the second process material 240 may be a reaction gas such as ammonia (NH$_3$), nitrogen dioxide (NO$_2$), or nitrogen oxide (N$_2$O).

Referring to FIGS. 1, 8, 22, 23, and 29, the process chamber 10 in which the semiconductor substrate 200 having the unit layer 245 is located may be purged (S315). While purging the process chamber 10, the residual product 247 may be released out of the process chamber 10 and removed. A desired thickness of a deposited film 250 may be formed by repeatedly forming the unit layers 245.

Figure 30:
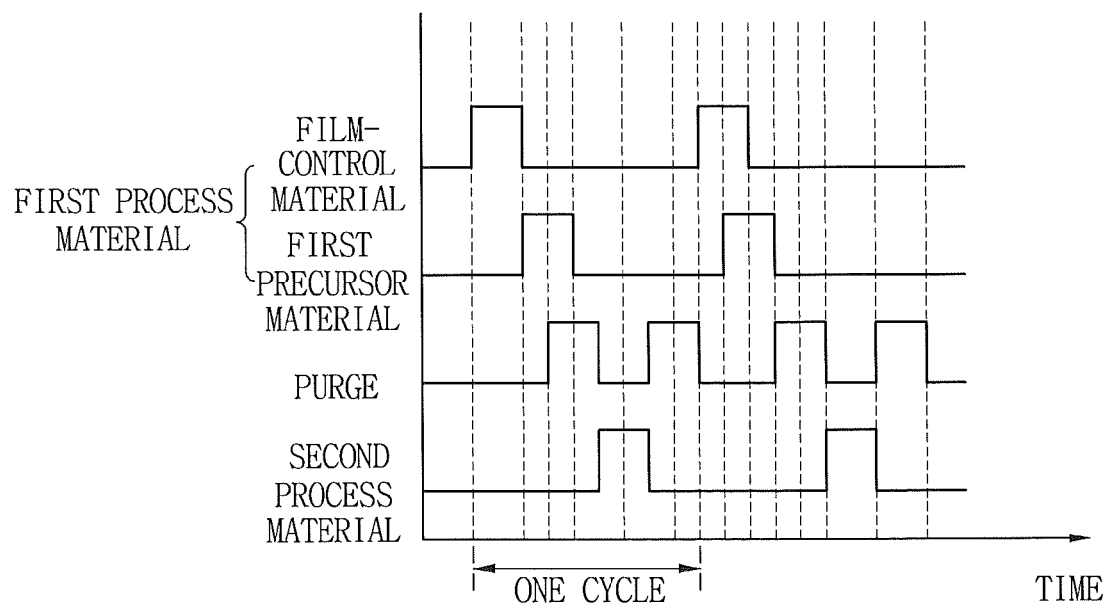
FIG. 30 is a gas-pulsing diagram describing still another example of a method of fabricating a semiconductor device in accordance with some embodiments of the inventive concept.

FIG. 30 is a gas-pulsing diagram showing still another example of the method of fabricating a semiconductor device in accordance with some embodiments of the inventive concept. The other example of the method of fabricating a semiconductor device in accordance with some embodiments of the inventive concept will be described with reference to FIG. 30 together with FIGS. 8 and 9.

Referring to FIGS. 8, 9, and 30, the supply of the film-control material into the process chamber 10 may start before the supply of the first precursor material, the supply of the first precursor material may start during the supply of the film-control material, and the supply of the first precursor material may stop after the supply of the film-control material stops. Accordingly, the film-control material and the first precursor material may be supplied together into the process chamber 10 for a period. Accordingly, the preliminary unit layer may be formed on the semiconductor substrate by supplying the first process material including the film-control material and the first precursor material into the process chamber 10 (S110). The process chamber 10 may be purged (S115). The unit layer may be formed from the preliminary unit layer by supplying the second process material into the purged process chamber 10 (S120). The process chamber 10 in which the semiconductor substrate having the unit layer is located may be purged (S125). When a desired thickness of the deposited film is not obtained, a cycle of the processes in which the unit layer is formed may be repeatedly performed. When the desired thickness of the deposited film is obtained, the semiconductor substrate 100 in which the deposited film is formed may be unloaded from the process chamber 10.

Figure 31:
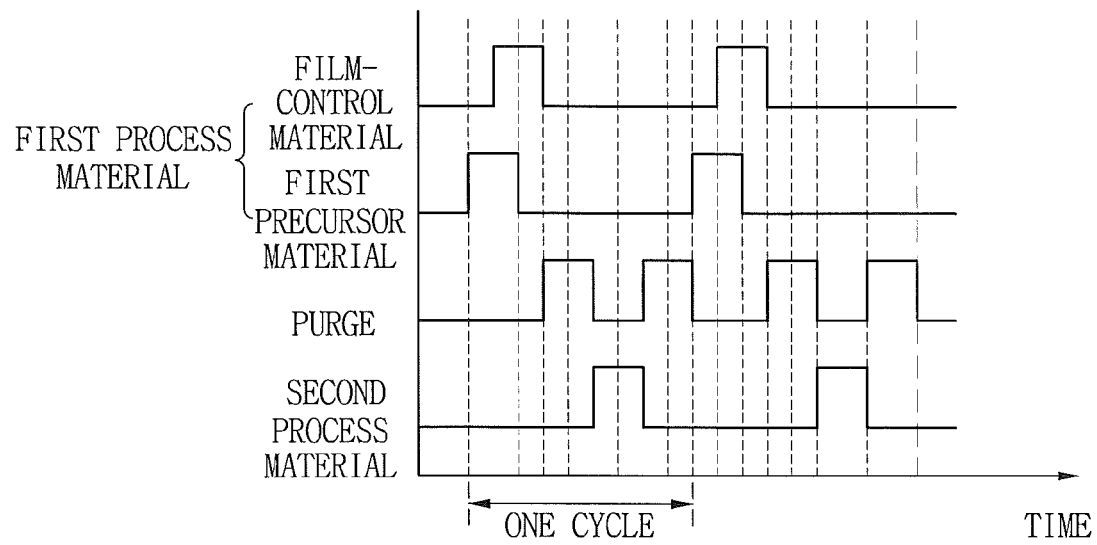
FIG. 31 is a gas-pulsing diagram describing still another example of a method of fabricating a semiconductor device in accordance with some embodiments of the inventive concept.

FIG. 31 is a gas-pulsing diagram showing still another example of the method of fabricating a semiconductor device in accordance with some embodiments of the inventive concept. The other example of the method of fabricating a semiconductor device in accordance with some embodiments of the inventive concept will be described with reference to FIG. 31 together with FIGS. 8 and 9.

Referring to FIGS. 8, 9, and 31, the supply of the first precursor material may start before the supply the film-control material, then the supply the film-control material may start during the supply of the first precursor material, and then the supply of the film-control material may stop after the supply of the first precursor material stops. Accordingly, the film-control material and the first precursor material may be supplied together into the process chamber 10 for a period. Accordingly, the preliminary unit layer may be formed on the semiconductor substrate by supplying the first process material including the film-control material and the first precursor material into the process chamber 10 (S110). The process chamber 10 may be purged (S115). The unit layer may be formed from the preliminary unit layer by supplying the second process material into the purged process chamber 10 (S120). The process chamber 10 in which the semiconductor substrate having the unit layer is located may be purged (S125). When a desired thickness of the deposited film is not obtained, a cycle of the processes in which the unit layer is formed may be repeatedly performed. When the desired thickness of the deposited film is obtained, the semiconductor substrate 100 in which the deposited film is formed may be unloaded from the process chamber 10.

Figure 32:
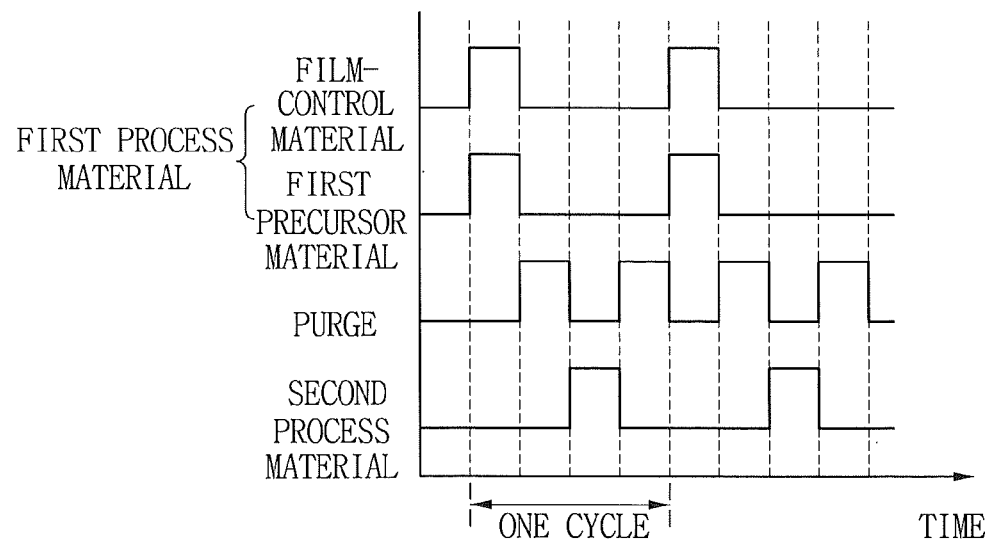
FIG. 32 is a gas-pulsing diagram describing still another example of a method of fabricating a semiconductor device in accordance with some embodiments of the inventive concept.

FIG. 32 is a gas-pulsing diagram showing still another example of methods of fabricating a semiconductor device in accordance with some embodiments of the inventive concept. The other example of the methods of fabricating a semiconductor device in accordance with some embodiments of the inventive concept will be described with reference to FIG. 32 together with FIGS. 8 and 9.

Referring to FIGS. 8, 9, and 32, the first precursor material and the film-control material may be supplied into process chamber 10 at the same time. The supply of the first precursor material and film-control material may start at the same time, and stop at the same time. Accordingly, the preliminary unit layer may be formed on the semiconductor substrate by supplying the first process material including the film-control material and the first precursor material into the process chamber 10 (S110). The process chamber 10 may be purged (S115). The unit layer may be formed from the preliminary unit layer by supplying the second process material into the purged process chamber 10 (S120). The process chamber 10 in which the semiconductor substrate having the unit layer is located may be purged (S125). When a desired thickness of the deposited film is not obtained, a cycle of the processes in which the unit layer is formed may be repeatedly performed. When the desired thickness of the deposited film is obtained, the semiconductor substrate 100 in which the deposited film is formed may be unloaded from the process chamber 10.

Figure 33:
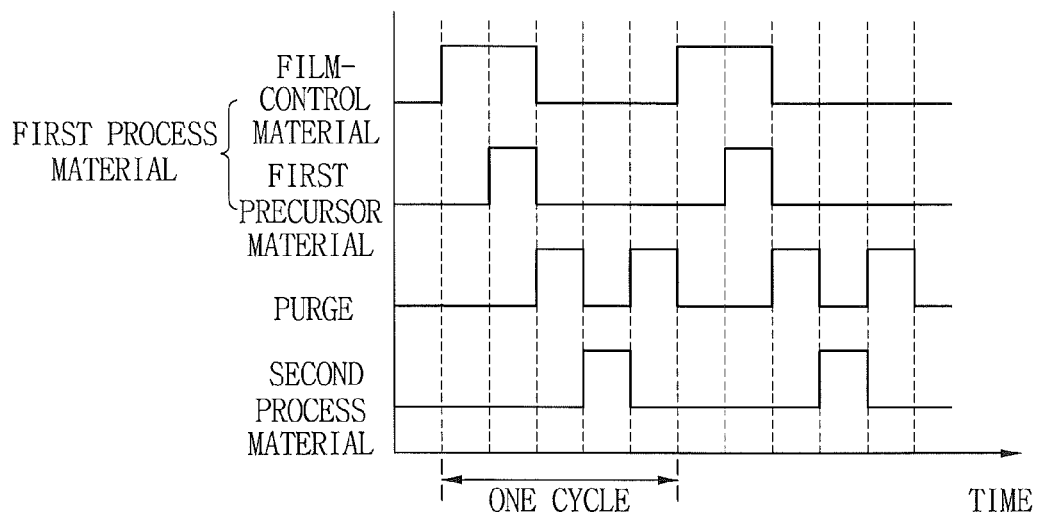
FIG. 33 is a gas-pulsing diagram describing still another example of a method of fabricating a semiconductor device in accordance with some embodiments of the inventive concept.

FIG. 33 is a gas-pulsing diagram showing still another example of the method of fabricating a semiconductor device in accordance with some embodiments of the inventive concept. The other example of the method of fabricating a semiconductor device in accordance with some embodiments of the inventive concept will be described with reference to FIG. 33 together with FIGS. 8 and 9.

Referring to FIGS. 8, 9, and 33, the supply of the film-control material into the process chamber 10 may start before the supply of the first precursor material, the supply of the first precursor material may start during the supply of the film-control material, and the supply of the film-control material and first precursor material may stop at the same time. Accordingly, the preliminary unit layer may be formed on the semiconductor substrate by supplying the first process material including the film-control material and the first precursor material into the process chamber 10 (S110). The process chamber 10 may be purged (S115). The unit layer may be formed from the preliminary unit layer by supplying the second process material into the purged process chamber 10 (S120). The process chamber 10 in which the semiconductor substrate having the unit layer is located may be purged (S125). When a desired thickness of the deposited film is not obtained, a cycle of the processes in which the unit layer is formed may be repeatedly performed. When the desired thickness of the deposited film is obtained, the semiconductor substrate 100 in which the deposited film is formed may be unloaded from the process chamber 10.

Figure 34:
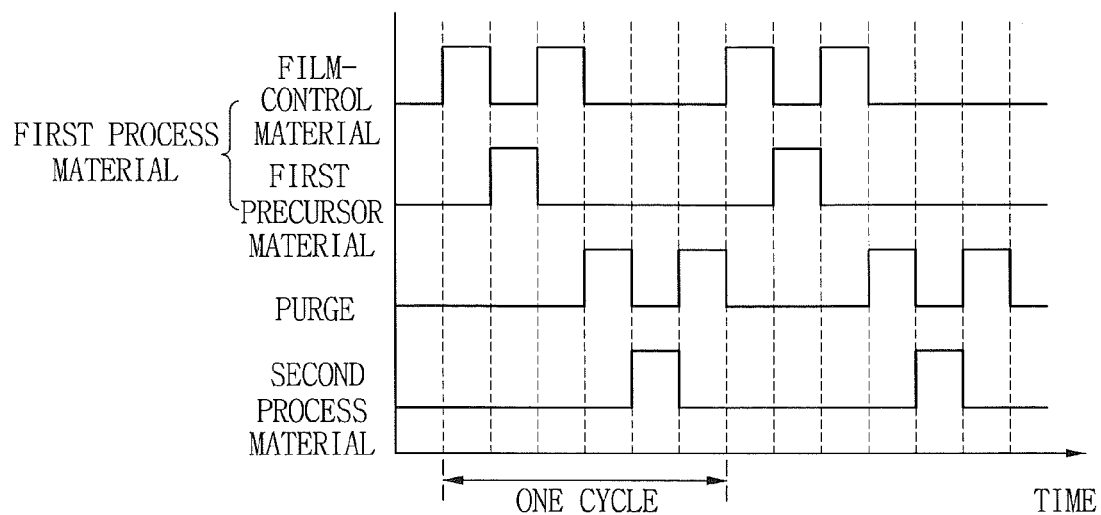
FIG. 34 is a gas-pulsing diagram describing still another example of a method of fabricating a semiconductor device in accordance with some embodiments of the inventive concept.

FIG. 34 is a gas-pulsing diagram showing still another example of the method of fabricating a semiconductor device in accordance with some embodiments of the inventive concept. The other example of the method of fabricating a semiconductor device in accordance with some embodiments of the inventive concept will be described with reference to FIG. 34 together with FIGS. 8 and 9.

Referring to FIGS. 8, 9, and 34, the supply of the film-control material into the process chamber 10 may start before the supply of the first precursor material, then the supply of the first precursor material may start while stopping the supply of the film-control material, and then the supply of the film-control material may start while stopping the supply of the first precursor material. That is, the film-control material may be supplied into the process chamber 10 for two times, and the first precursor material may be supplied during the period in which the film-control material is not supplied. Accordingly, the preliminary unit layer may be formed on the semiconductor substrate by supplying the first process material including the film-control material and the first precursor material into the process chamber 10 (S110). The process chamber 10 may be purged (S115). The unit layer may be formed from the preliminary unit layer by supplying the second process material into the purged process chamber 10 (S120). The process chamber 10 in which the semiconductor substrate having the unit layer is located may be purged (S125). When a desired thickness of the deposited film is not obtained, a cycle of the processes in which the unit layer is formed may be repeatedly performed. When the desired thickness of the deposited film is obtained, the semiconductor substrate 100 in which the deposited film is formed may be unloaded from the process chamber 10.

Figure 35:
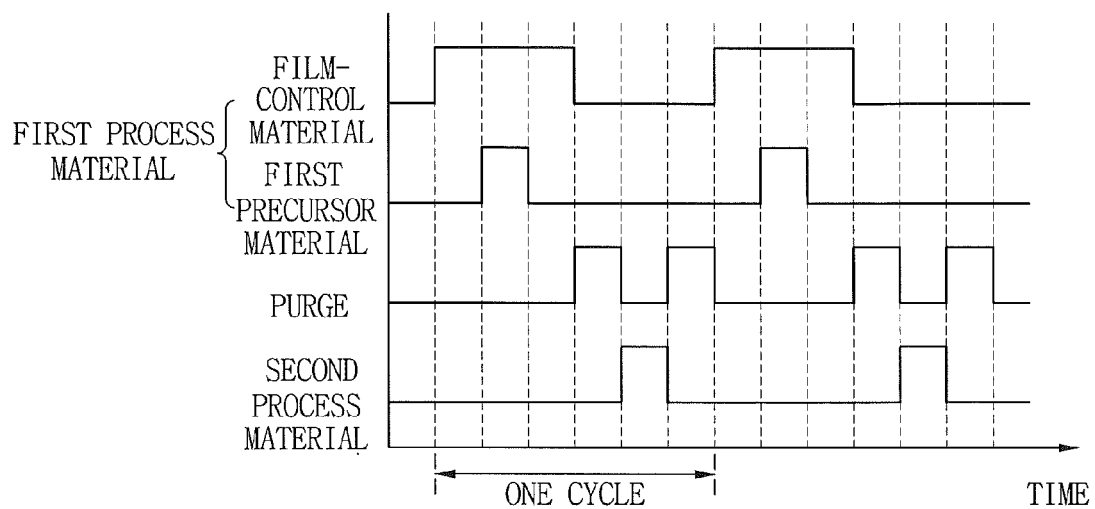
FIG. 35 is a gas-pulsing diagram describing still another example of a method of fabricating a semiconductor device in accordance with some embodiments of the inventive concept.

FIG. 35 is a gas-pulsing diagram showing still another example of the method of fabricating a semiconductor device in accordance with some embodiments of the inventive concept. The other example of the method of fabricating a semiconductor device in accordance with some embodiments of the inventive concept will be described with reference to FIG. 35 together with FIGS. 8 and 9.

Referring to FIGS. 8, 9, and 35, the supply of the first precursor material into the process chamber 10 may start during the supply of the film-control material. That is, the film-control material may be supplied before the first precursor material, then, after a period of time, the first precursor material may be supplied together with the film-control material, and then the film-control material may be supplied after the supply of the first precursor material stops. Accordingly, the preliminary unit layer may be formed on the semiconductor substrate by supplying the first process material including the film-control material and the first precursor material into the process chamber 10 (S110). The process chamber 10 may be purged (S115). The unit layer may be formed from the preliminary unit layer by supplying the second process material into the purged process chamber 10 (S120). The process chamber 10 in which the semiconductor substrate having the unit layer is located may be purged (S125). When a desired thickness of the deposited film is not obtained, a cycle of processes in which the unit layer is formed may be repeatedly performed. When the desired thickness of the deposited film is obtained, the semiconductor substrate 100 in which the deposited film is formed may be unloaded from the process chamber 10.

Figure 36:
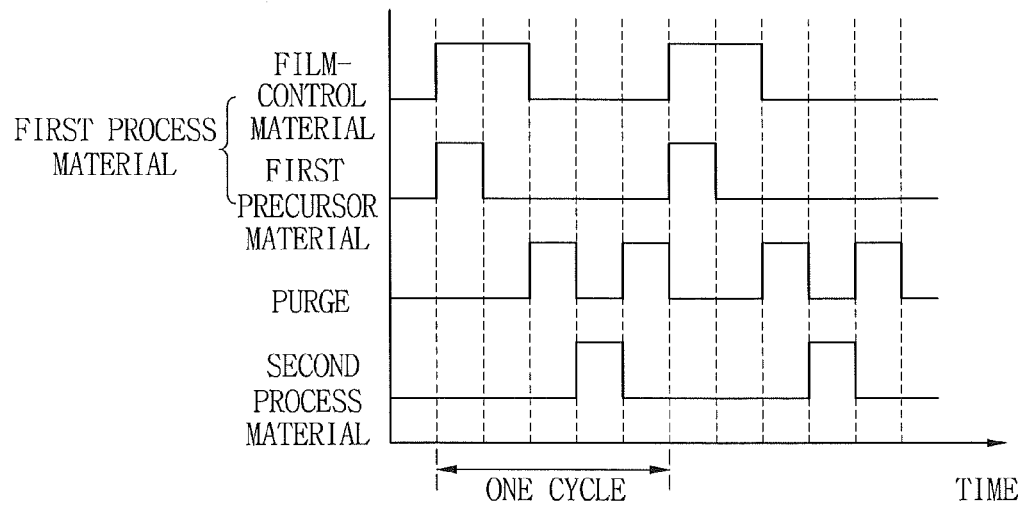
FIG. 36 is a gas-pulsing diagram describing still another example of a method of fabricating a semiconductor device in accordance with some embodiments of the inventive concept.

FIG. 36 is a gas-pulsing diagram showing still another example of the method of fabricating a semiconductor device in accordance with some embodiments of the inventive concept. The other example of the method of fabricating a semiconductor device in accordance with some embodiments of the inventive concept will be described with reference to FIG. 36 together with FIGS. 8 and 9.

Referring to FIGS. 8, 9, and 36, the supply of the film-control material and first precursor material into the process chamber 10 may start at the same time, and the film-control material may be supplied for a longer time than the first precursor material. Accordingly, the preliminary unit layer may be formed on the semiconductor substrate by supplying the first process material including the film-control material and the first precursor material into the process chamber 10 (S110). The process chamber 10 may be purged (S115). The unit layer may be formed from the preliminary unit layer by supplying the second process material into the purged process chamber 10 (S120). The process chamber 10 in which the semiconductor substrate having the unit layer is located may be purged (S125). When a desired thickness of the deposited film is not obtained, a cycle of the processes in which the unit layer is formed may be repeatedly performed. When the desired thickness of the deposited film is obtained, the semiconductor substrate 100 in which the deposited film is formed may be unloaded from the process chamber 10.

Figure 37:
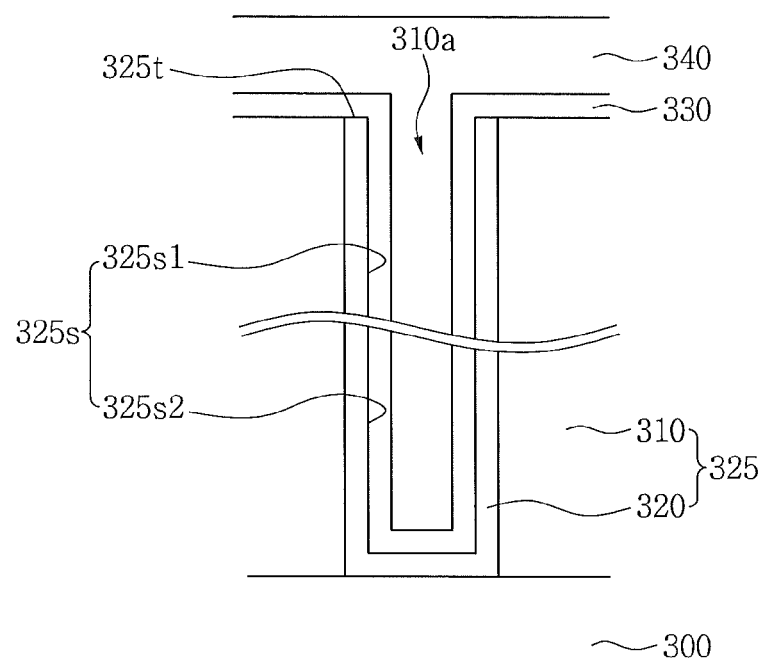
FIG. 37 is a cross-sectional view showing a semiconductor device formed using a method of fabricating a semiconductor device in accordance with some embodiments of the inventive concept.

FIG. 37 is a cross-sectional view showing an example of a semiconductor device fabricated using a method of fabricating a semiconductor device in accordance with some embodiments of the inventive concept.

Referring to FIG. 37, a structure 325 having a vertical side may be formed on a semiconductor substrate 300. The formation of the structure 325 may include forming a mold insulating layer 310, forming an opening 310a passing through the mold insulating layer 310, and forming a first electrode 320 covering side and bottom surfaces of the opening 310a. The first electrode 320 may be formed of a conductive material such as titanium nitride (TiN). The first electrode 320 may be formed using a method of forming a deposited film in accordance with embodiments of the inventive concept.

The structure 325 may include a top surface 325t, an upper side part 325s1, and a lower side part 325s2. The upper side part 325s1 may indicate a side area located at an upper part of the structure, and the lower side part 325s2 may indicate a side area located at a lower part of the structure 325.

A capacitor dielectric layer 330 may be formed in the semiconductor substrate 300 having the structure 325. The capacitor dielectric layer 330 may be a deposited film formed in accordance with embodiments of the inventive concept. For example, the capacitor dielectric layer 330 may be a deposited film formed in accordance with one of the embodiments of the inventive concept described in FIGS. 1 to 34.

A second electrode 340 may be formed on the substrate having the capacitor dielectric layer 330. The second electrode 340 may be formed using a method of forming a deposited film in accordance with embodiments of the inventive concept. The first electrode 320, the capacitor dielectric layer 330, and the second electrode 340 may provide a capacitor.

Figure 38:
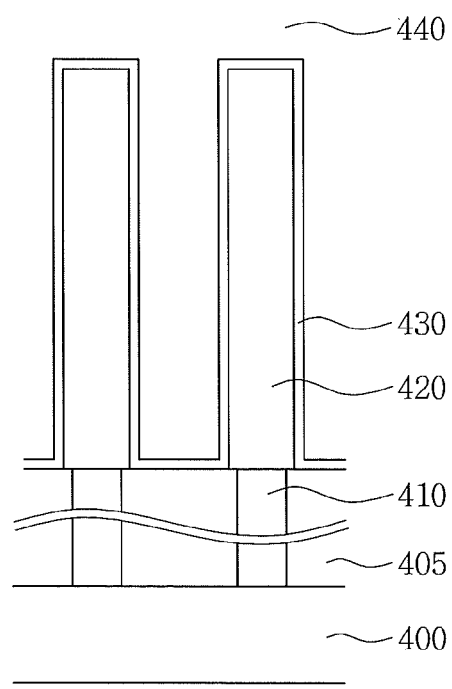
FIG. 38 is a cross-sectional view showing another semiconductor device formed using a method of fabricating a semiconductor device in accordance with some embodiments of the inventive concept.

FIG. 38 is a cross-sectional view showing another example of a semiconductor device fabricated using a method of fabricating a semiconductor device in accordance with some embodiments of the inventive concept.

Referring to FIG. 38, a semiconductor substrate 400 may be provided. The semiconductor substrate 400 may include an integrated circuit such as a MOS transistor.

An interlayer insulating layer 405 may be formed on the semiconductor substrate 400. Conductive plugs 410 passing through the interlayer insulating layer 405 may be formed.

First electrodes 420 electrically connected to conductive plugs 410 may be formed on the interlayer insulating layer 405.

The formation of the first electrodes 420 may include forming a sacrificial mold layer on the substrate having the conductive plugs 410, forming holes passing through the sacrificial mold layer, forming a first electrode layer on the substrate having the holes, forming the first electrodes 420 remaining in the holes by planarizing the first electrode layer until the sacrificial mold layer is exposed, and removing the sacrificial mold layer. Here, the first electrode layer may be formed using a method of forming a deposited film in accordance with embodiments of the inventive concept. For example, the first electrode layer may be formed by a deposition process using a titanium precursor or a hydride of a ligand of the titanium precursor.

A capacitor dielectric layer 430 may be formed on the substrate having the first electrodes 420. The capacitor dielectric layer 430 may be formed using a method of forming a deposited film in accordance with embodiments of the inventive concept. A second electrode 440 may be formed on the substrate having the capacitor dielectric layer 430. The second electrode 440 may be formed using a method of forming a deposited film in accordance with embodiments of the inventive concept.

Figure 39:
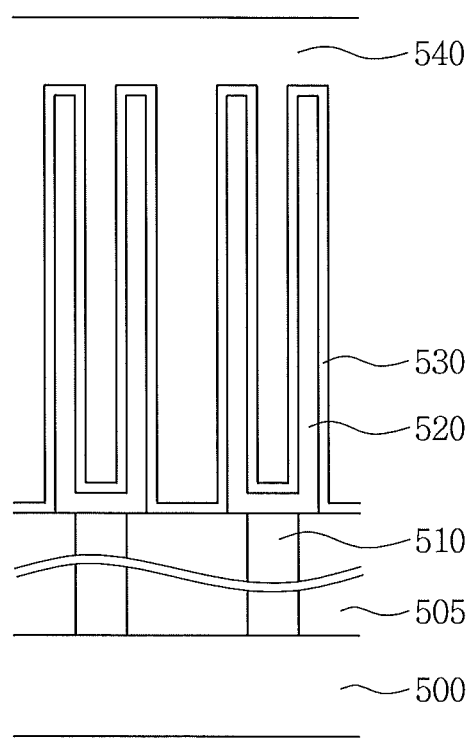
FIG. 39 is a cross-sectional view showing still another semiconductor device formed using a method of fabricating a semiconductor device in accordance with some embodiments of the inventive concept.

FIG. 39 is a cross-sectional view showing still another example of a semiconductor device fabricated using a method of fabricating a semiconductor device in accordance with some embodiments of the inventive concept.

Referring to FIG. 39, an interlayer insulating layer 505 may be formed on a semiconductor substrate 500. Conductive plugs 510 passing through the interlayer insulating layer 505 may be formed.

Cylindrical first electrodes 520 electrically connected to the conductive plugs 510 may be formed on the interlayer insulating layer 505. The first electrodes 520 may be formed using a method of forming a deposited film in accordance with embodiments of the inventive concept. A capacitor dielectric layer 530 may be formed on the substrate having the first electrodes 520. The capacitor dielectric layer 530 may be formed using a method of forming a deposited film in accordance with embodiments of the inventive concept. A second electrode 540 may be formed on the substrate having the capacitor dielectric layer 530. The second electrode 540 may be formed using a method of forming a deposited film in accordance with embodiments of the inventive concept.

Figure 40:
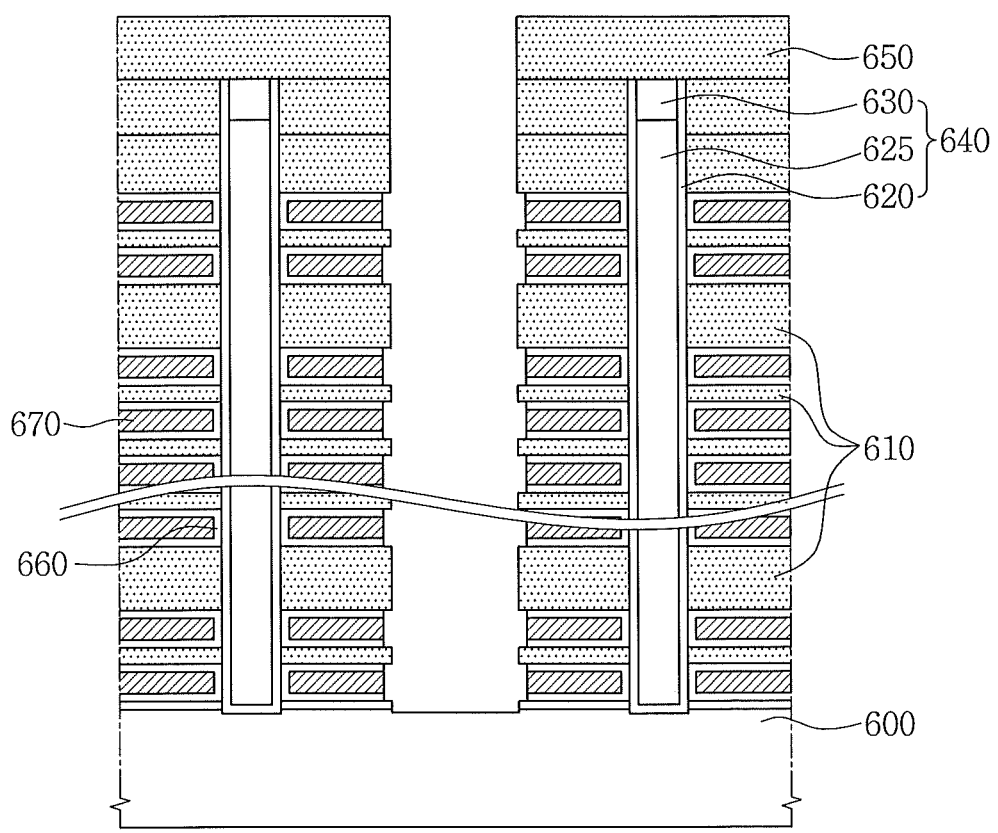
FIG. 40 is a cross-sectional view showing still another semiconductor device formed using a method of fabricating a semiconductor device in accordance with some embodiments of the inventive concept.

FIG. 40 is a cross-sectional view showing still another example of a semiconductor device fabricated using a method of fabricating a semiconductor device in accordance with some embodiments of the inventive concept.

Referring to FIG. 40, vertically stacked interlayer insulating layers 610 may be provided on a semiconductor substrate 600. Conductive plugs 670 interposed between the interlayer insulating layers 610 may be provided.

A vertical structure 640 passing through the conductive patterns 670 and interlayer insulating layers 610 may be provided. The vertical structure 640 may include a core pattern 625, a pad pattern 630, and an outer pattern 620 that surrounds a side of the core pattern 625 and extends to a side of the pad pattern 630.

The core pattern 625 may be formed of an insulating material such as silicon oxide. When the core pattern 625 is formed of a dielectric material by an ALD method, the core pattern 625 may be formed using a method of fabricating a semiconductor device in accordance with embodiments of the inventive concept.

The pad pattern 630 may be located on the core pattern 625 and at a higher level than the highest conductive pattern of the conductive patterns 670. The pad pattern 630 may be formed of a conductive material such as a doped polysilicon.

The outer pattern 620 may include a semiconductor pattern that functions as a channel of a transistor. For example, the outer pattern 620 may include a semiconductor material such as silicon, etc. Some portion of the outer pattern 620, which is located close to the conductive patterns 670, may include a dielectric material. The dielectric material may include a material that functions as a tunnel oxide of a transistor, for example, silicon oxide. The dielectric material may include a material that stores information of a flash memory device, for example, silicon nitride or a high dielectric material. The dielectric material may be formed using a method of fabricating a semiconductor device in accordance with embodiments of the inventive concept.

Meanwhile, the conductive patterns 670 may include a metal nitride layer and/or a metal layer. For example, each of the conductive patterns 670 may be formed of a metal layer and a metal nitride layer interposed between the metal layer and the interlayer insulating layers 610. In addition, the metal nitride layer may extend between the metal layer and the vertical structure 640. The conductive patterns 670 may be formed using a method of fabricating a semiconductor device in accordance with embodiments of the inventive concept.

A capping insulating layer 650 covering the interlayer insulating layers 610 and the vertical structure 640 may be provided.

The embodiments of the inventive concept may provide a deposited film formation method capable of improving a step coverage property, and a method of fabricating a semiconductor device using thereof. In addition, the embodiments of the inventive concept may provide a method of forming a deposited film having an improved uniformity on a semiconductor substrate including a structure having a vertical side, and a method of fabricating a semiconductor device using thereof. Further, the embodiments of the inventive concept may provide a method of improving a uniformity of a deposited film formed on a substrate including holes having a high aspect ratio.

In accordance with embodiments of the inventive concept, a deposited film may be formed on a semiconductor substrate, using a process of supplying a first process material including a film-control material and a precursor material. Samples 1 to 5 and samples 6 to 10 have been fabricated in order to describe a semiconductor device fabricated using a method of fabricating a semiconductor device in accordance with embodiments of the inventive concept.

Hereinafter, <Experimental Example 1> in which the samples 1 to 5 were fabricated and <Experimental Example 2> in which the samples 6 to 10 were fabricated, will be described.

EXPERIMENTAL EXAMPLE 1

A sample 1 having a deposited film formed using a precursor material without using a film-control material, and samples 2 to 5 having deposited films formed using both film-control material and precursor material, were fabricated.

Samples 1 to 5 were formed by performing a process which included loading a semiconductor substrate in the process chamber, forming a deposited film on the semiconductor substrate while varying a process condition, and unloading the semiconductor substrate having the deposited film from the process chamber. Here, the formation of the deposited film included repeatedly performing a cycle of processes in which a first process material was supplied into the process chamber in which the semiconductor substrate was located, then the process chamber was firstly purged, then ozone, a oxidizer, was supplied as a second process material into the process chamber, and then the process chamber was secondly purged. Here, ozone, an oxidizer, was used as the second process material.

Samples 1 to 5 were formed commonly using a first process material including zirconium precursor. Sample 1 was formed using a first process material including zirconium precursor and excluding the film-control material. Samples 2 to 5 were formed commonly using the first process material including the film-control material and the zirconium precursor.

Samples 1 to 5 were formed commonly using a process in which a liquid-state zirconium precursor was vaporized using a liquid delivery system (LDS) method at a temperature of 130 degrees Celsius to be supplied into the process chamber. Here, in Samples 1 to 5, argon was used as a carrier gas to move the zirconium precursor, and a flow rate of the carrier gas to move the zirconium precursor was 160 sccm.

Samples 1 to 5 were formed commonly using a zirconium precursor having chemical formula $CpZr(N(CH_3)_2)_3$, and Samples 2 to 5 were formed commonly using dimethylamine (DMA), a hydride of a ligand of the zirconium precursor. The DMA has the chemical formula $HN(CH_3)_2$.

Samples 2 to 5 were formed by commonly supplying the DMA, which was used as the film-control material, into the process chamber via a moisture filter in a gas state. In Samples 2 to 4, the DMA of 1000 sccm used as the film-control material was supplied in a gas state via the moisture filter.

Samples 2 to 5 were formed by varying methods of supplying the DMA into the process chamber.

Sample 1 is a sample in which zirconium oxide was formed using the zirconium precursor without using the film-control material. Sample 1 including zirconium oxide having a thickness of 148 Å was formed by repeatedly performing a cycle of processes including supplying the zirconium precursor into the process chamber, firstly purging the process chamber, supplying ozone as an oxidizer, and secondly purging the process chamber, 136 times. The deposition rate of the zirconium oxide in Sample 1 was 1.09 Å/cycle.

Sample 2 is a sample formed in accordance with the embodiments of the inventive concept as described in FIG. 32. As described in FIG. 32, Sample 2 including zirconium oxide having a thickness of 154 Å was formed by repeatedly performing a cycle of processes including supplying the zirconium precursor and the film-control material into the process chamber at the same time, firstly purging the process chamber, supplying ozone as an oxidizer, and secondly purging the process chamber, 157 times. The deposition rate of the zirconium oxide in Sample 2 was 0.98 Å/cycle. In Sample 2, the supply of the zirconium precursor and film-control material into the process chamber started at the same time, and stopped at the same time.

Sample 3 is a sample formed according to the embodiments of the inventive concept as described in FIG. 22. As described in FIG. 22, Sample 3 including zirconium oxide having a thickness of 152 Å was formed by repeatedly performing a cycle of processes including supplying the zirconium precursor into the process chamber, supplying the film-control material while stopping the supply of the zirconium precursor, firstly purging the process chamber, supplying ozone as an oxidizer, and secondly purging the process chamber, 147 times. The deposition rate of the zirconium oxide in Sample 3 was 1.03 Å/cycle.

Sample 4 is a sample formed according to the embodiments of the inventive concept as described in FIG. 10. As described in FIG. 10, Sample 4 including zirconium oxide having a thickness of 146 Å was formed by repeatedly performing a cycle of processes including supplying the film-control material into the process chamber, then supplying the zirconium precursor while stopping the supply of the film-control material, firstly purging the process chamber, supplying ozone as an oxidizer, and secondly purging the process chamber, 155 times. The deposition rate of the zirconium oxide in Sample 4 was 0.64 Å/cycle.

Sample 5 is a sample formed according to the embodiments of the inventive concept as described in FIG. 36. As described in FIG. 36, Sample 5 including zirconium oxide having a thickness of 147 Å was formed by repeatedly performing a cycle of processes including supplying the film-control material and the zirconium precursor into the process chamber at the same time, then continuously supplying the film-control material while stopping the supply of the zirconium precursor, then stopping the supply of the film-control material, then firstly purging the process chamber, then supplying ozone as an oxidizer, and then secondly purging the process chamber, 163 times. The deposition rate of the zirconium oxide in Sample 5 was 0.90 Å/cycle.

[Table 1] shows measured thicknesses of the deposited film, that is, zirconium oxide, in Samples 1 to 5.

TABLE 1

|   | | Cycle | thickness | Deposition rate |
|---|---|---|---|---|
| 1 | Sample 1 | 136 | 148 Å | 1.09 Å/cycle |
| 2 | Sample 2 | 157 | 154 Å | 0.98 Å/cycle |
| 3 | Sample 3 | 147 | 152 Å | 1.03 Å/cycle |
| 4 | Sample 4 | 155 | 146 Å | 0.94 Å/cycle |
| 5 | Sample 5 | 163 | 147 Å | 0.90 Å/cycle |

Samples 2 to 5 formed using the film-control material had smaller thicknesses of unit layers deposited per 1 cycle than Sample 1 formed without using the film-control material. That is, when performing a cycle of processes, thicknesses of the unit layers in Samples 2 to 5 were smaller than a thickness of the unit layer of Sample 1. Since, in this experiments, the same amount of the zirconium precursor were used per one cycle of processes and all of the film-control material were removed as the unit layer was formed, the result of the experiments shows that a unit layer closer to an ideal single atomic layer was formed when the deposition process was performed using the film-control material such as Samples 2 to 5 than when the deposition process was performed without using the film-control material such as Sample 1.

EXPERIMENTAL EXAMPLE 2

As described above, according to embodiments of the inventive concept, a deposited film was formed on a semiconductor substrate using a process including supplying a first process material having a film-control material and precursor material into a process chamber.

The fabrication of Samples 6 to 10 included forming the structure 325 as described in FIG. 37 on the semiconductor substrate, loading the semiconductor substrate having the structure 325 in the process chamber, forming a deposited film 330 on the semiconductor substrate having the structure 325 in the process chamber, unloading the semiconductor substrate having the deposited film 330 from the process chamber. Here, the structure 325 may include a mold insulating layer 310 and a first electrode 320, described in FIG. 37.

The deposited film 330 of Samples 6 to 10 was formed by repeatedly performing a cycle of processes including forming a preliminary unit layer by supplying a first process material into the process chamber in which the semiconductor substrate having the structure 325 was located, firstly purging the process chamber, forming a unit layer from the preliminary unit layer by supplying a second process material into the process chamber, and secondly purging the process chamber. Here, Samples 6 to 10 were formed by varying conditions for supplying the first process material.

Sample 6 is a sample in which the deposited film 330 was formed without using the film-control material, and the Samples 7 to 10 are samples in which the deposited films 330 were formed using both film-control material and precursor material and by varying conditions for supplying the first process material. Here, the precursor material was a zirconium precursor having chemical formula $CpZr(N(CH_3)_2)_3$, and the film-control material was a hydride of a ligand of the zirconium precursor. The film-control material was a ligand-hydrogen compound having chemical formula $HN(CH_3)_2$.

In Samples 6 to 10, a liquid-state zirconium precursor was vaporized using the LDS method at a temperature of 130 degrees Celsius to be supplied into the process chamber. In Samples 6 to 10, the film-control material was supplied in a gas state via the moisture filter at a flow rate of 1000 sccm. In Samples 6 to 10, argon was used as a carrier gas to move the zirconium precursor, and the flow rate of the carrier gas to move the zirconium precursor was 160 sccm.

Sample 6 is a sample in which a deposited film 330*a* was formed using the zirconium precursor without using the film-control material. Sample 6 was formed by repeatedly performing a cycle of processes including supplying the zirconium precursor into process chamber, firstly purging the process chamber, supplying ozone as an oxidizer, and secondly purging the process chamber.

Figure 41A:
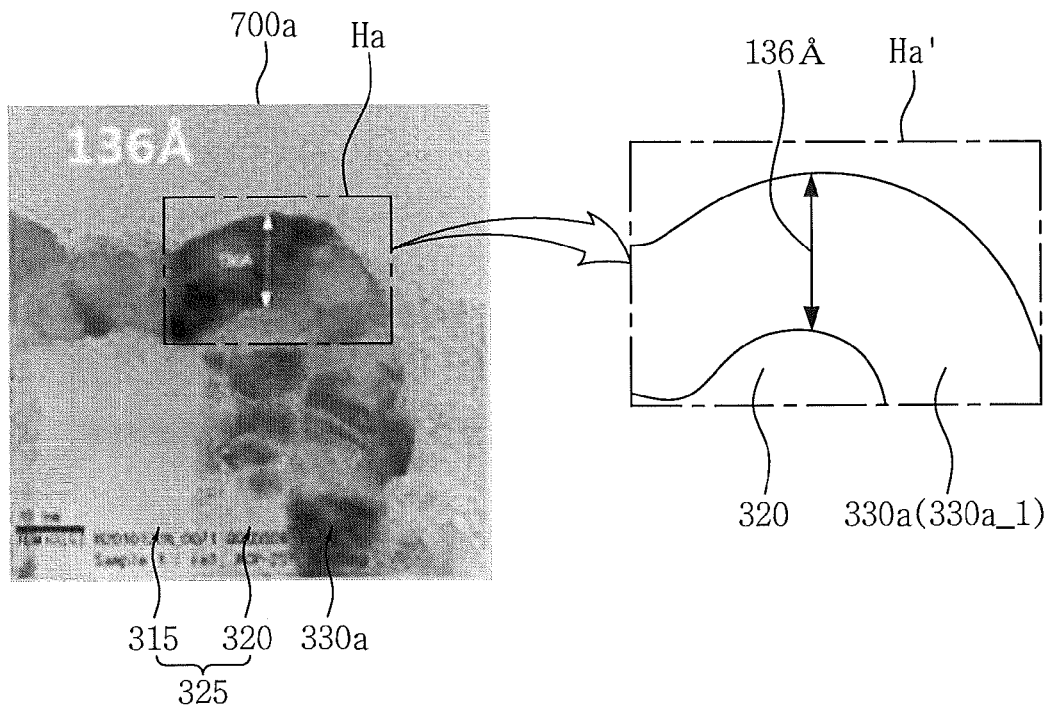
FIGS. 41A to 41C are diagrams showing a part of a semiconductor device formed using a method of fabricating a semiconductor device in accordance with some embodiments of the inventive concept.

FIG. 41A shows a semiconductor device having a deposited film part 330*a*_1 formed in an edge area 325*h* of top surface of the structure 325 in Sample 6. In FIG. 41A, the part marked by reference number 700*a* is a TEM image including the deposited film part 330*a*_1 formed in the edge area 325*h* of the top surface of the structure 325 in Sample 6, and the part marked by Ha' is an enlarged view of the part marked by Ha in the TEM image 700*a*.

In Sample 6, the thickness of the deposited film part 330*a*_1 formed in the edge area 325*h* of the top surface of the structure 325 was 136 Å.

Figure 41B:
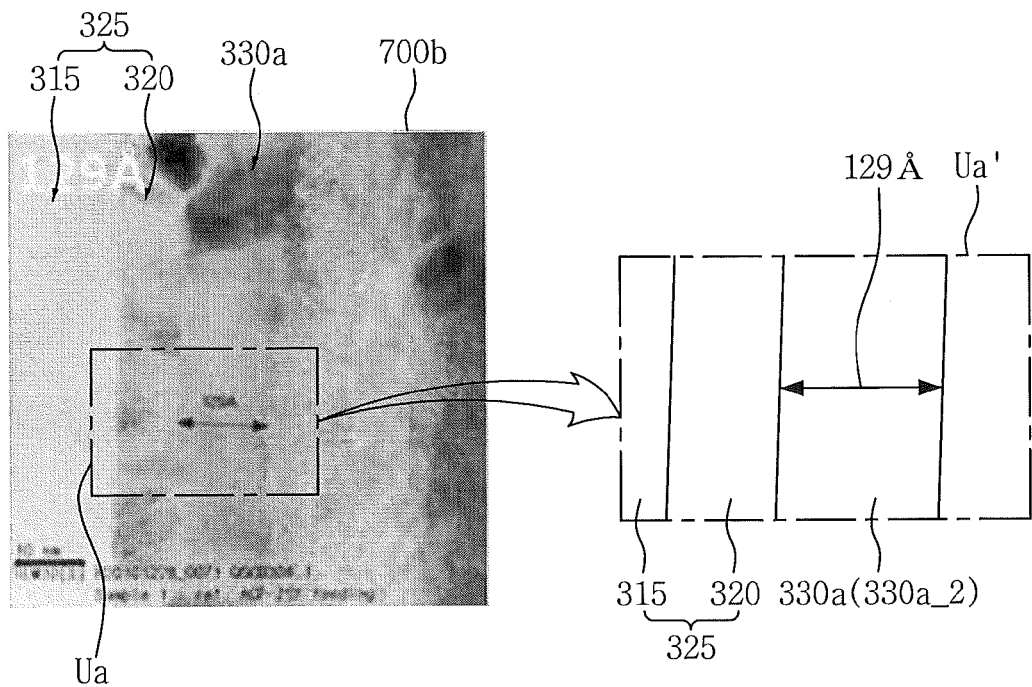

FIG. 41B shows a semiconductor device having a deposited film part 330*a*_2 formed in an upper side part 325*s*_1 of the structure 325 in Sample 6. In FIG. 41B, the part marked by reference number 700b is a TEM image including the deposited film part 330a_2 formed in the upper side part 325s_1 of the structure 325 in Sample 6, and the part marked by Ua' is an enlarged view of the part marked by Ua in the TEM image 700b.

In Sample 6, the thickness of the deposited film part 330a_2 formed in the upper side part 325s_1 of the structure 325 was 129 Å.

Figure 41C:
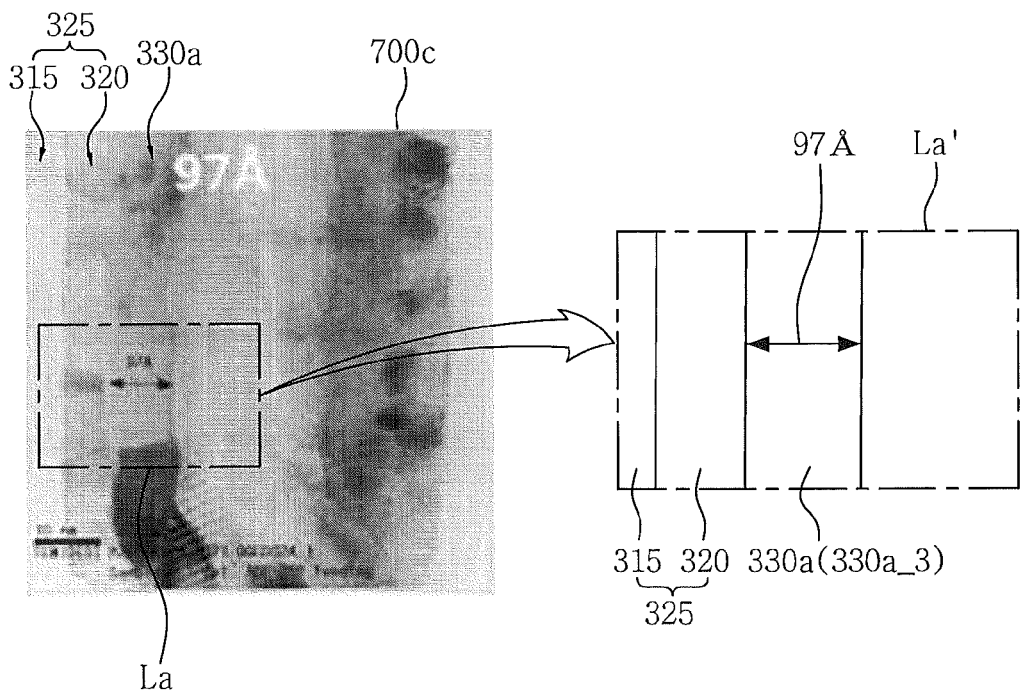

FIG. 41C shows a semiconductor device having a deposited film part 330a_3 formed in a lower side part 325s_2 of the structure 325 in Sample 6. In FIG. 41C, the part marked by reference number 700c is a TEM image including the deposited film part 330a_3 formed in the lower side part 325s_2 of the structure 325 in Sample 6, and the part marked by La' is an enlarged view of the part marked by La in the TEM image 700c. In Sample 6, the thickness of the deposited film part 330a_3 formed in the lower side part 325s_2 of the structure 325 was 97 Å.

Accordingly, in Sample 6, the deposited film part 330a_1 formed in the edge area 325h of the top surface of the structure 325 was formed with a first thickness of 136 Å, the deposited film part 330a_2 formed in the upper side part 325s_1 of the structure 325 was formed with a second thickness of 129 Å, and the deposited film part 330a_3 formed in the lower side part 325s_2 of the structure 325 was formed with a third thickness of 97 Å. In Sample 6, the step coverage of the deposited film 330a was 71%.

In Samples 6 to 10, the step coverage of the deposited film was calculated by the following <Formula 1>.

$$\left(\frac{\text{Thickness } 3(LT)}{\text{Thickness } 1(HT)}\right) \times 100(\%) \qquad \langle\text{Formula 1}\rangle$$

Here, Thickness 1 (HT) represents the thickness of the deposited film part formed in the edge area 325h of the top surface of the structure 325, and Thickness 3 (LT) represents the thickness of the deposited film part formed in the lower side part 325s_2 of the structure 325.

Sample 7 is a sample fabricated in accordance with the embodiment of the inventive concept as described in FIG. 32. The deposited film 330b of Sample 7, as described in FIG. 32, was formed by repeatedly performing a cycle of processes including supplying the zirconium precursor and the film-control material into the process chamber at the same time, then firstly purging the process chamber, supplying ozone as an oxidizer, and then secondly purging the process chamber. In Sample 7, the zirconium precursor and the film-control material were supplied during the same time.

Figure 42A:
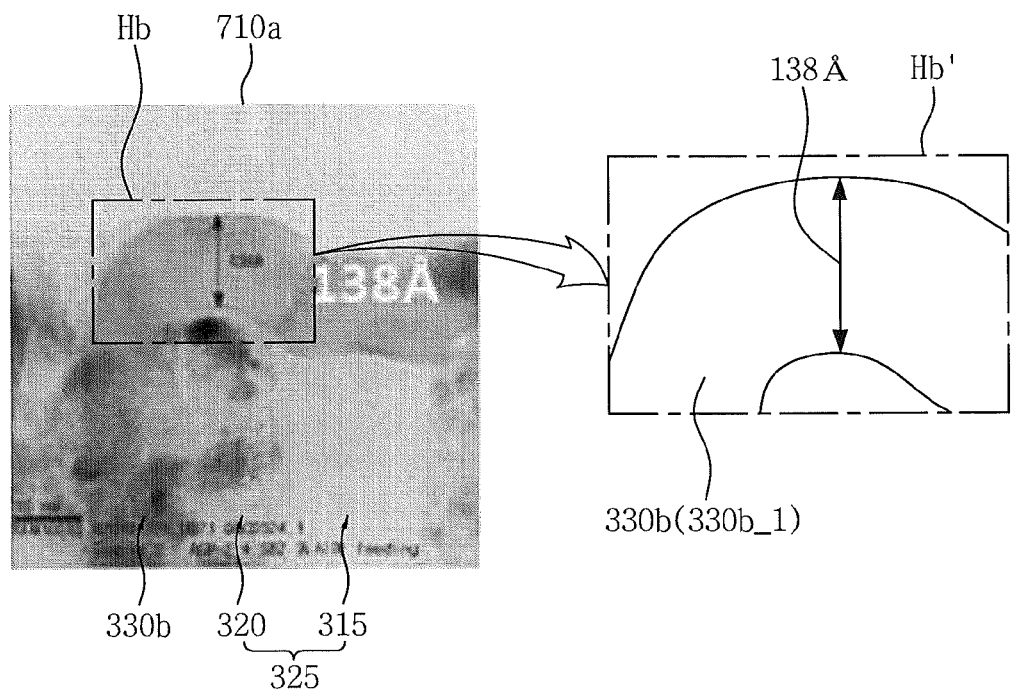
FIGS. 42A to 42C are diagrams showing a part of a semiconductor device formed by another method of fabricating a semiconductor device in accordance with some embodiments of the inventive concept.

FIG. 42A shows a semiconductor device having a deposited film part 330b_1 formed on an edge area 325h of a top surface of the structure 325 in Sample 7. In FIG. 42A, the part marked by reference number 710a is a TEM image including the deposited film part 330b_1 formed the edge area 325h of the top surface of the structure 325 in Sample 7, and the part marked by Hb' is an enlarged view of the part marked by Hb in the TEM image 710a. In Sample 7, the thickness of the deposited film part 330b_1 formed in the edge area 325h of the top surface of the structure 325 was 138 Å.

Figure 42B:
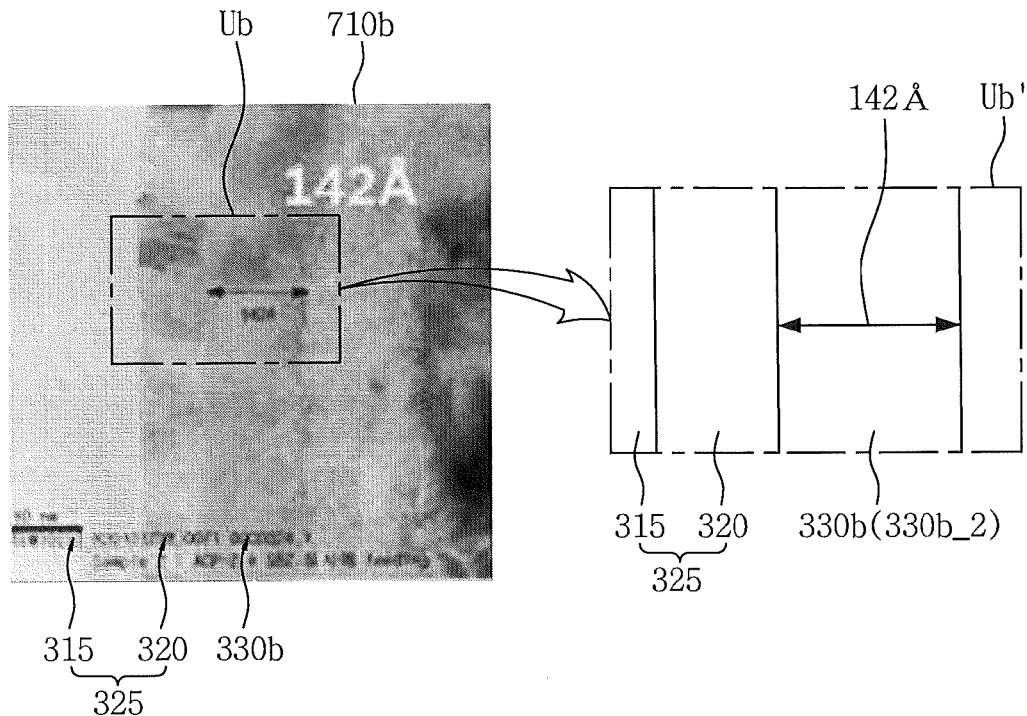

FIG. 42B shows a semiconductor device having a deposited film part 330b_2 formed in an upper side part 325s_1 of the structure 325 in Sample 7. In FIG. 42B, the part marked by reference number 710b is a TEM image including the deposited film part 330b_2 formed in the upper side part 325s_1 of the structure 325 in Sample 7, and the part marked by Ub' is an enlarged view of the part marked by Ub in the TEM image 710b.

In Sample 7, the thickness of the deposited film part 330b_2 formed in the upper side part 325s_1 of the structure 325 was 142 Å.

Figure 42C:
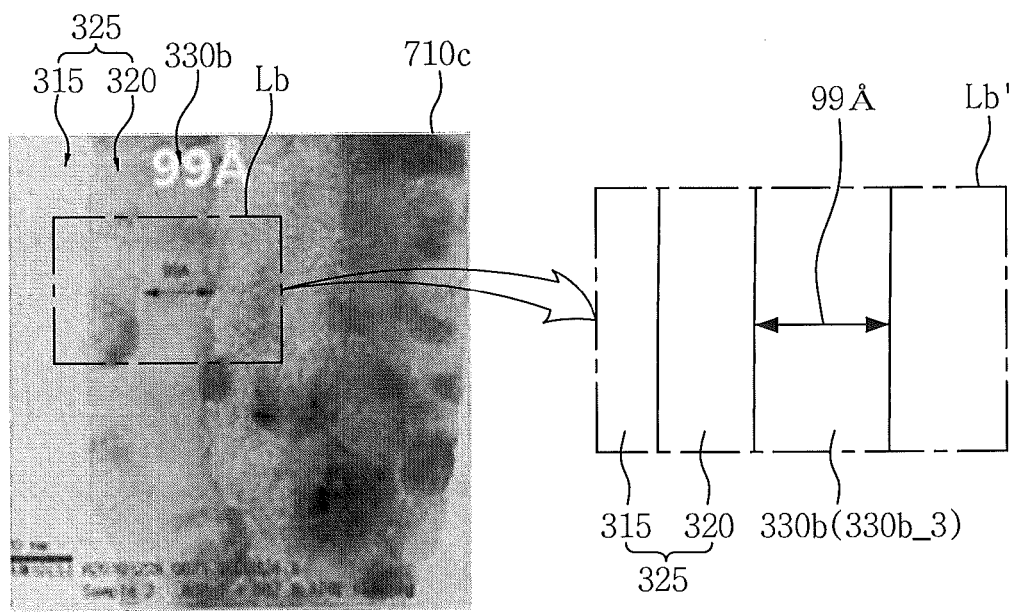

FIG. 42C shows a semiconductor device having a deposited film part 330b_3 formed in a lower side part 325s_2 of the structure 325 in Sample 7. In FIG. 42C, the part marked by reference number 710c is a TEM image including the deposited film part 330b_3 formed in the lower side part 325s_2 of the structure 325 in Sample 7, and the part marked by Lb' is an enlarged view of the part marked by Lb in the TEM image 710c. In Sample 7, the thickness of the deposited film part 330b_3 formed in the lower side part 325s_2 of the structure 325 was 99 Å.

Accordingly, in Sample 7, the deposited film part 330b_1 formed in the edge area 325h of the top surface of the structure 325 was formed with a first thickness of 138 Å, the deposited film part 330b_2 formed in the upper side part 325s_1 of the structure 325 was formed with a second thickness of 142 Å, and the deposited film part 330b_3 formed in the lower side part 325s_2 of the structure 325 was formed with a third thickness of 99 Å. In Sample 7, the step coverage of the deposited film 330b was 72%.

Sample 8 is a sample fabricated in accordance with the embodiment of the inventive concept as described in FIG. 22. The deposited film 330c of Sample 8, as described in FIG. 22, was formed by repeatedly performing a cycle of processes including supplying the zirconium precursor into the process chamber, then supplying the film-control material while stopping the supply of the zirconium precursor, then firstly purging the process chamber, then supplying ozone as an oxidizer, and then secondly purging the process chamber.

Figure 43A:
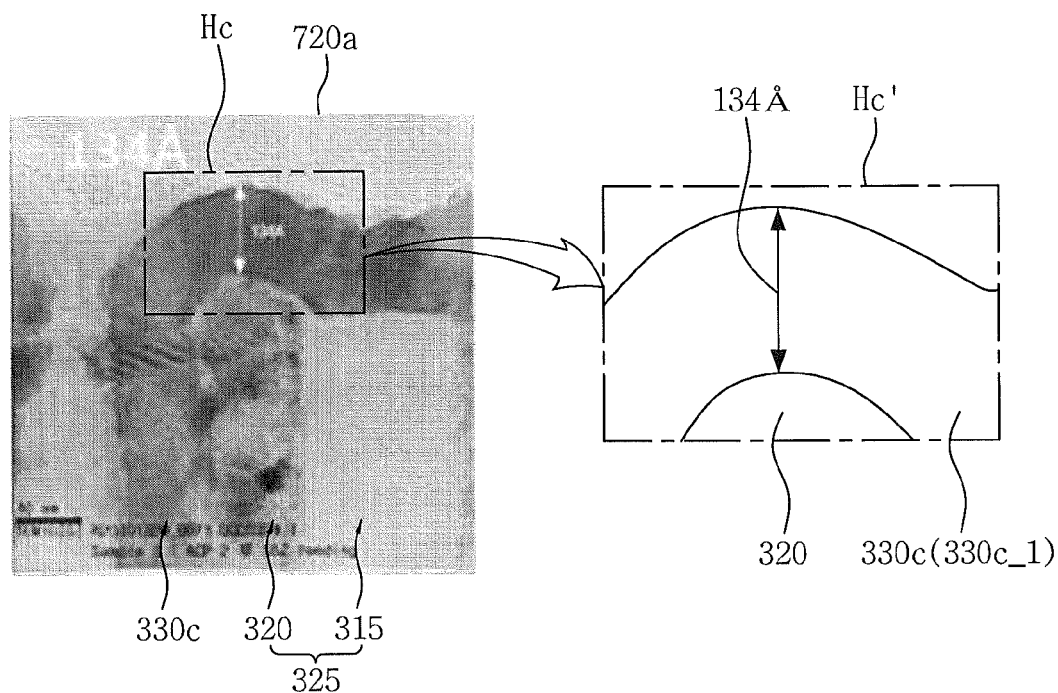
FIGS. 43A to 43C are diagrams showing a part of a semiconductor device formed by still another method of fabricating a semiconductor device in accordance with some embodiments of the inventive concept.

FIG. 43A shows a semiconductor device having a deposited film part 330c_1 formed on an edge area 325h of a top surface of the structure 325 in Sample 8. In FIG. 43A, the part marked by reference number 720a is a TEM image including the deposited film part 330c_1 formed the edge area 325h of the top surface of the structure 325 in Sample 8, and the part marked by Hc' is an enlarged view of the part marked by Hc in the TEM image 720a. In Sample 8, the thickness of the deposited film part 330c_1 formed in the edge area 325h of the top surface of the structure 325 was 134 Å.

Figure 43B:
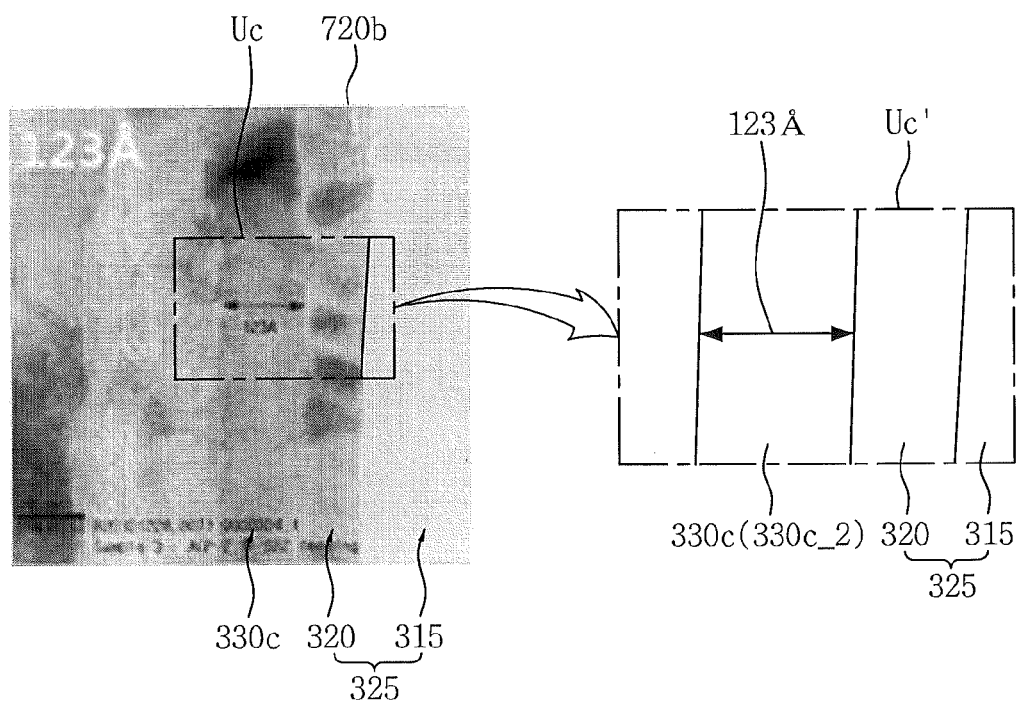

FIG. 43B shows a semiconductor device having a deposited film part 330c_2 formed in an upper side part 325s_1 of the structure 325 in Sample 8. In FIG. 43B, the part marked by reference number 720b is a TEM image including the deposited film part 330c_2 formed in the upper side part 325s_1 of the structure 325 in Sample 8 and the part marked by Uc' is an enlarged view of the part marked by Uc in the TEM image 720b. In Sample 8, the thickness of the deposited film part 330c_2 formed in the upper side part 325s_1 of the structure 325 was 123 Å.

Figure 43C:
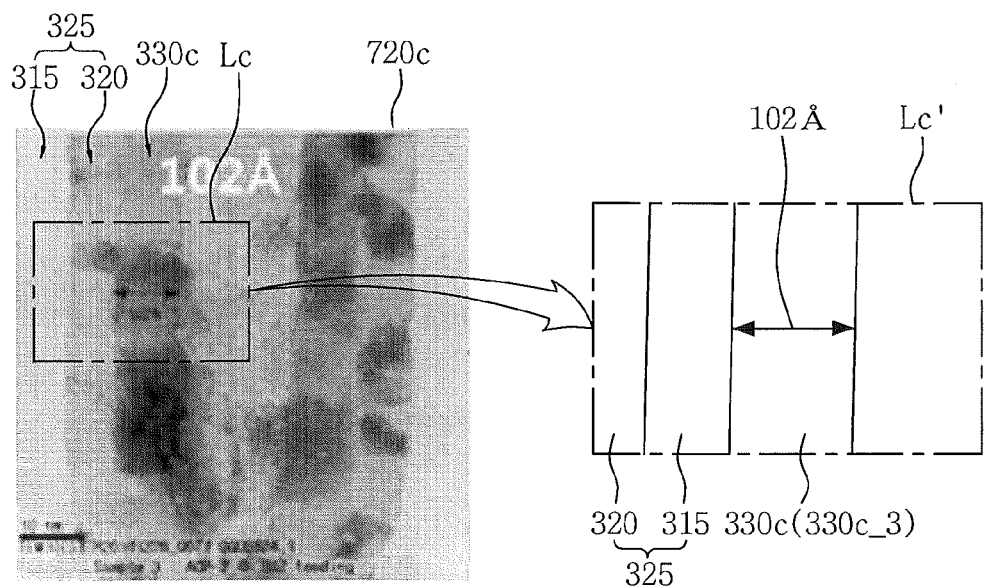

FIG. 43C shows a semiconductor device having a deposited film part 330c_3 formed in a lower side part 325s_2 of the structure 325 in Sample 8. In FIG. 43C, the part marked by reference number 720c is a TEM image including the deposited film part 330c_3 formed in the lower side part 325s_2 of the structure 325 in Sample 8, and the part marked by Lc' is an enlarged view of the part marked by Lc in the TEM image 720c. In Sample 8, the thickness of the deposited film part 330c_3 formed in the lower side part 325s_2 of the structure 325 was 102 Å.

Accordingly, in Sample 8, the deposited film part 330c_1 formed in the edge area 325h of the top surface of the structure 325 was formed with a first thickness of 134 Å, the deposited film part 330c_2 formed in the upper side part 325s_1 of the structure 325 was formed with a second thickness of 123 Å, and the deposited film part 330c_3 formed in the lower side part 325s_2 of the structure 325 was formed with a third thickness of 102 Å. In Sample 8, the step coverage of the deposited film 330c was 76%.

Sample 9 is a sample fabricated in accordance with the embodiment of the inventive concept as described in FIG. 10. The deposited film 330d of Sample 9, as described in FIG. 10, was formed by repeatedly performing a cycle of processes including supplying the film-control material into the process chamber, then supplying the zirconium precursor while stopping the supply of the film-control material, then firstly purging the process chamber, then supplying ozone as an oxidizer, and then secondly purging the process chamber.

Figure 44A:
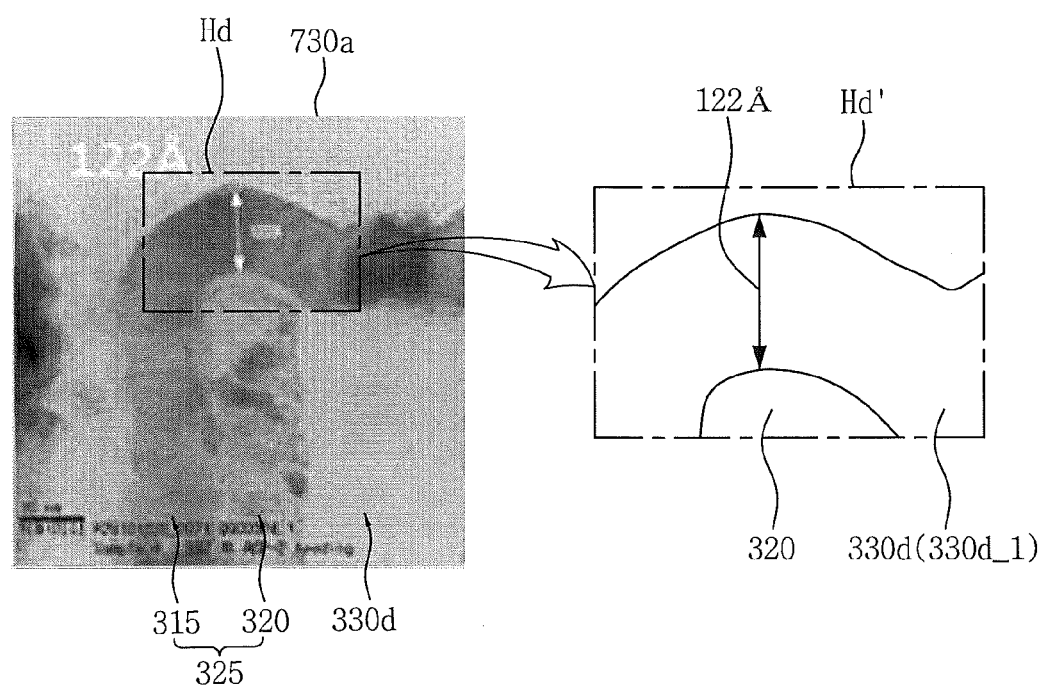
FIGS. 44A to 44C are diagrams showing a part of a semiconductor device formed by still another method of fabricating a semiconductor device in accordance with some embodiments of the inventive concept.

FIG. 44A shows a semiconductor device having a deposited film part 330d_1 formed on an edge area 325h of a top surface of the structure 325 in Sample 9. In FIG. 44A, the part marked by reference number 730a is a TEM image including the deposited film part 330d_1 formed the edge area 325h of the top surface of the structure 325 in Sample 9, and the part marked by Hd' is an enlarged view of the part marked by Hd in the TEM image 730a. In Sample 9, the thickness of the deposited film part 330d_1 formed in the edge area 325h of the top surface of the structure 325 was 122 Å.

Figure 44B:
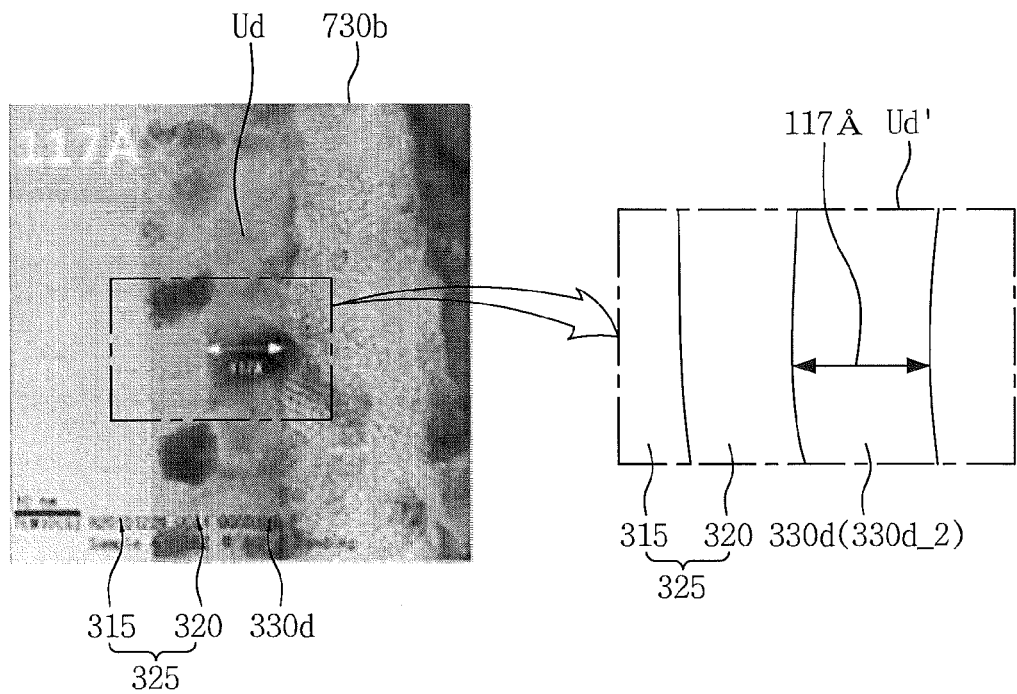

FIG. 44B shows a semiconductor device having a deposited film part 330d_2 formed in an upper side part 325s_1 of the structure 325 in Sample 9. In FIG. 44B, the part marked by reference number 730b is a TEM image including the deposited film part 330d_2 formed in the upper side part 325s_1 of the structure 325 in Sample 9 and the part marked by Ud' is an enlarged view of the part marked by Ud in the TEM image 730b. In Sample 9, the thickness of the deposited film part 330d_2 formed in the upper side part 325s_1 of the structure 325 was may 117 Å.

Figure 44C:
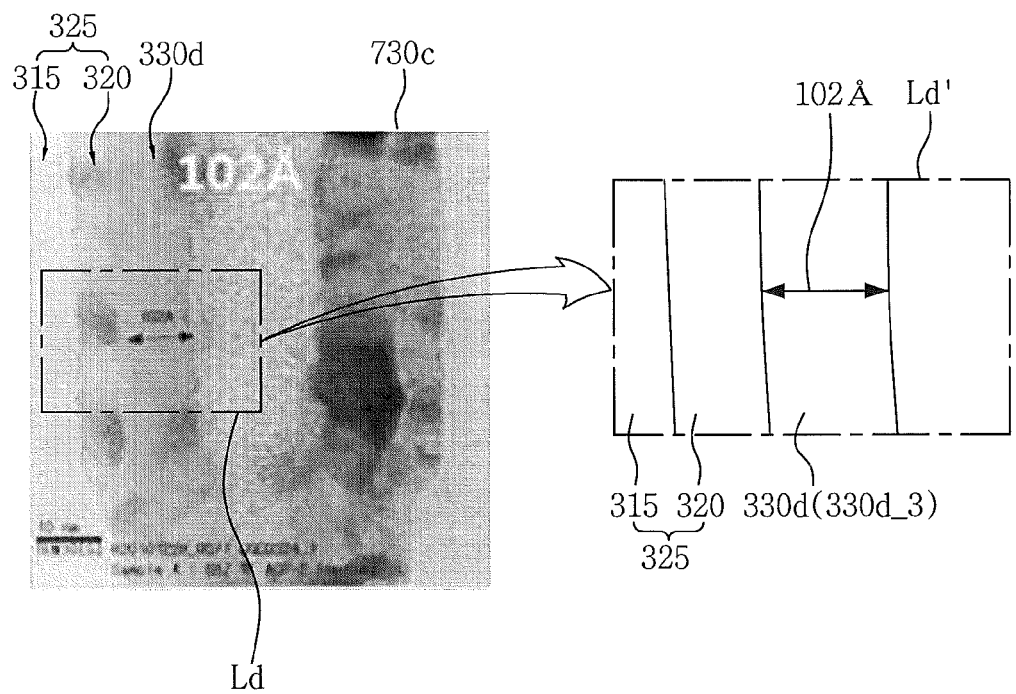

FIG. 44C shows a semiconductor device having a deposited film part 330d_3 formed in a lower side part 325s_2 of the structure 325 in Sample 9. In FIG. 44C, the part marked by reference number 730c is a TEM image including the deposited film part 330d_3 formed in the lower side part 325s_2 of the structure 325 in Sample 9, and the part marked by Ld' is an enlarged view of the part marked by Ld in the TEM image 730c. In Sample 9, the thickness of the deposited film part 330d_3 formed in the lower side part 325s_2 of the structure 325 was 102 Å.

Accordingly, in Sample 9, the deposited film part 330d_1 formed in the edge area 325h of the top surface of the structure 325 was formed with a first thickness of 122 Å, the deposited film part 330d_2 formed in the upper side part 325s_1 of the structure 325 was formed with a second thickness of 117 Å, and the deposited film part 330d_3 formed in the lower side part 325s_2 of the structure 325 was formed with a third thickness of 102 Å. In Sample 9, the step coverage of the deposited film 330d was 84%.

Sample 10 is a sample fabricated in accordance with the embodiment of the inventive concept as described in FIG. 36. The deposited film 330e of Sample 10 as described in FIG. 36, was formed by repeatedly performing a cycle of processes including supplying the zirconium precursor and the film-control material into the process chamber at the same time, continuing the supply of the film-control material while stopping the supply of the zirconium precursor, then stopping the supply of the film-control material, then firstly purging the process chamber, then supplying ozone as an oxidizer, and then secondly purging the process chamber.

Figure 45A:
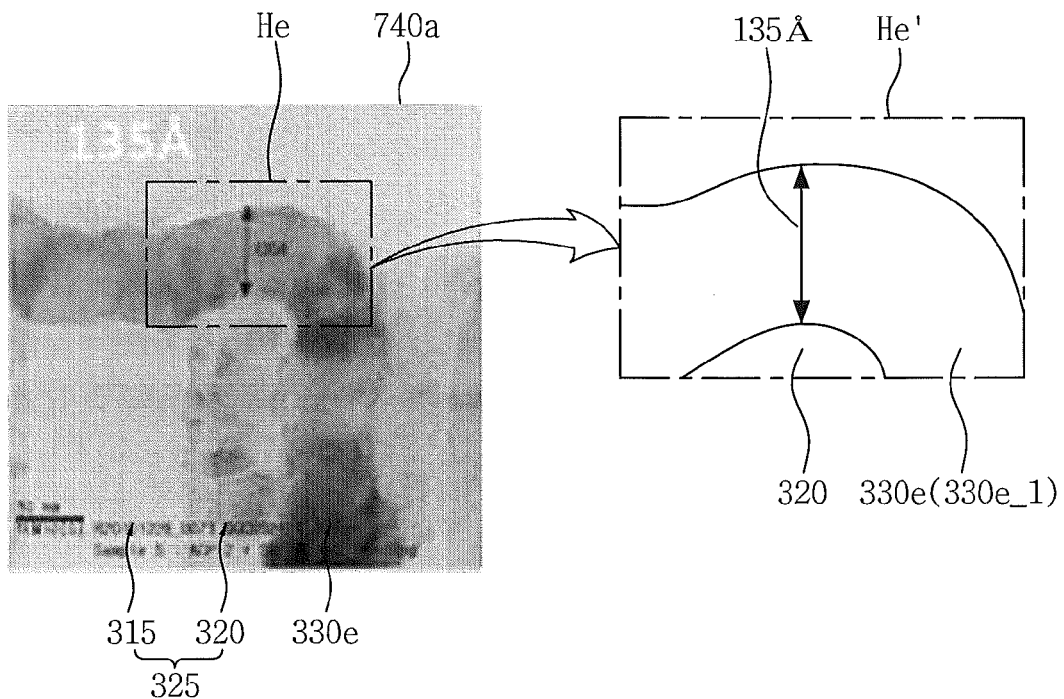
FIGS. 45A to 45C are diagrams showing a part of a semiconductor device formed by still another method of fabricating a semiconductor device in accordance with some embodiments of the inventive concept.

FIG. 45A shows a semiconductor device having a deposited film part 330e_1 formed on an edge area 325h of a top surface of the structure 325 in Sample 10. In FIG. 45A, the part marked by reference number 740a is a TEM image including the deposited film part 330e_1 formed the edge area 325h of the top surface of the structure 325 in Sample 10, and the part marked by He' is an enlarged view of the part marked by He in the TEM image 740a. In Sample 10, the thickness of the deposited film part 330e_1 formed in the edge area 325h of the top surface of the structure 325 was 135 Å.

Figure 45B:
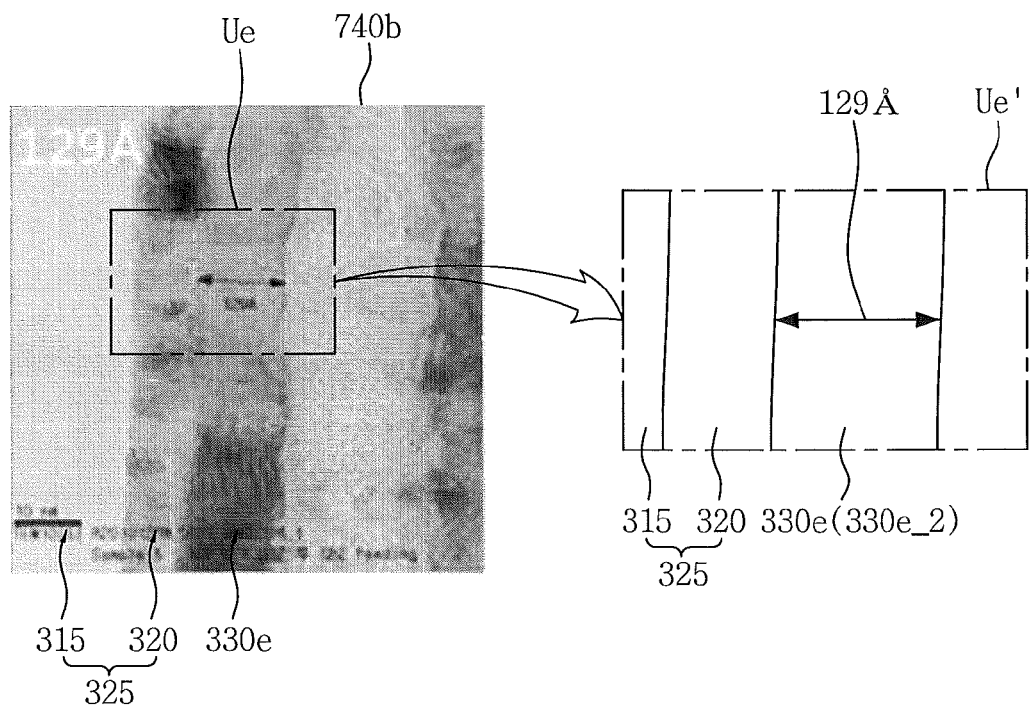

FIG. 45B shows a semiconductor device having a deposited film part 330e_2 formed in an upper side part 325s_1 of the structure 325 in Sample 10. In FIG. 45B, the part marked by reference number 740b is a TEM image including the deposited film part 330e_2 formed in the upper side part 325s_1 of the structure 325 in Sample 10, and the part marked by Ue' is an enlarged view of the part marked by Ue in the TEM image 740b. In Sample 10, the thickness of the deposited film part 330e_2 formed in the upper side part 325s_1 of the structure 325 was 129 Å.

Figure 45C:
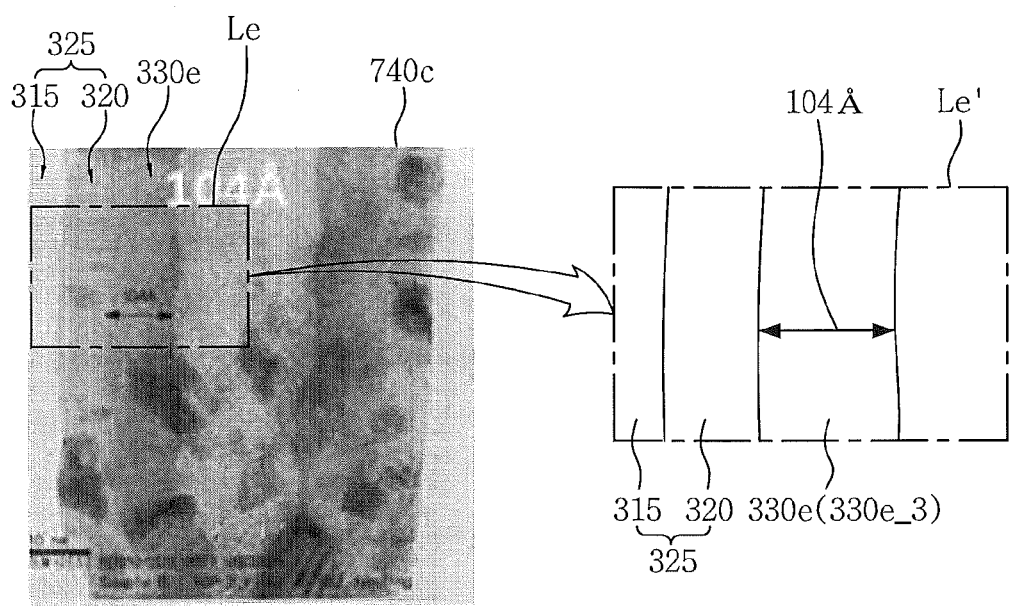

FIG. 45C shows a semiconductor device having a deposited film part 330e_3 formed in a lower side part 325s_2 of the structure 325 in Sample 10. In FIG. 45C, the part marked by reference number 740c is a TEM image including the deposited film part 330e_3 formed in the lower side part 325s_2 of the structure 325 in Sample 10, and the part marked by Le' is an enlarged view of the part marked by Le in the TEM image 740c. In Sample 10, the thickness of the deposited film part 330e_3 formed in the lower side part 325s_2 of the structure 325 was 104 Å.

Accordingly, in Sample 10, the deposited film part 330e_1 formed in the edge area 325h of the top surface of the structure 325 was formed with a first thickness of 135 Å, the deposited film part 330e_2 formed in the upper side part 325s_1 of the structure 325 was formed with a second thickness of 129 Å, and the deposited film part 330e_3 formed in the lower side part 325s_2 of the structure 325 was formed with a third thickness of 104 Å. In Sample 9, the step coverage of the deposited film 330d was 77%.

Following [Table 2] summarizes the results of TEM analysis for Samples 6 to 10. In [Table 2], the first thickness HT is thickness of the deposited film 330 formed at the edge area 325h of the top surface of the structure 325 in Samples 6 to 10, the second thickness UT is a thickness of the deposited film 330 formed at the upper side part 325s_1 of the structure 325 in Samples 6 to 10, and the third thickness LT is a thickness of the deposited film 330 formed at the lower side part 325s_2 of the structure 325 in Samples 6 to 10.

TABLE 2

| | | First thickness (HT) | Second thickness (UT) | Third thickness (LT) | Step coverage (LT/HT) |
|---|---|---|---|---|---|
| 1 | Sample 6 | 136 Å | 129 Å | 97 Å | 71% |
| 2 | Sample 7 | 138 Å | 142 Å | 99 Å | 72% |
| 3 | Sample 8 | 134 Å | 123 Å | 102 Å | 76% |
| 4 | Sample 9 | 122 Å | 117 Å | 102 Å | 84% |
| 5 | Sample 10 | 135 Å | 129 Å | 104 Å | 77% |

Samples 6 to 10 shows that the step coverage of the deposited films 330b, 330c, 330d, and 330e of Samples 7 to 10 in which the deposition processes were performed using the film-control material is superior to that of the deposited films 330a of Sample 6 in which the deposition process was performed without using the film-control material.

A ratio of the third thickness LT of the deposited film part 330e_3 formed in the lower side part 325s_2 of the structure 325 to the second thickness UT of the deposited film formed in the upper side part 325s_1 of the structure 325, was calculated using <Formula 2>.

$$\left(\frac{\text{Thickness } 3(LT)}{\text{Thickness } 2(UT)}\right) \times 100(\%) \qquad \text{<Formula 2>}$$

In Sample 6, the ratio of the third thickness LT to the second thickness UT is 75% when calculated using <Formula 2>. The ratio of the third thickness (LT) to the second thickness (UT) is 83% in Sample 8, 87% in Sample 9, and 81% in Sample 10, when calculated using <Formula 2>. Accordingly, the deposited films 330c, 330d, and 330e of Samples 8 to 10 fabricated in accordance with the embodiments of the inventive concept have superior uniformity of the deposited films as well as superior step coverage characteristics to the deposited film 330a of Sample 6.

Figure 46:
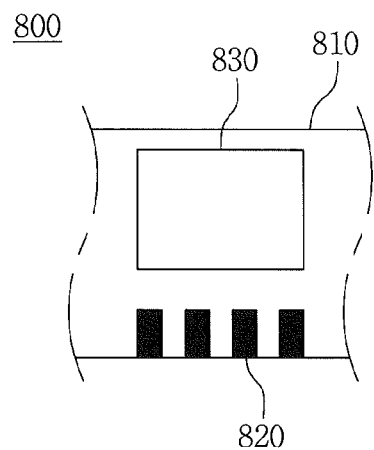
FIG. 46 is a schematic diagram showing a memory card including a semiconductor device formed in accordance with embodiments of the inventive concept.

FIG. 46 schematically shows a memory card including a semiconductor device formed using a method of fabricating a semiconductor device in accordance with embodiments of the inventive concept.

Referring to FIG. 46, the memory card 800 may include a card substrate 810, one or more semiconductor devices 830 arranged in the card substrate 810, and contact terminals 820 formed side by side in one of edges of the card substrate 810 and electrically independently connected to the semiconductor devices 830. Here, the semiconductor device 830 may include a deposited film formed in accordance with embodiments of the inventive concept. The semiconductor device 830 may be a component in a form of a memory chip or semiconductor package.

The memory card 800 may be a memory card available for an electronic apparatus, for example, a digital camera, a tablet PC, a computer, a portable storage apparatus, etc.

The card substrate 810 may be a printed circuit board (PCB). Both sides of the card substrate 810 may be available to be used. For example, the semiconductor devices 830 may be arranged in both front and back surfaces of the card substrate 810. The semiconductor devices 830 may be electrically and mechanically connected to the front surface or back surface of the card substrate 810.

The contact terminals 820 may be formed of a metal, and may have oxidation resistance. The contact terminals 820 may be variously set according to types or standards of the memory card 800. Therefore, the number of the contact terminals 820 illustrated in FIG. 46 may not be to have a specific meaning.

Figure 47:
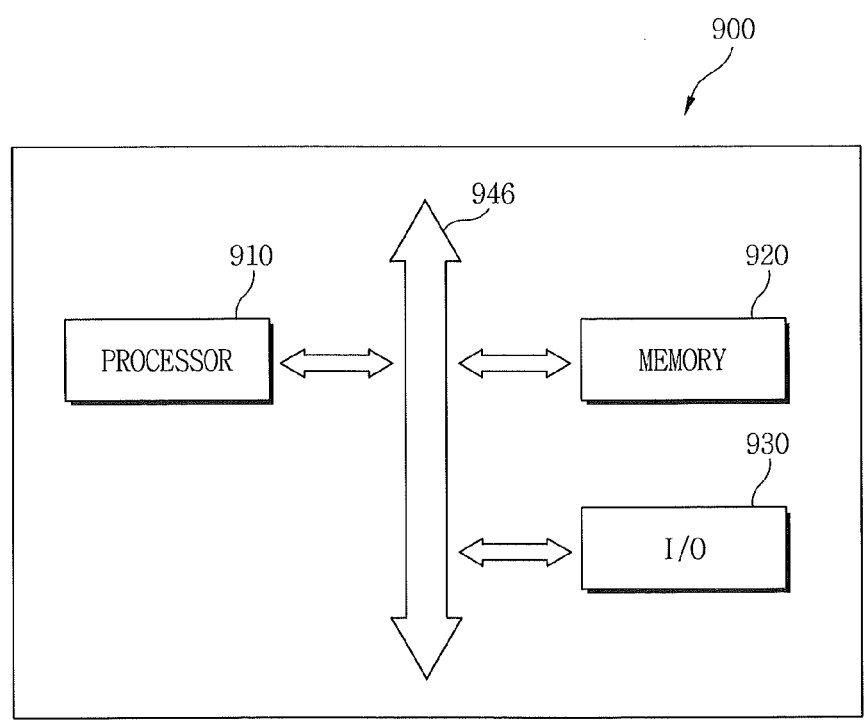
FIG. 47 is a block diagram showing an electronic system including a semiconductor device formed in accordance with embodiments of the inventive concept.

FIG. 47 is a block diagram showing an electronic system including a semiconductor device formed using a method of fabricating a semiconductor device in accordance with embodiments of the inventive concept.

Referring to FIG. 47, an electronic device 900 may be provided. The electronic device 900 may include a processor 910, a memory 920, and an input/output (I/O) 930. The processor 910, the memory 920, and the I/O 930 may be connected through a bus 946.

The memory 920 may receive a control signal such as RAS*, WE*, and CAS* from the processor 910. The memory 920 may store codes or data for operating the processor 910. The memory 920 may be used to store data accessed through the 946.

The memory 920 may include a deposited film formed in accordance with embodiments of the inventive concept. The processor 910 may include a deposited film formed in accordance with embodiments of the inventive concept.

The electronic device 900 may configure a variety of electronic control devices that need the memory 920. For example, the electronic apparatus 900 may be used in a computer system, a wireless communication apparatus such as a PDA, a laptop computer, a portable computer, a web tablet, a wireless phone, a mobile phone, a digital music player, an MP3 player, a navigation system, a solid state disk (SSD), a household appliance, or all devices which are capable of transmitting information in a wireless environment.

A more specifically implemented and modified example of the electronic device 900 will be described with reference to FIG. 48.

Figure 48:
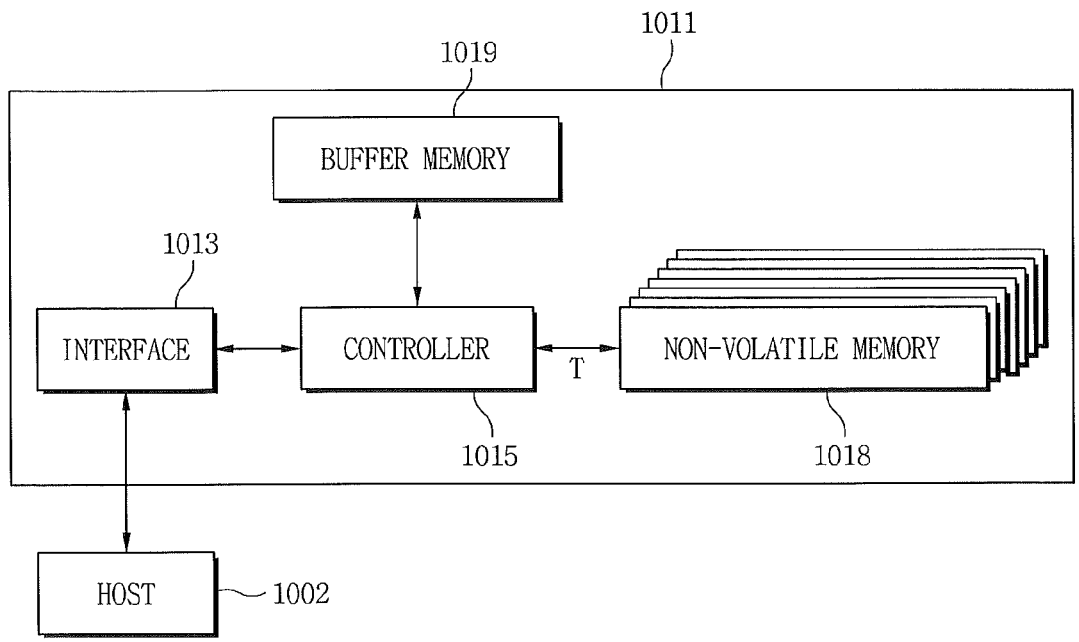
FIG. 48 is a block diagram showing a data storage apparatus including a semiconductor device formed in accordance with embodiments of the inventive concept.

FIG. 48 is a block diagram showing a data storage apparatus including a semiconductor device formed using a method of fabricating a semiconductor device in accordance with embodiments of the inventive concept.

Referring to FIG. 48, the electronic device 900 may be a data storage apparatus such as a solid state disk (SSD) 1011. The SSD 1011 may include an interface 1013, a controller 1015, a non-volatile memory 1018, and a buffer memory 1019.

The SSD 1011 is an apparatus that stores information using a semiconductor device. The SSD 1011 is faster, has a lower mechanical delay or failure rate, and generates less heat and noise than a hard disk drive (HDD). Further, the SSD 1011 may be smaller and lighter than the HDD. The SSD 1011 may be widely used in a laptop computer, a net-book, a desktop PC, an MP3 player, or a portable storage device.

The controller 1015 may be formed adjacent to the interface 1013 and electrically connected thereto. The controller 1015 may be a microprocessor including a memory controller and a buffer controller. The controller 1015 may include a deposited film formed using a method of fabricating a semiconductor device in accordance with embodiments of the inventive concept.

The non-volatile memory 1018 may be formed adjacent to the controller 1015 and electrically connected thereto via a connection terminal T. A data storage capacity of the SSD 1011 may correspond to a capacity of the non-volatile memory 1018. The buffer memory 1019 may be formed close to the controller 1015 and electrically connected thereto.

The interface 1013 may be connected to a host 1002, and may send and receive electrical signals such as data. For example, the interface 1013 may be a device using a standard such as a Serial Advanced Technology Attachment (SATA), an Integrated Drive Electronics (IDE), a Small Computer System Interface (SCSI), and/or a combination thereof. The non-volatile memory 1018 may be connected to the interface 1013 via the controller 1015.

The non-volatile memory 1018 may function to store data received through the interface 1013. The non-volatile memory 1018 may include a deposited film formed in accordance with embodiments of the inventive concept. Even when power supplied to the SSD 1011 is interrupted, the data stored in the non-volatile memory 1018 may be retained.

The buffer memory 1019 may include a volatile memory. The volatile memory may be a Dynamic Random Access Memory (DRAM) and/or a Static Random Access Memory (SRAM). The buffer memory 1019 has a relatively faster operating speed than the non-volatile memory 1018. The buffer memory 1019 may include a deposited film formed in accordance with embodiments of the inventive concept.

Data processing speed of the interface 1013 may be relatively faster than the operating speed of the non-volatile memory 1018. Here, the buffer memory 1019 may function to temporarily store data. The data received through the interface 1013 may be temporarily stored in the buffer memory 1019 via the controller 1015, and then permanently stored in the non-volatile memory 1018 according to the data write speed of the non-volatile memory 1018. Further, frequently used items of the data stored in the non-volatile memory 1018 may be pre-read and temporarily stored in the buffer memory 1019. That is, the buffer memory 1019 may function to increase effective operating speed and reduce error rate of the SSD 1011.

Figure 49:
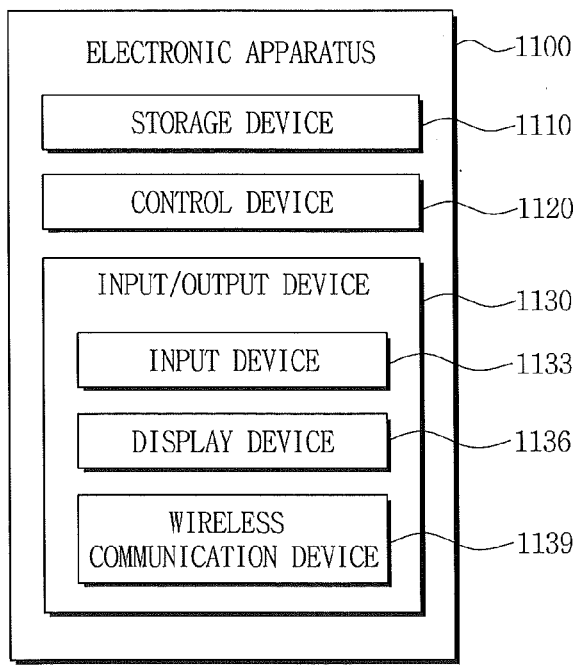
FIG. 49 is a diagram showing an electronic system in accordance with some embodiments of the inventive concept.

FIG. 49 shows an electronic system in accordance with some embodiments of the inventive concept.

Referring to FIG. 49, the electronic apparatus 1100 may include a storage device 1110, a control device 1120, and an input/output device 1130. The input/output device 1130 may include an input device 1133, a display device 1136, and a wireless communication device 1139.

The storage device 1110 may include one or more different type of storage device such as a hard disc drive storage device, a non-volatile memory (for example, Flash memory or other EEPROM), and a volatile memory (for example, a battery-based SDRAM or a DRAM). The storage device 1110 may include a deposited film formed in accordance with embodiments of the inventive concept.

The control device 1120 may be used to control an operation of the electronic apparatus 1100. For example, the control device 1120 may include a microprocessor, etc. The control device 1120 may include a deposited film formed in accordance with embodiments of the inventive concept.

The input/output device 1130 may include the input device 1133, a display device 1136, and the wireless communication device 1139.

The input/output device 1130 may be used in supplying data to the electronic apparatus 1100, and supplying data from electronic apparatus 1100 to external devices. For example, the input/output device 1130 may include a display screen, a button, a port, a touch screen, a joystick, a click wheel, a scrolling wheel, a touch pad, a key pad, a keyboard, a mike, or a camera.

The wireless communication device 1139 may include one or more integrated circuit, a power amplifier circuit, a passive RF component, one or more antenna, or a communication circuit such as a radio-frequency (RF) transceiver circuit composed of RF wireless signal processing circuit. The wireless signals may be transmitted using a light (for example, an infrared communication). The wireless communication device 1139 may include a deposited film formed in accordance with embodiments of the inventive concept.

Figure 50:
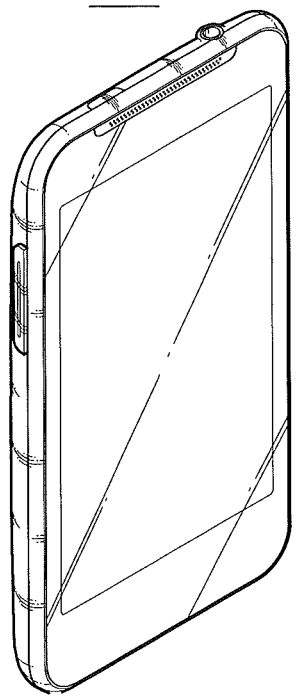
FIG. 50 is a diagram schematically showing a mobile wireless phone including a semiconductor device fabricated in accordance with embodiments of the inventive concept.

FIG. 50 is a diagram schematically showing a mobile wireless phone 1200 including a semiconductor device formed using a method of fabricating a semiconductor device in accordance with embodiments of the inventive concept.

The mobile wireless phone 1200 may be understood as a tablet PC. Further, a semiconductor device in accordance with embodiments of the inventive concept may be used in a portable computer such as a notebook, a moving picture experts group (MPEG)-1 audio layer 3 (MP3) player, an MP4 player, a navigation apparatus, a solid state disk (SSD), a table computer, an automobile, or a home appliance, as well as the tablet PC.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures.

What is claimed is:

1. A method of fabricating a semiconductor device, comprising:
   forming a deposited film on a semiconductor substrate in a process chamber by repeatedly forming a unit layer on the semiconductor substrate;
   wherein forming the unit layer comprises:
      forming a preliminary unit layer on the semiconductor substrate by supplying a process material including a precursor material and a film-control material into the process chamber, wherein the precursor material includes a central atom and a ligand bonded to the central atom, and the film-control material comprises a hydride of the ligand of the precursor material;
      firstly purging the process chamber in which the semiconductor substrate having the preliminary unit layer is located;
      forming the unit layer from the preliminary unit layer in the firstly purged process chamber; and
      secondly purging the process chamber in which the semiconductor substrate having the unit layer is located.

2. The method according to claim 1, wherein the precursor material is adsorbed onto the semiconductor substrate to form a precursor-adsorbed layer.

3. The method according to claim 2, wherein the film-control material is coordinated to the central atom of the precursor-adsorbed layer to form a more chemically stable material from the precursor-adsorbed layer than the precursor-adsorbed layer.

4. The method according to claim 1, wherein forming the preliminary unit layer comprises:
   forming a precursor-adsorbed layer on the semiconductor substrate by supplying the precursor material into the process chamber, wherein the precursor-adsorbed layer includes a base part and an over-adsorbed part bonded to the base part; and
   separating the over-adsorbed part from the base part by supplying the film-control material into the process chamber.

5. The method according to claim 4, wherein the film-control material breaks a bond between the over-adsorbed part and the base part while being bonded to the central atom of the over-adsorbed part.

6. The method according to claim 1, wherein the preliminary unit layer includes both of the precursor material and the film-control material.

7. The method according to claim 6, wherein the ligand of the precursor material and the film-control material that provide the preliminary unit layer are separated from the preliminary unit layer to form a residual product while forming the unit layer from the preliminary unit layer, and the residual product is removed while secondly purging the process chamber.

8. The method according to claim 1, wherein the ligand includes a first ligand and a second ligand which are bonded to the central atom of the precursor material and have different chemical formulas from each other, and wherein the film-control material is a hydride of the first ligand.

9. A method of fabricating a semiconductor device, comprising:
   forming a deposited film on a semiconductor substrate in a process chamber by repeatedly forming a unit layer on the semiconductor substrate;

wherein forming the unit layer comprises:
forming a surface-control layer on the semiconductor substrate by supplying a first film-control material into the process chamber;
forming a precursor-adsorbing layer that is adsorbed onto the surface-control layer by supplying the precursor material into the process chamber, to form a preliminary unit layer including the surface-control layer and precursor-adsorbing layer, wherein the precursor material is a compound which includes a central atom and a ligand bonded to the central atom;
firstly purging the process chamber in which the semiconductor substrate having the preliminary unit layer is located;
forming a residual product by separating the surface-control layer and the ligand of the precursor-adsorbing layer from the precursor-adsorbing layer while forming the unit layer from the preliminary unit layer; and
secondly purging the process chamber in which the semiconductor substrate having the unit layer is located to remove the residual product.

10. The method according to claim 9, wherein a coordination number of a central atom of the preliminary unit layer is greater than a coordination number of the central atom of the precursor material.

11. The method according to claim 9, further comprising initiating supply of the precursor material while the first film-control material is in the process chamber.

12. The method according to claim 9, further comprising stopping supplying the first film-control material into the process chamber, and supplying the precursor material into the process chamber after the supply of the first film-control material into the process chamber has stopped.

13. The method according to claim 9, further comprising starting the supply of the precursor material while the first film-control material is being supplied into the process chamber.

14. The method according to claim 9, further comprising starting the supply of the precursor material while the first film-control material is being supplied into the process chamber, and stopping the supply of the precursor material before the supply of the first film-control material stops.

15. The method according to claim 9, further comprising:
supplying a second film-control material into the process chamber before the process chamber is firstly purged after the supply of the precursor material into the process chamber stops.

16. The method according to claim 15, wherein the second film-control material is a material coordinated to the central atom of the precursor material.

17. A method of fabricating a semiconductor device, comprising:
forming a structure on a semiconductor substrate, wherein the structure has vertical side parts;
forming a deposited film on the semiconductor substrate having the structure in a process chamber, wherein forming the deposited film includes repeatedly forming a unit layer on the semiconductor substrate having the structure;
wherein forming the unit layer comprises:
forming a first preliminary unit layer by adsorbing a first precursor material onto the semiconductor substrate having the structure by supplying the first precursor material into the process chamber, wherein the first preliminary unit layer includes a base part and an over-adsorbed part that is physically bonded to the base part;
forming a second preliminary unit layer from the first preliminary unit layer by supplying a film-control material into the process chamber, wherein a portion of the film-control material reacts with the first preliminary unit layer to separate the over-adsorbed part from the base part and thereby form a second precursor material;
purging the process chamber in which the semiconductor substrate having the second preliminary unit layer is located;
forming a unit layer from the second preliminary unit layer; and
purging the process chamber in which the semiconductor substrate having the unit layer is located.

18. The method according to claim 17, wherein the first precursor material is a first compound including a central atom and a ligand bonded to the central atom, and a portion of the film-control material forms a second precursor material while being bonded to a central atom of the over-adsorbed part to separate the over-adsorbed part from the base part.

19. The method according to claim 18, wherein a portion of the film-control material is bonded to a central atom of the base part to increase the coordination number of the central atom of the base part.

20. The method according to claim 18, wherein the semiconductor substrate having the first preliminary unit layer includes an empty region on which the precursor material is not adsorbed.

21. The method according to claim 20, wherein forming the second preliminary unit layer includes adsorbing the second precursor material onto the empty region of the semiconductor substrate.

22. The method according to claim 20, wherein the over-adsorbed part is formed in an upper part of the structure, and the empty region is formed in a lower part of the structure located at a lower level than the over-adsorbed region.

23. A method of fabricating a semiconductor device, comprising:
forming a deposited film on a semiconductor substrate in a process chamber by repeatedly forming unit layers on the semiconductor substrate;
wherein forming the unit layer comprises:
forming a preliminary unit layer by supplying a first process material including a film-control material and precursor material into the process chamber, wherein the precursor material is a first compound including a central atom and a ligand bonded to the central atom, and the preliminary unit layer includes a second compound formed by the precursor material being bonded to the film-control material;
firstly purging the process chamber in which the semiconductor substrate having the preliminary unit layer is located;
forming a unit layer from the preliminary unit layer in the purged process chamber, wherein a residual product is formed by the film-control material of the second compound and the ligand of the precursor material of the second compound being separated from the preliminary unit layer while forming the unit layer from the preliminary unit layer; and
secondly purging the process chamber in which the semiconductor substrate having the unit layer is located and removing the residual product.

24. The method according to claim 23, wherein when the preliminary unit layer is formed, precursor molecules of the precursor material bond together in the process chamber to form a precursor cluster, and the film-control material forms the second compound by breaking bonds between molecules of the precursor cluster to be bonded to the molecules of the precursor cluster.

25. The method according to claim 23, wherein forming the preliminary unit layer is performed in a process atmosphere in which the first compound, the film-control material, and the second compound co-exist.

26. A method of fabricating a semiconductor device, comprising:
supplying a first precursor material into a process chamber in which a substrate is positioned, wherein the first precursor material is adsorbed onto the substrate to form a first preliminary unit layer including a base layer and an over-adsorbed layer;
supplying a film-control material into the process chamber, wherein the film-control layer reacts with the precursor material in the over-adsorbed layer to form a second precursor material, the second precursor material becoming adsorbed onto vacant portions of the substrate on which the first precursor material was not adsorbed;
supplying a process material into the process chamber, wherein the process material reacts with the film-control material to form a residual product; and
purging the residual product from the process chamber.

27. The method of claim 26, wherein the precursor material comprises a central atom and a ligand bonded to the central atom, and the film-control material comprises a hydride of the ligand of the precursor material.

28. The method of claim 27, wherein the process material comprises an oxygen-containing gas, a nitrogen-containing gas, or a reductant.

* * * * *